(12) United States Patent
Zhang et al.

(10) Patent No.: US 12,319,858 B2
(45) Date of Patent: Jun. 3, 2025

(54) ORGANIC COMPOUND AND OLED HAVING SAME AND ORGANICA LIGHT-EMITTING APPARATUS

(71) Applicant: ZHEJIANG HUAXIAN PHOTOELECTRICITY TECHNOLOGY CO., LTD, Jiaxing (CN)

(72) Inventors: Lei Zhang, Jiaxing (CN); Xiaoyu Zhao, Jiaxing (CN); Kongwu Wu, Jiaxing (CN); Yunqi Liu, Jiaxing (CN); Xiangzhen Kong, Jiaxing (CN)

(73) Assignee: ZHEJIANG HUAXIAN PHOTOELECTRICITY TECHNOLOGY CO., LTD, Jiaxing (CN)

( * ) Notice: Subject to any disclaimer, the term of this patent is extended or adjusted under 35 U.S.C. 154(b) by 0 days.

(21) Appl. No.: 18/943,851

(22) Filed: Nov. 11, 2024

(65) Prior Publication Data

US 2025/0154406 A1    May 15, 2025

(30) Foreign Application Priority Data

Nov. 9, 2023    (CN) .......................... 202311482550.7

(51) Int. Cl.
*C09K 11/06* (2006.01)
*H10K 50/12* (2023.01)
*H10K 85/60* (2023.01)

(52) U.S. Cl.
CPC .............. *C09K 11/06* (2013.01); *H10K 50/12* (2023.02); *H10K 85/621* (2023.02); *H10K 85/658* (2023.02); *C09K 2211/1011* (2013.01); *C09K 2211/1088* (2013.01)

(58) Field of Classification Search
None
See application file for complete search history.

(56) References Cited

FOREIGN PATENT DOCUMENTS

| CN | 102448945 A | 5/2012 |
| CN | 116023402 A | 4/2023 |
| CN | 116751177 A | 9/2023 |
| KR | 20220074408 A | 6/2022 |

OTHER PUBLICATIONS

Title of the Item: STN Registry Publication Date: Oct. 6, 2022 Name of the Author: Columbus, Ohio, Us Registry[Online] Article Title: STN Registry pp. 1-51.

*Primary Examiner* — Anthony Ho
(74) *Attorney, Agent, or Firm* — Nitin Kaushik

(57) ABSTRACT

For the organic compound in the present disclosure, by the combination of an anthracene ring and a specific substituent group, a structure of the organic compound has good hole and electron mobility and injection characteristics, and the stability of the compound may be improved. A boron-nitrogen compound provided in the present disclosure has excellent light-emitting characteristics due to a narrow full width at half maximum. When an organic light-emitting device is fabricated by using both the boron-nitrogen compound and the organic compound provided in the present disclosure as a light-emitting layer material, it may be possible to effectively enable the organic light-emitting device to have a relatively low driving voltage and maintain the stability of the voltage, the light-emitting efficiency may be improved, and the service life of the device can also be relatively long.

3 Claims, No Drawings

ORGANIC COMPOUND AND OLED HAVING SAME AND ORGANICA LIGHT-EMITTING APPARATUS

CROSS-REFERENCE TO RELATED APPLICATIONS

This application claims priority to Chinese Patent Application No. 202311482550.7, filed with the Chinese Patent Office on 9 Nov. 2023, which is incorporated herein by reference in its entirety.

TECHNICAL FIELD

The present disclosure relates to the field of organic optoelectronic material preparation technologies, and in particular, to an organic compound, an organic light-emitting diode (OLED) having the same, and an organic light-emitting apparatus.

BACKGROUND

With the development of multimedia technology and the improvement of informationization requirements, the requirements for performances of panel displays are increasing. An OLED, also referred to as an organic electroluminescent device, relates to a technology in which an organic material emits light under an action of an electric field by means of carrier injection and combination, and the OLED can convert electrical energy into light energy by means of an organic light-emitting material.

At present, most of light-emitting layers of OLED devices use a host-guest light-emitting system, i.e., doping a host material with a guest material. With regard to the development of organic materials with light-emitting properties of, for example, blue light which is one of the three primary colors of light and the development of organic materials with the ability to transport charges (which gives the organic materials the potential to become semiconductors and superconductors) such as holes and electrons, both polymer compounds and low molecular compounds have been actively studied so far. However, even using a plurality of materials in combination, the display technology still suffers from high driving voltage and short display life, which seriously affects the further practicality of the technology. Therefore, it is necessary to develop organic light-emitting devices with low driving voltage, high brightness and long service life through continuous efforts, and finding suitable photoelectric functional materials for OLEDs to use in OLED devices so as to solve the above-described problems is a long-term need in this field.

SUMMARY

In order to solve the above-described technical problem, the present disclosure provides an organic compound, an OLED having the compound, and a display or lighting apparatus.

The organic compound provided in the present disclosure is realized by the following technical solution.

The organic compound has a structure as shown in a following formula (I):

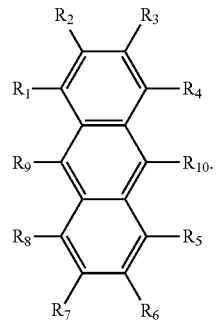

Formula (I)

In formula (I), $R_1$-$R_8$ are each independently selected from hydrogen and deuterium; $R_9$ and $R_{10}$ are each independently selected from hydrogen, deuterium, a C6-C30 aryl group, a C5-C30 heteroaryl group, a C6-C30 fused aromatic ring and a C3-C30 fused heterocyclic group, and a combination thereof, a heteroatom therein being O; and at least one of the substituents $R_9$-$R_{10}$ is selected from a structure as shown in formula (II):

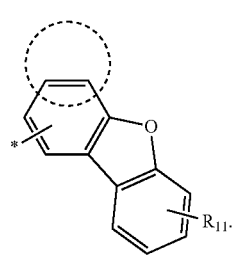

Formula (II)

In formula (II), Ru is selected from hydrogen, a C6-C30 aryl group, a C5-C30 heteroaryl group and a C5-C30 fused ring group, and a combination thereof, the combination including a combination in a form of a fused ring, a heteroatom therein being O; ⌒ represents nonexistence or benzobfuran; and * represents a linkage position.

In some embodiments, in formula (I), $R_9$ or $R_{10}$ is selected from deuterium, a phenyl group, a naphthyl group, a phenanthryl group and a biphenyl group, and a combination thereof.

In formula (II), Ru is selected from hydrogen, a phenyl group, a furanyl group and a benzofuranyl group, and a combination thereof, the combination including a combination in a form of a fused ring.

According to one or more embodiments, the present disclosure further provides an organic compound. The organic compound is selected from any one of the following chemical structures:

1-001
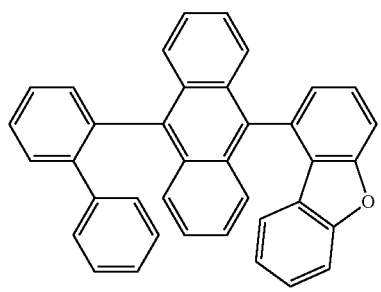
1-002
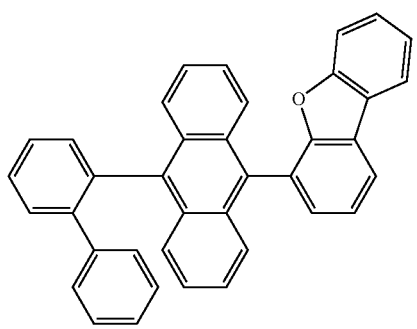
1-003
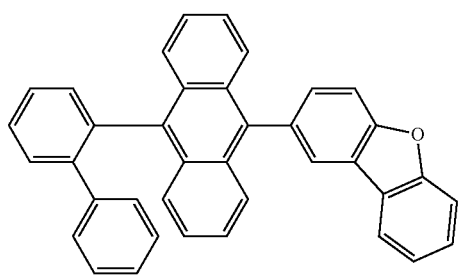
1-004
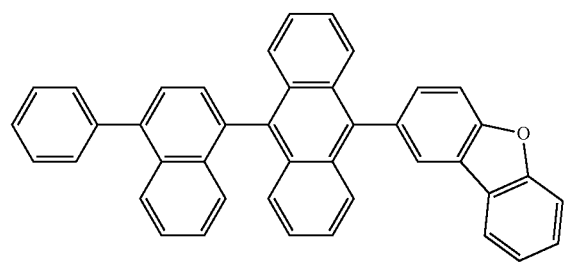
1-005
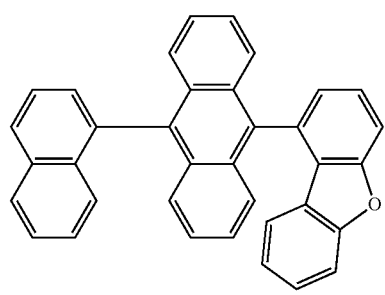
1-006
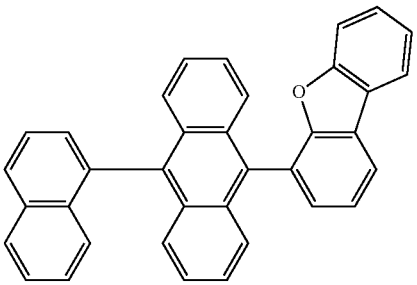
1-007
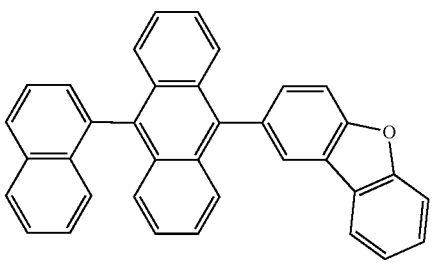
1-008
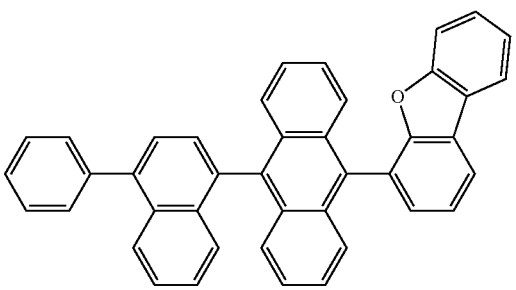
1-009
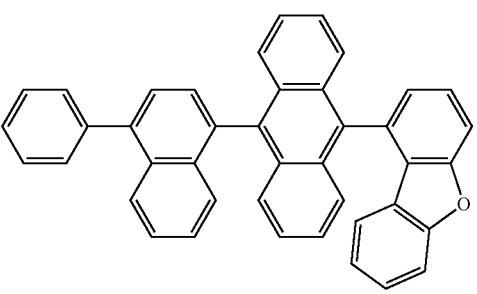
1-010
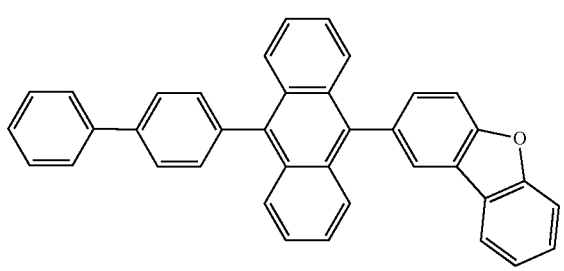

-continued
1-011
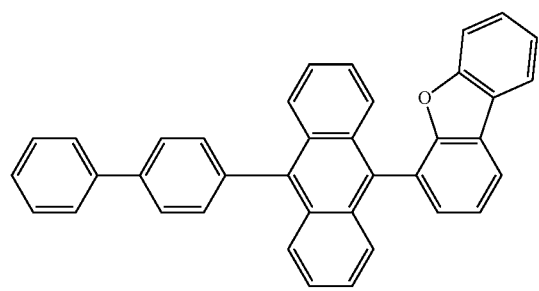
1-012
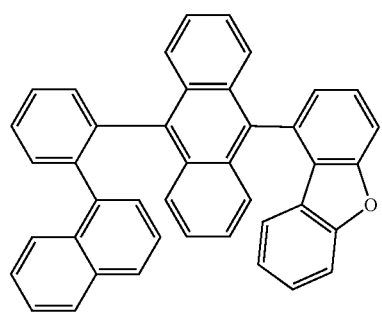
1-013
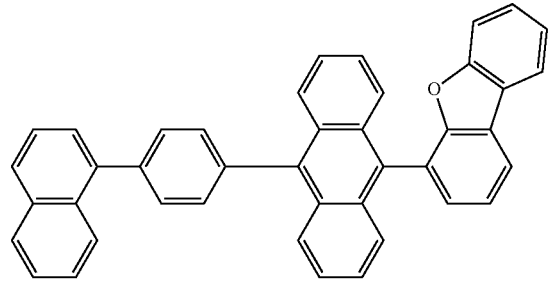
1-014
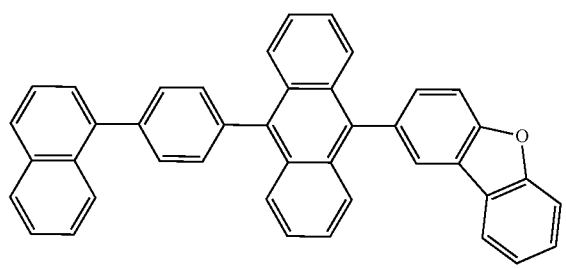
1-015
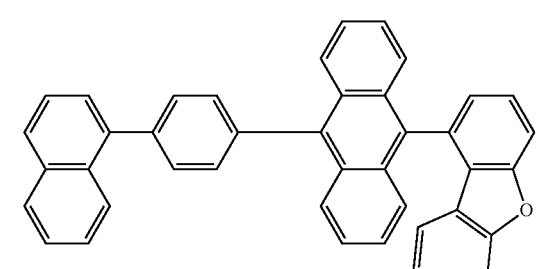
-continued
1-016
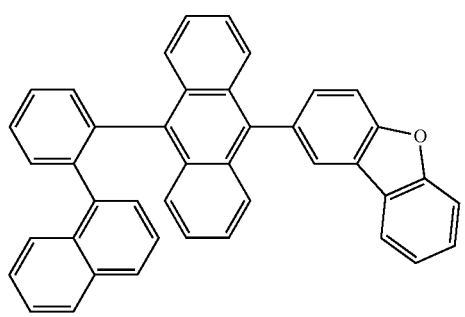
1-1017
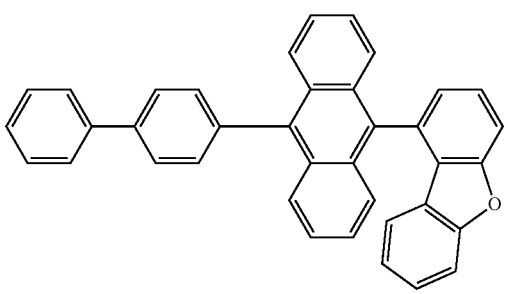
1-1018
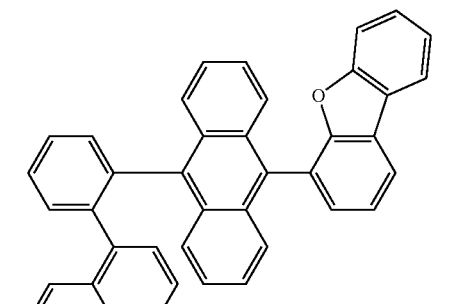
1-1019
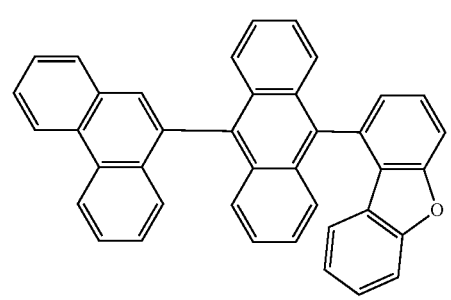
1-1020
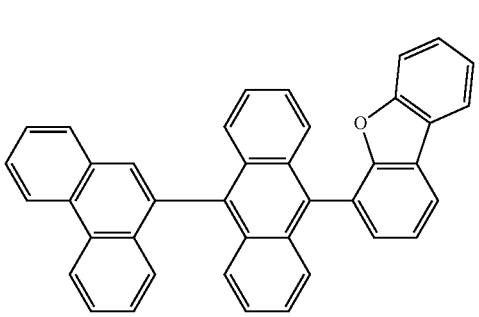

1-1021
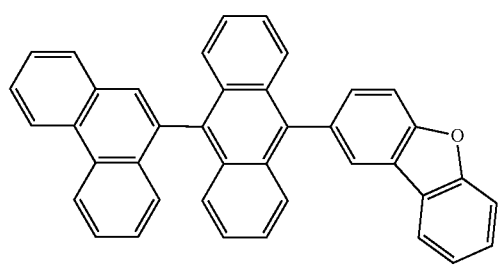
1-1022
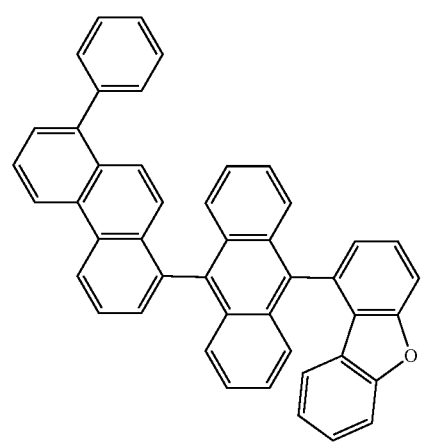
1-1023
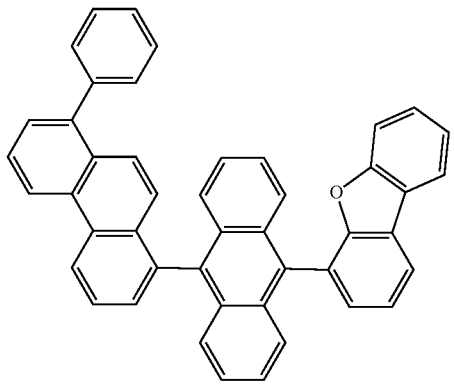
1-1024
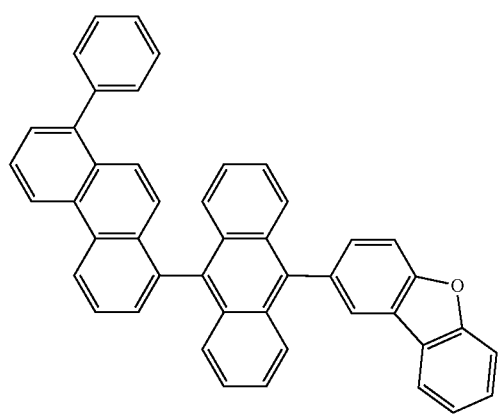
1-025
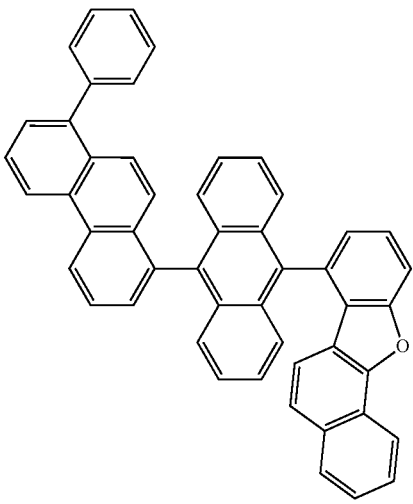
1-026
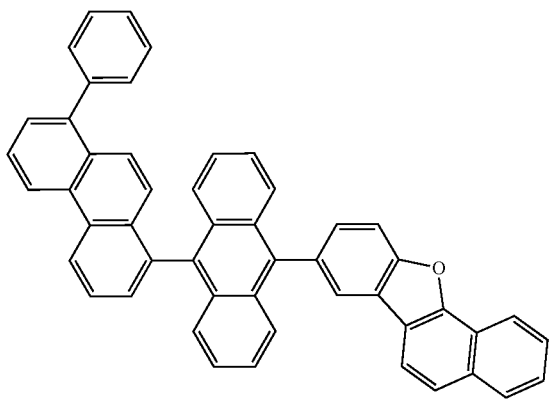
1-027
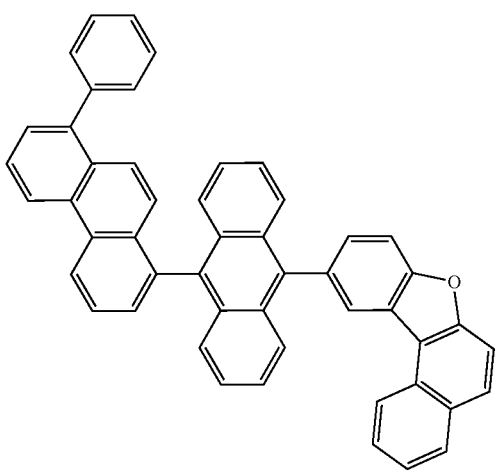

-continued
1-028
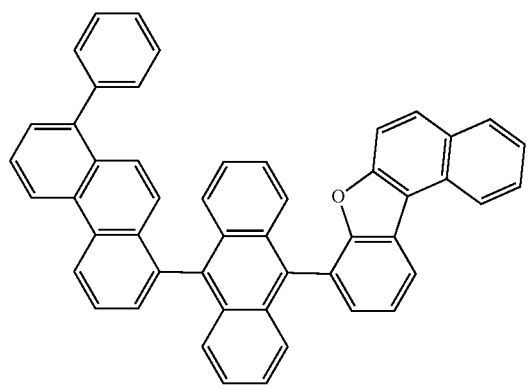
1-029
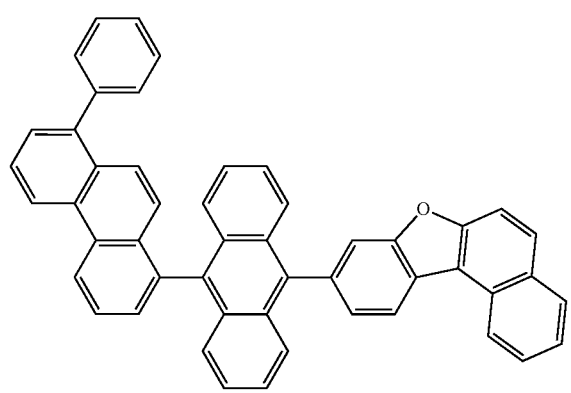
1-030
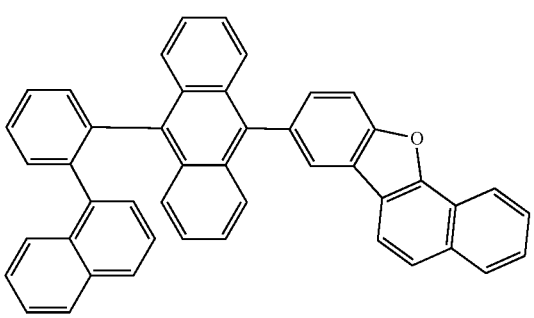
1-031
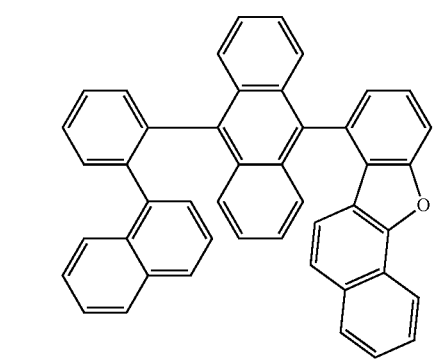
-continued
1-032
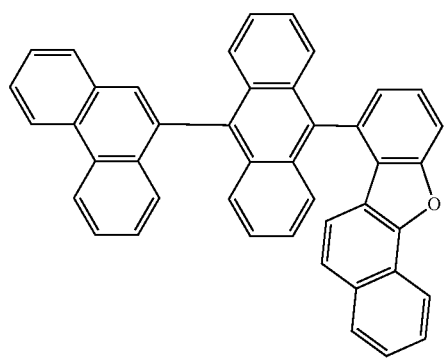
1-033
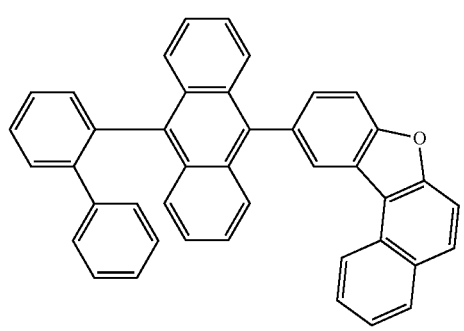
1-034
1-035
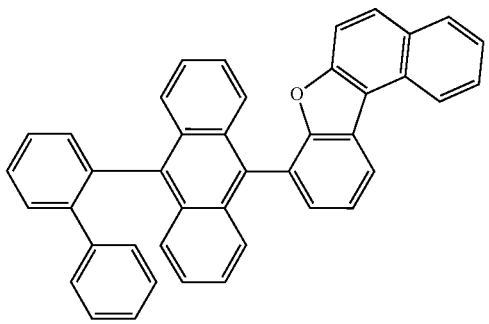
1-036
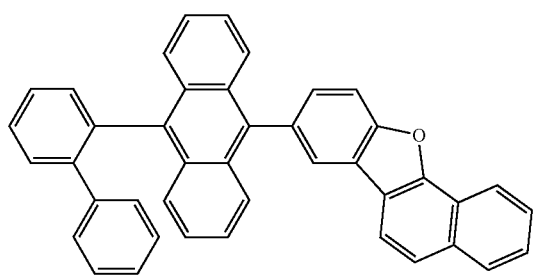

1-037
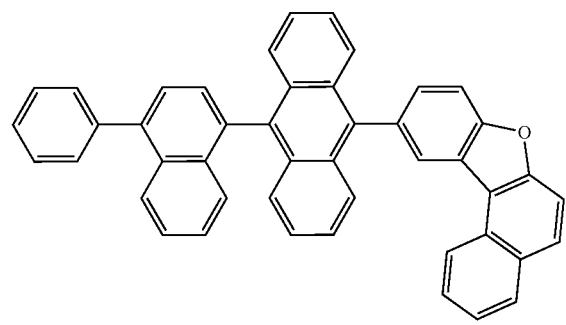
1-038
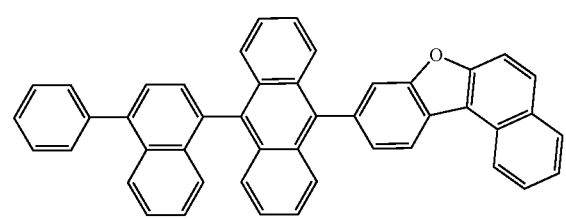
1-039
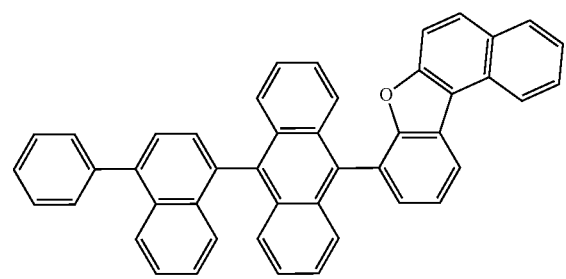
1-040
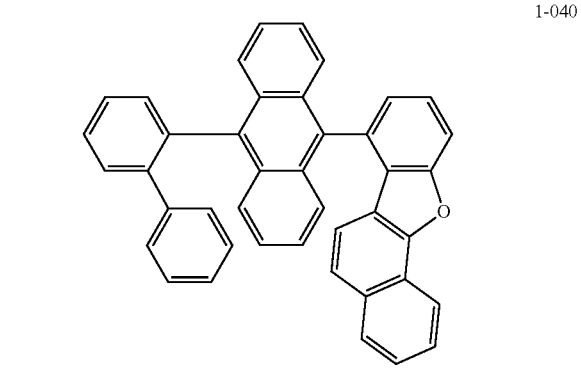
1-041
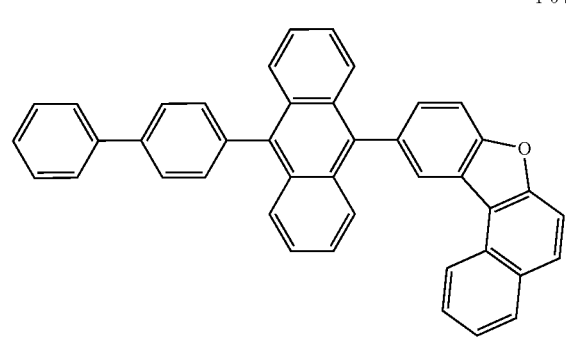
1-042
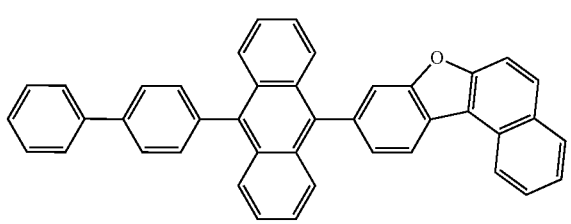
1-043
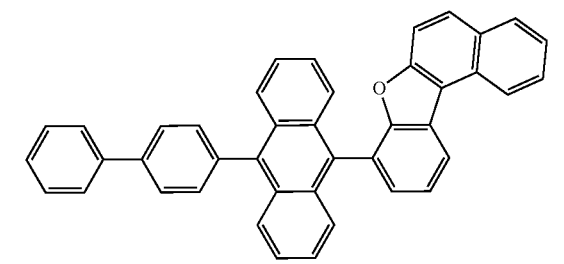
1-044
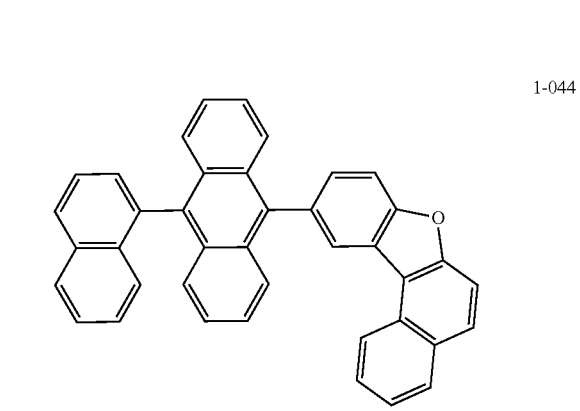
1-045
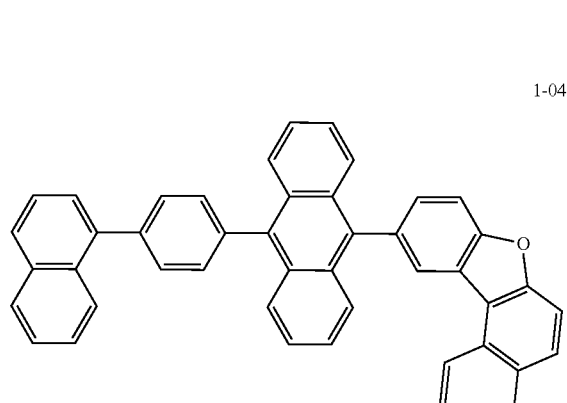
1-046
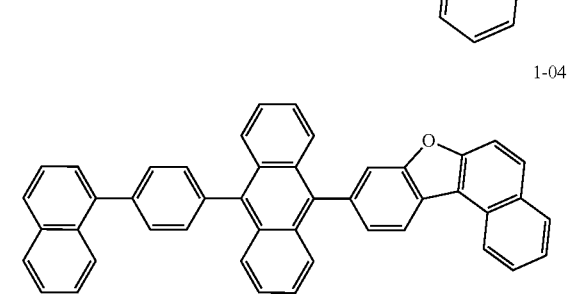

1-047
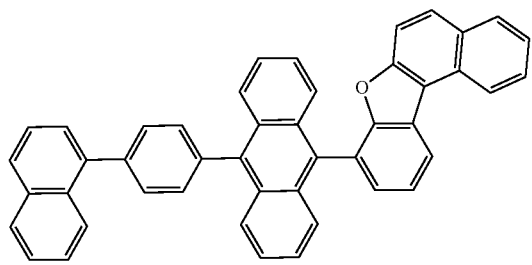
1-048
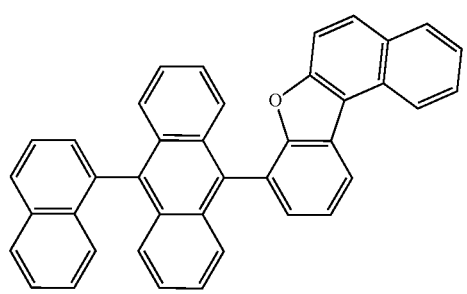
1-049
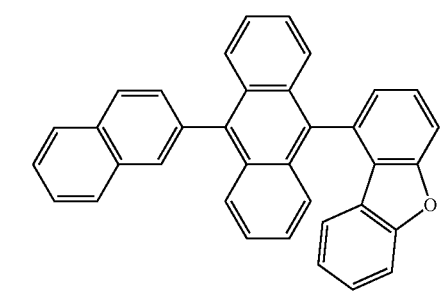
1-050
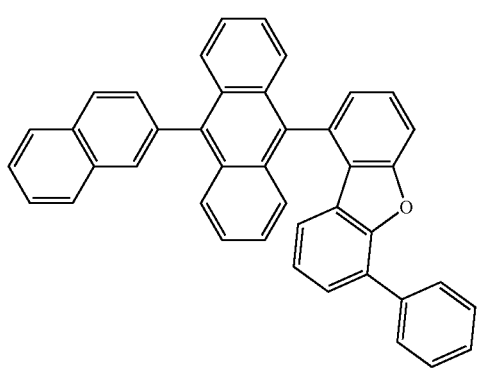
1-051
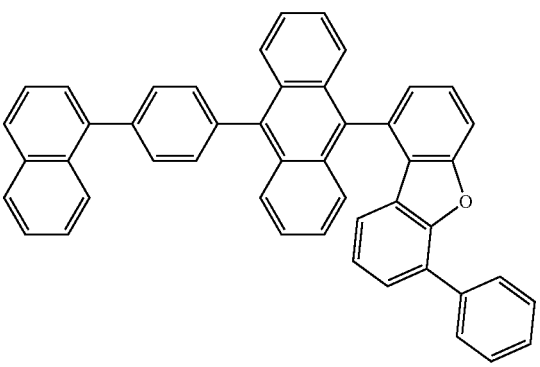
1-052
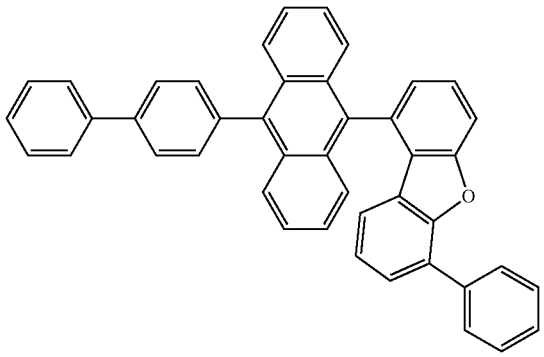
1-053
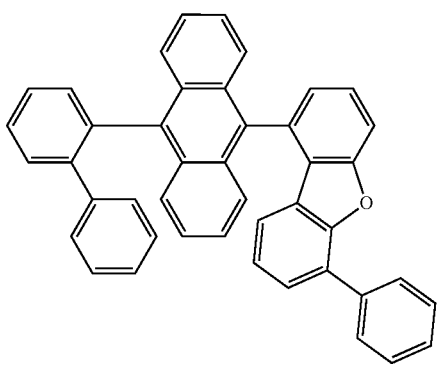
1-054
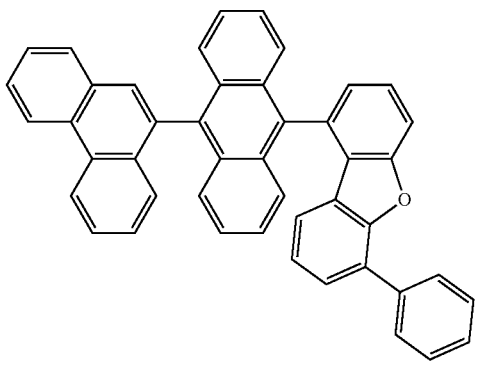
1-055
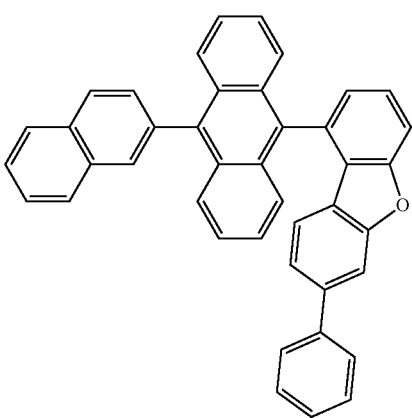

1-056
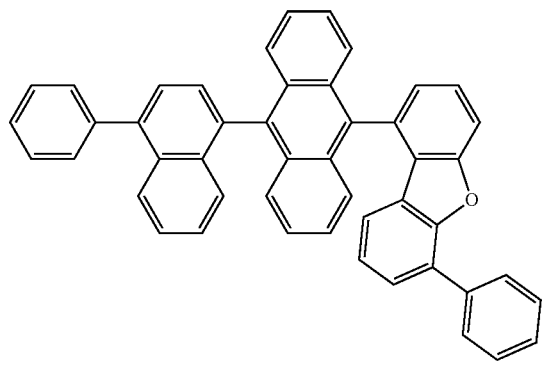
1-057
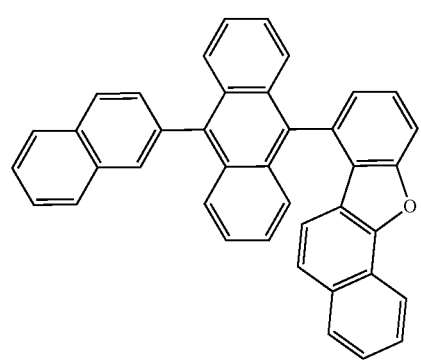
1-058
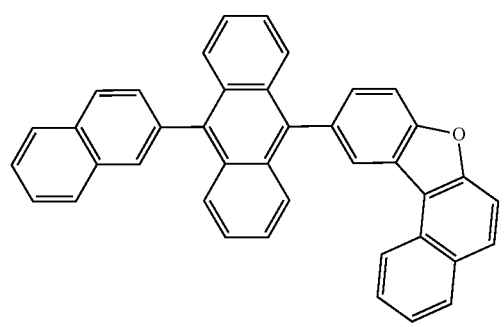
1-059
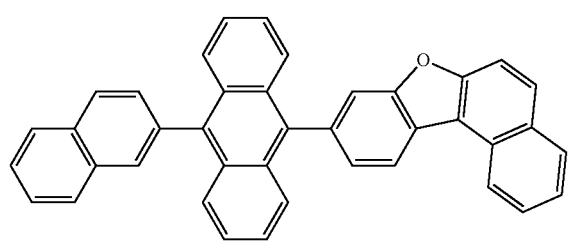
1-060
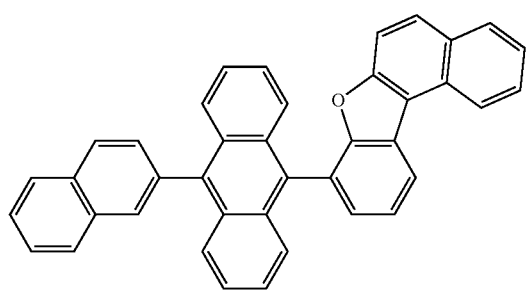
1-061
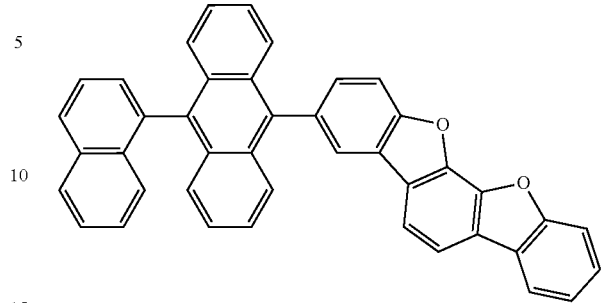
1-062
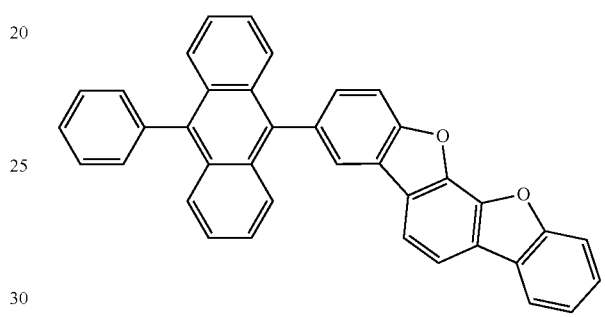
1-063
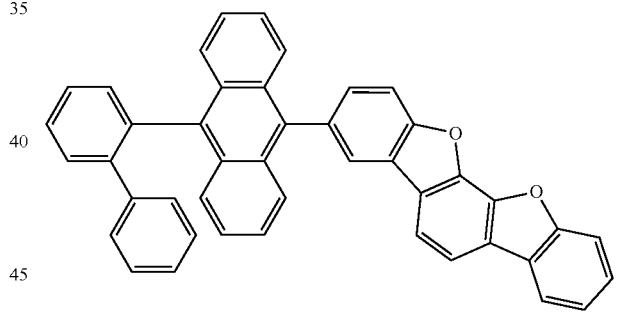
1-064
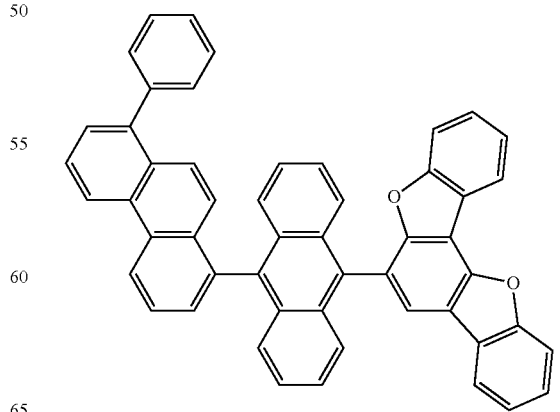

1-065
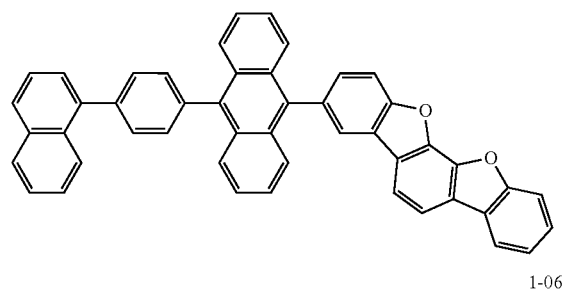
1-066
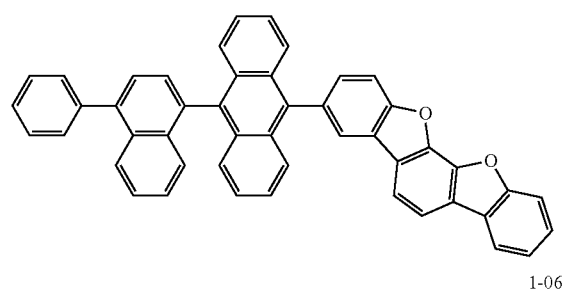
1-067
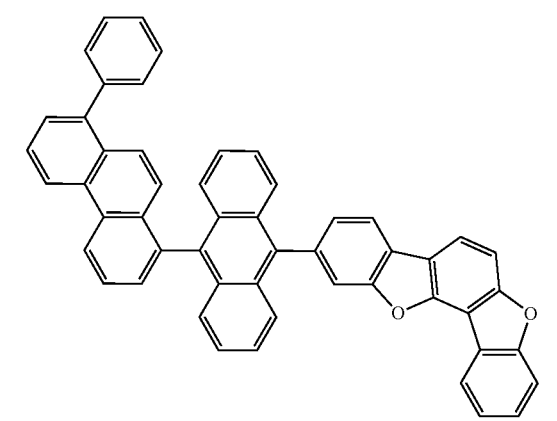
1-068
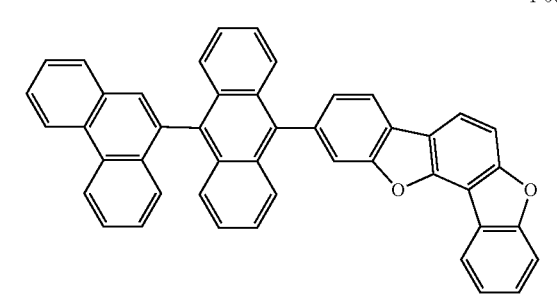
1-069
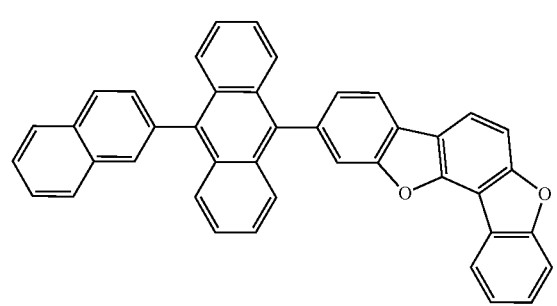
1-070
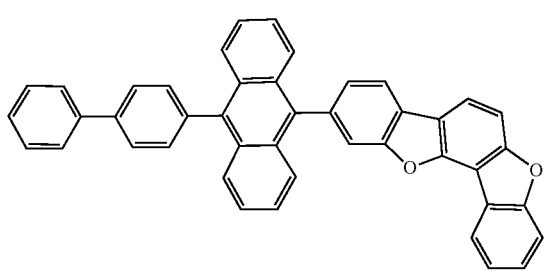
1-071
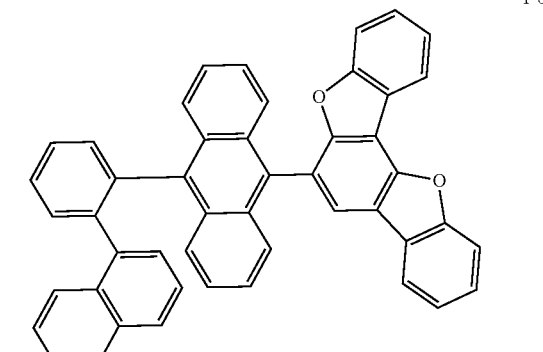
1-072
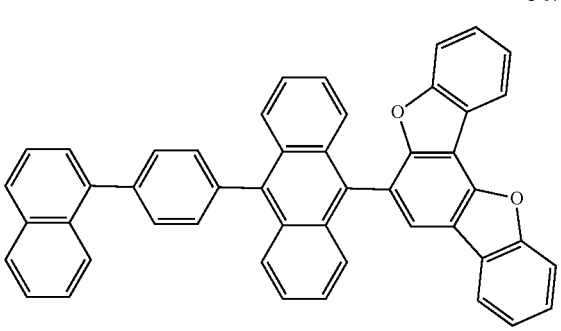
1-073
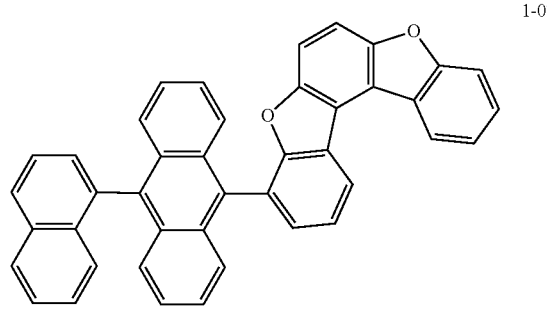
1-074
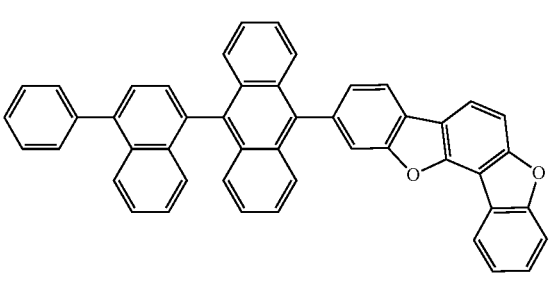

1-075
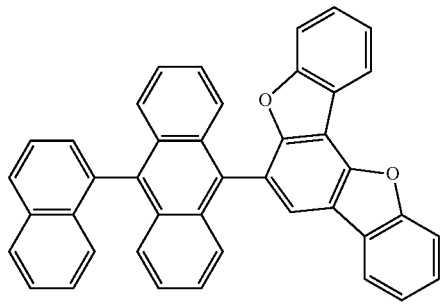
1-076
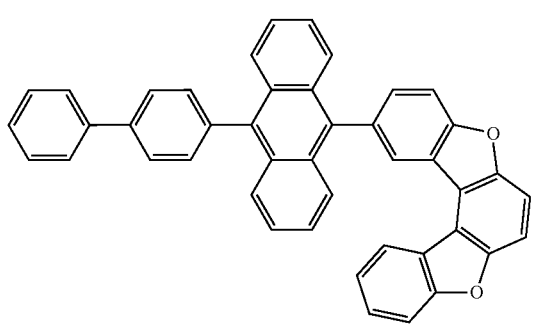
1-077
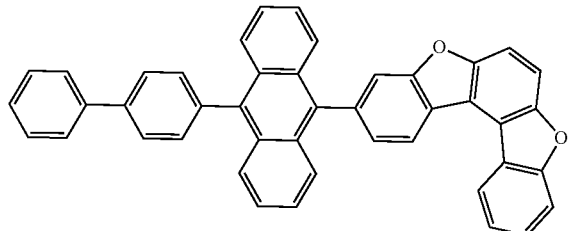
1-078
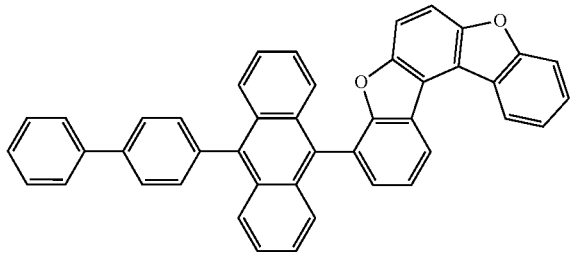
1-079
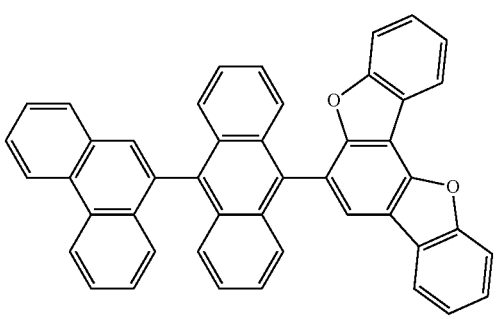
1-080
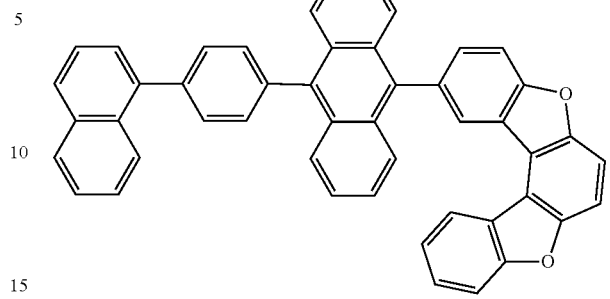
1-081
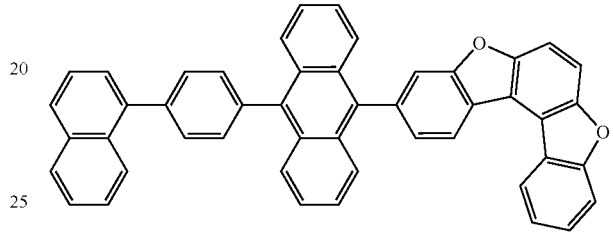
1-082
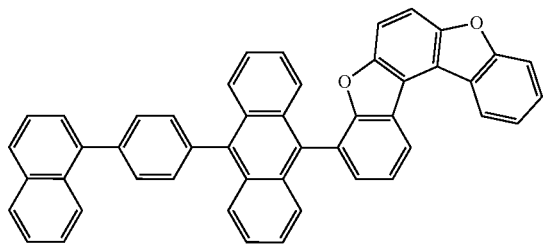
1-083
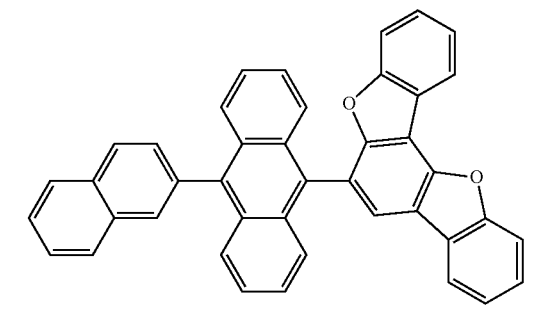
1-084
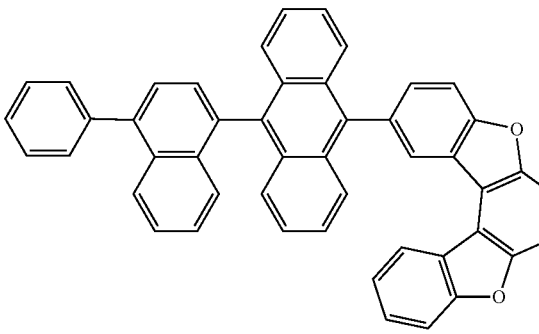

1-085
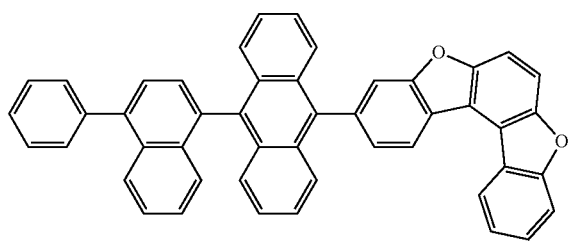
1-086
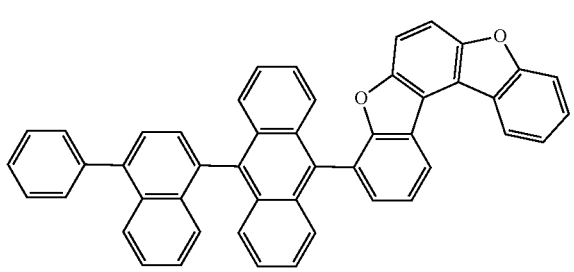
1-087
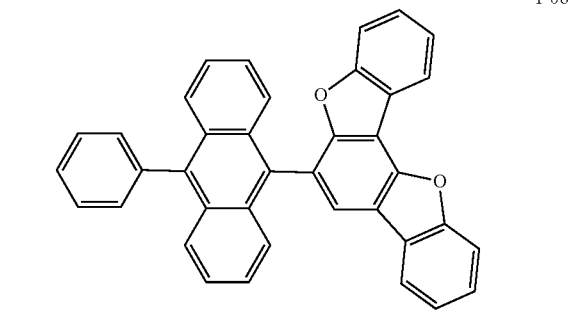
1-088
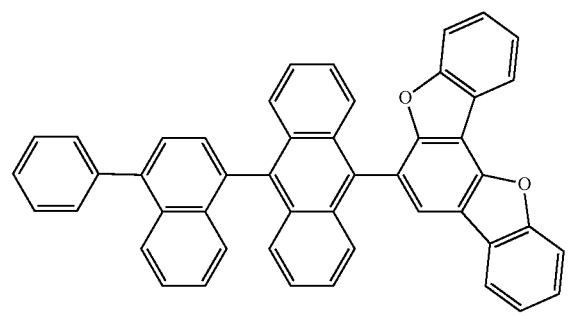
1-089
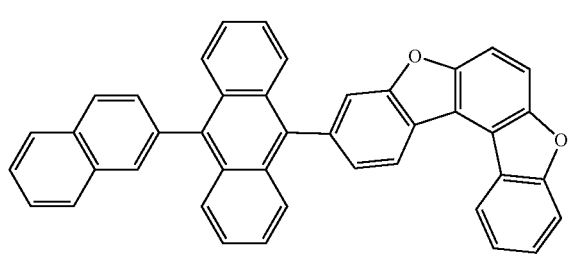
1-090
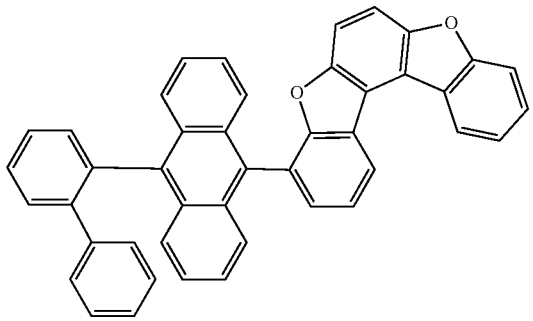
1-091
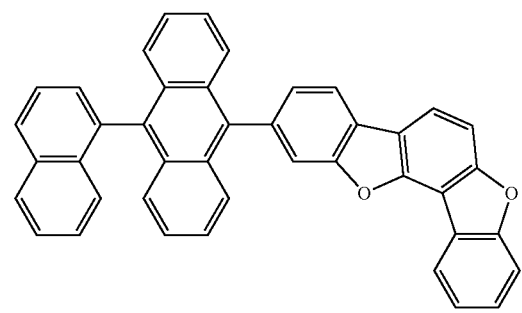
1-092
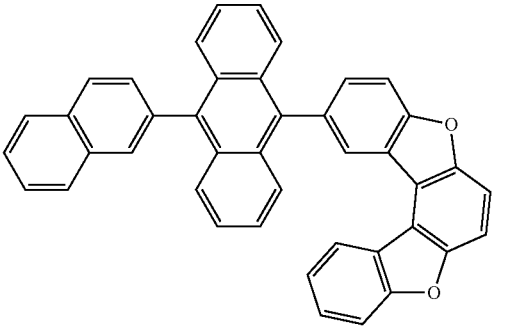
1-093
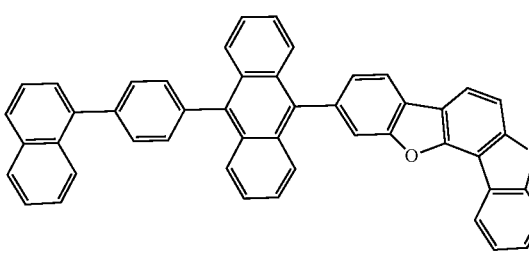
1-094
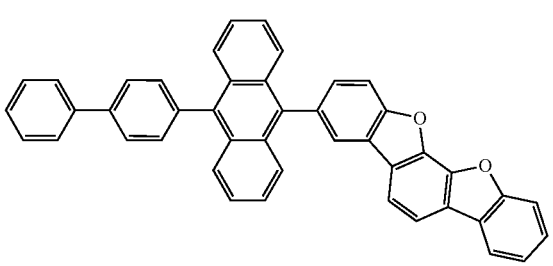

-continued
1-095
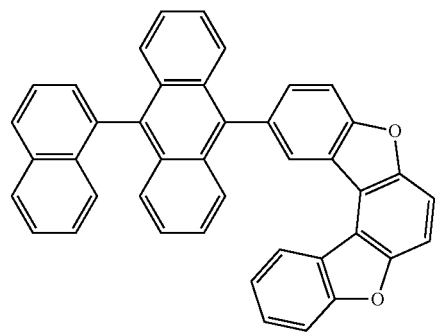
1-096
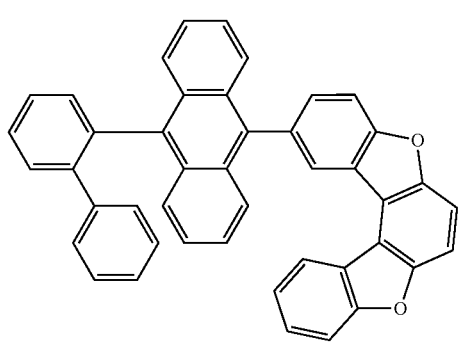
1-097
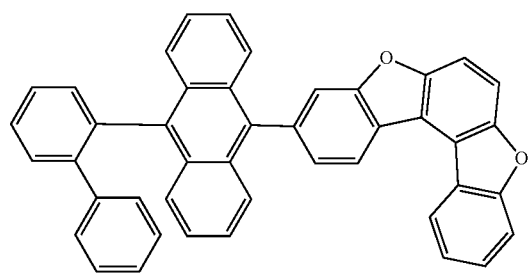
1-098
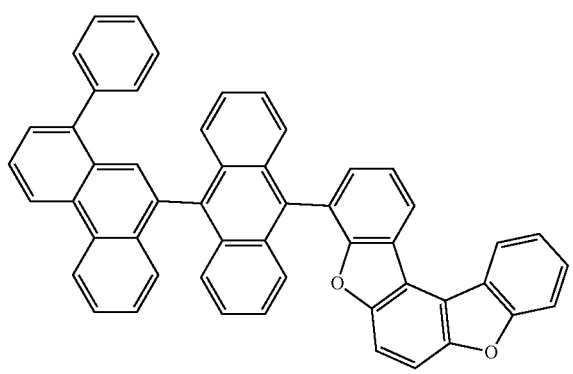
-continued
1-099
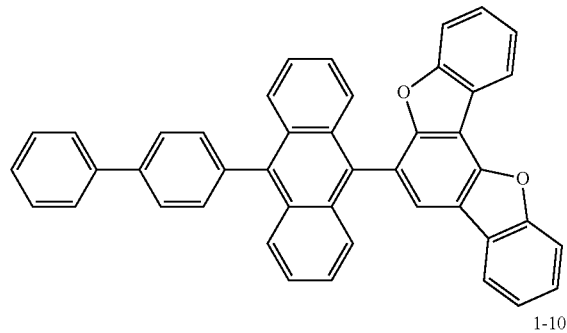
1-100
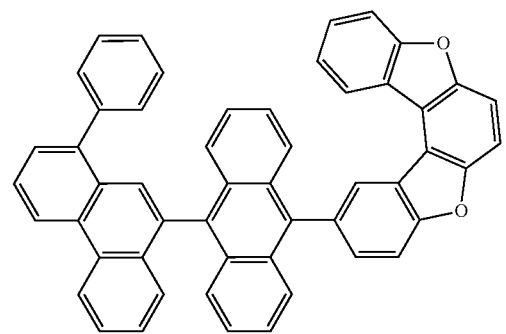
1-101
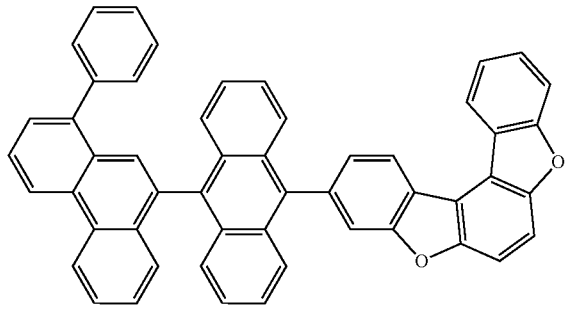
1-102
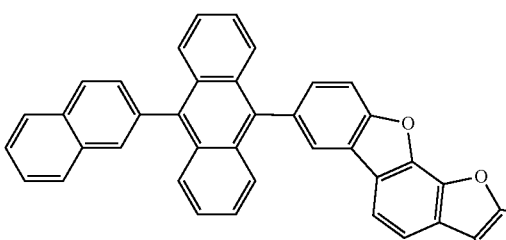
1-103
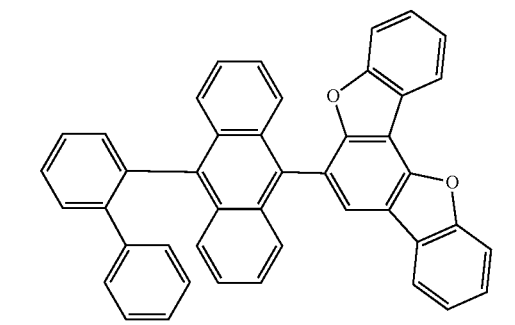

1-104
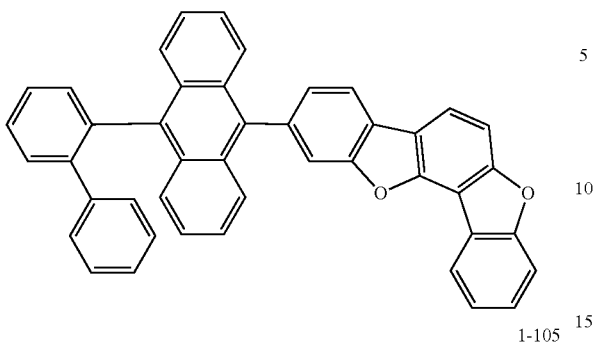
1-105
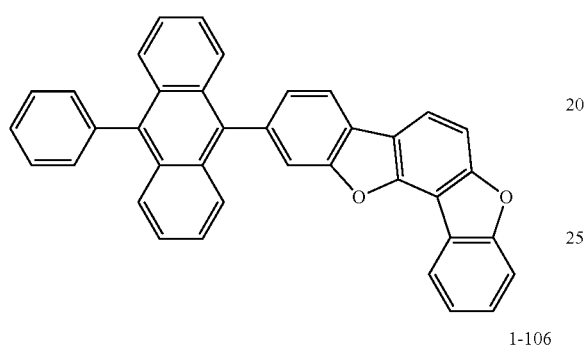
1-106
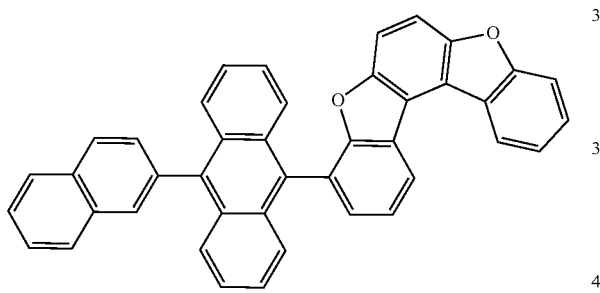
1-107
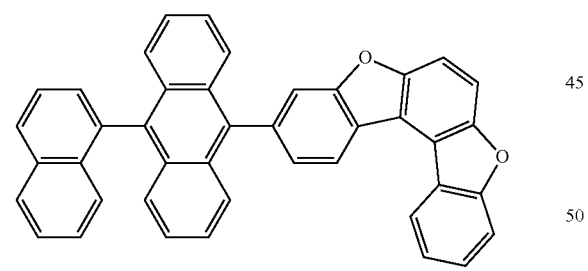
1-108
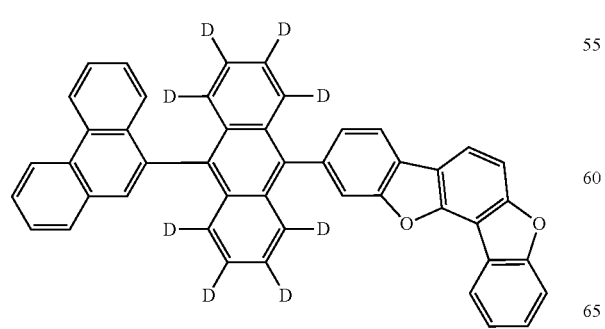
1-109
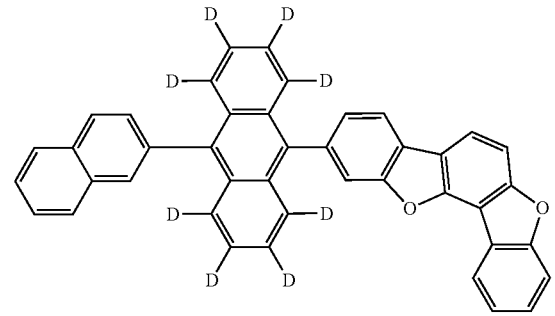
1-110
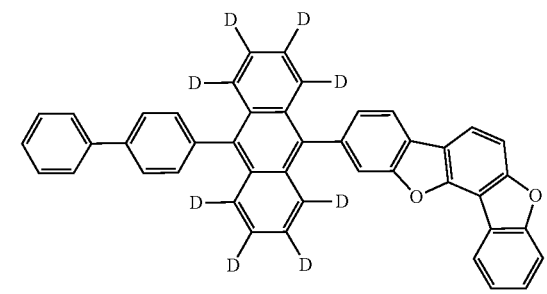
1-111
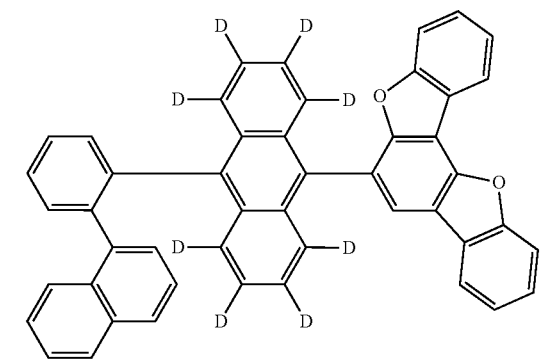
1-112

-continued
1-113
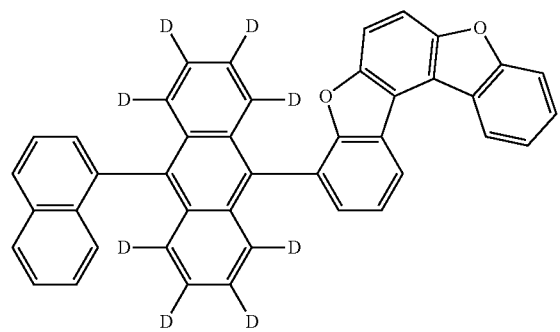
1-114
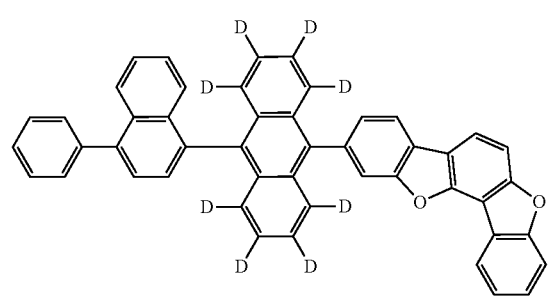
1-115
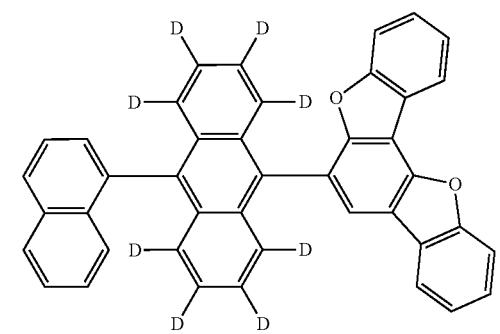
1-116
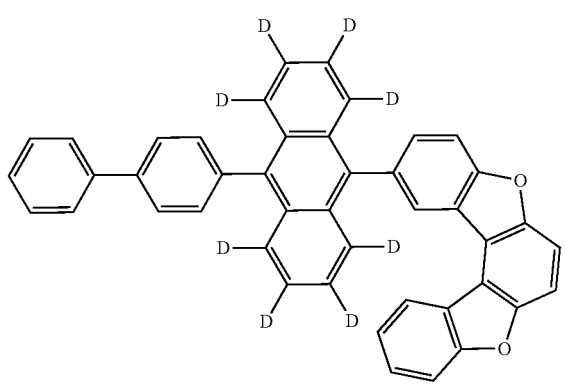
-continued
1-117
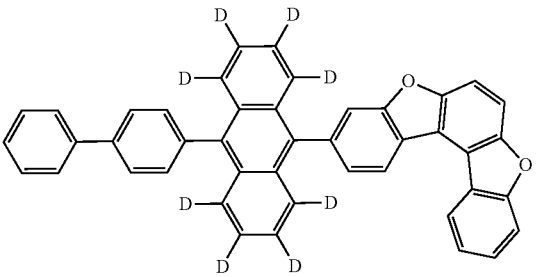
1-118
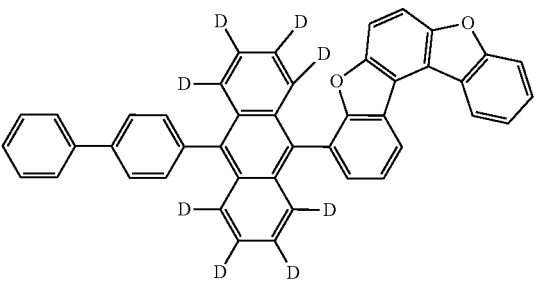
1-119
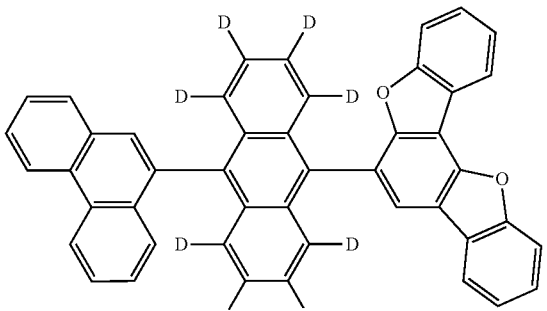
1-120
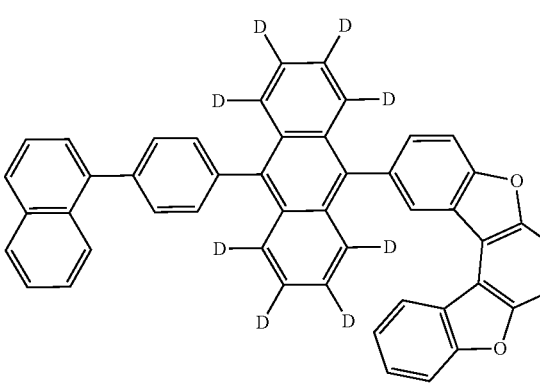

1-121
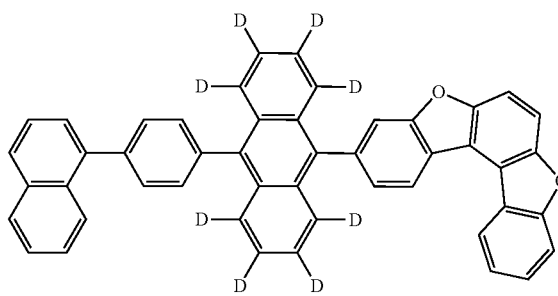
1-125
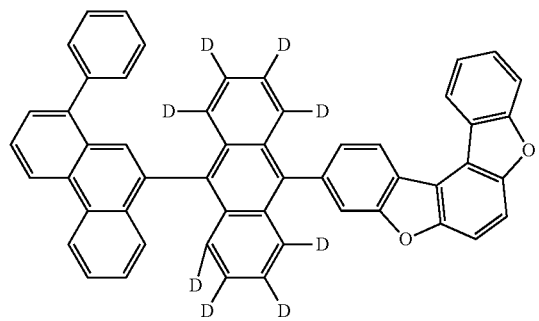
1-122
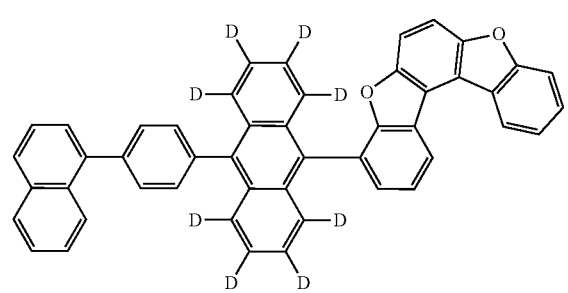
1-126
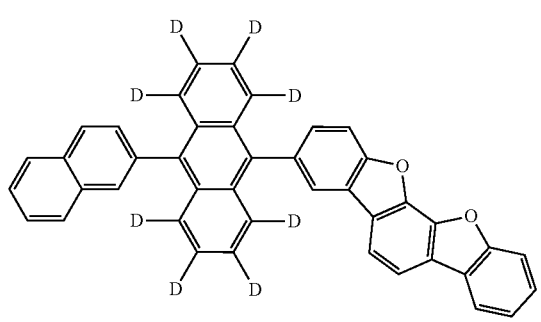
1-123
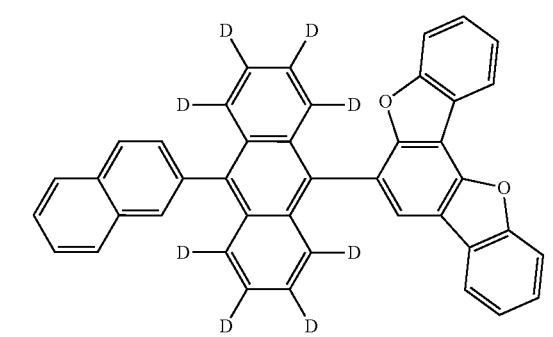
1-127
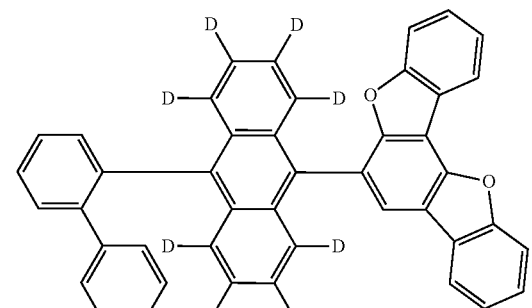
1-124
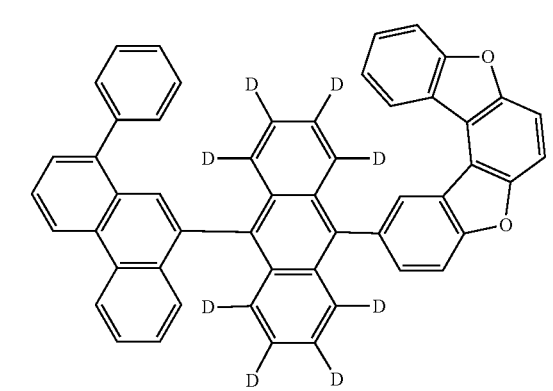
1-128
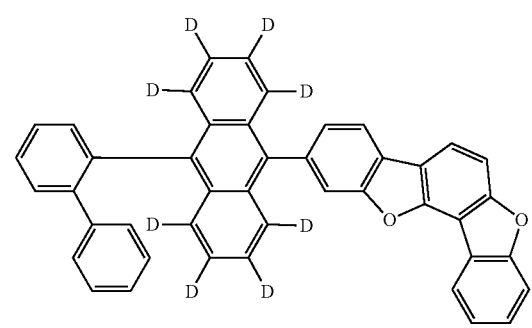

-continued
1-129
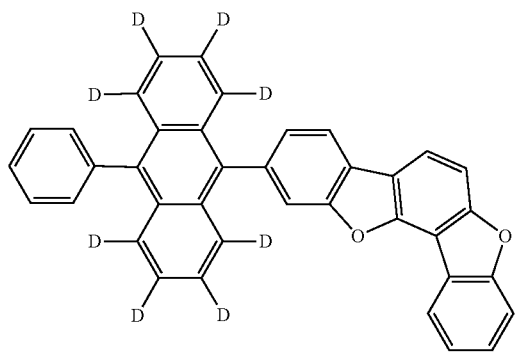
1-130
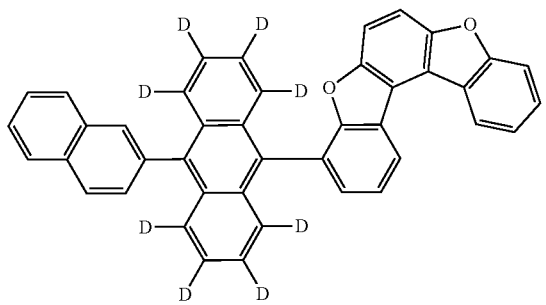
1-131
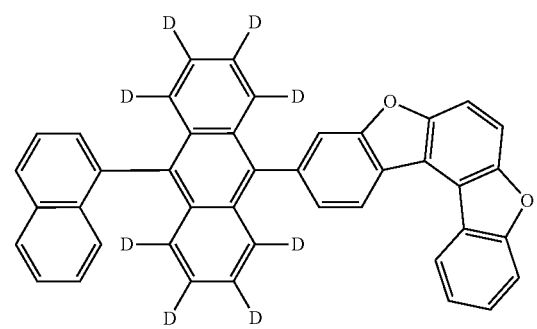
1-132
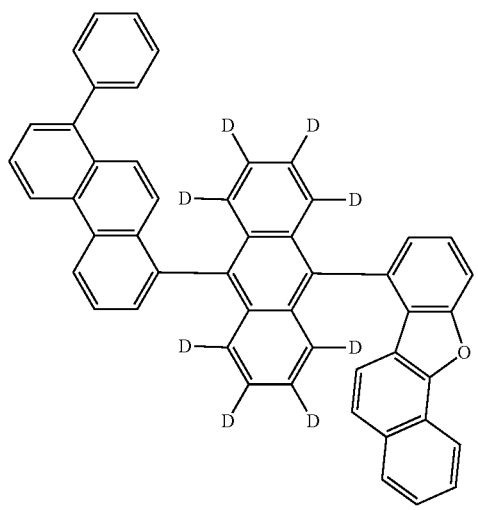
-continued
1-133
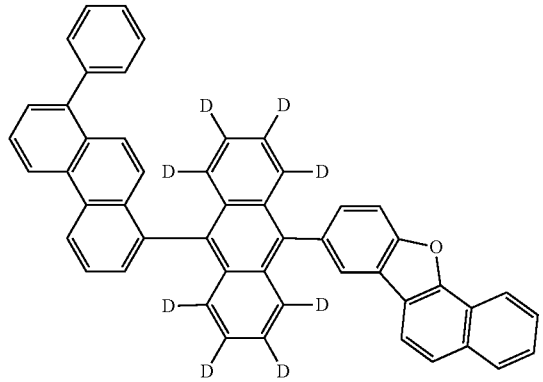
1-134
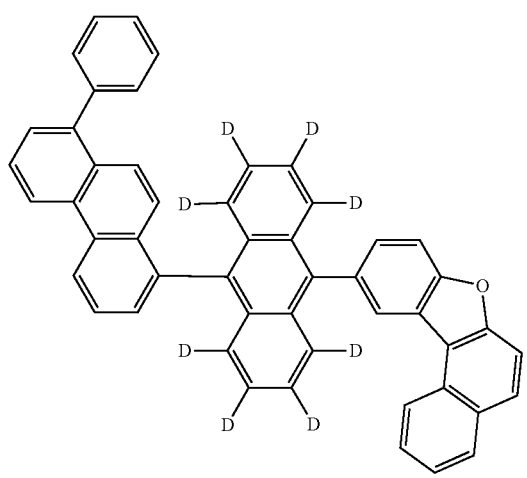
1-135
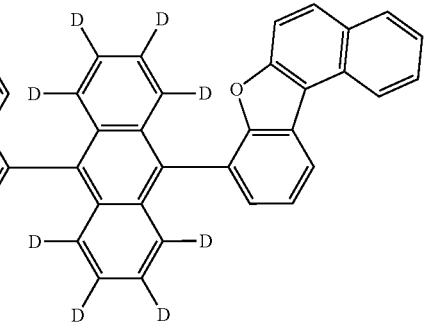

1-136
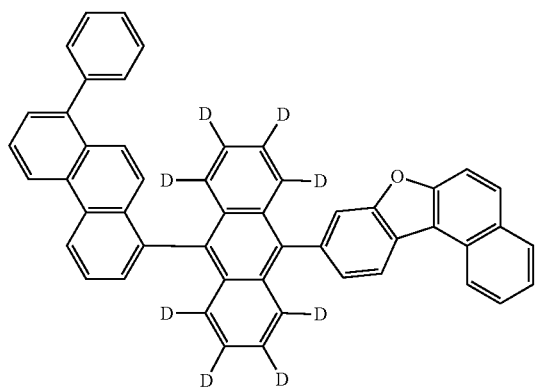
1-137
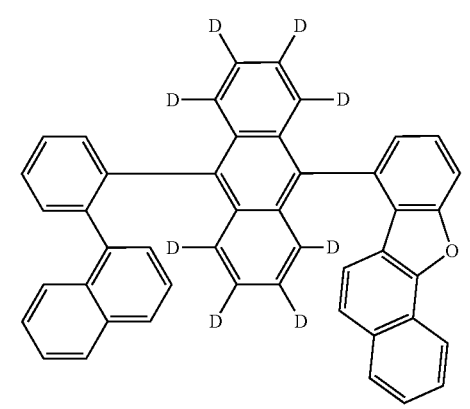
1-138
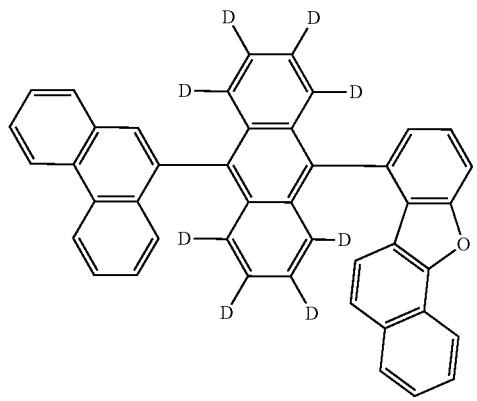
1-139
1-140
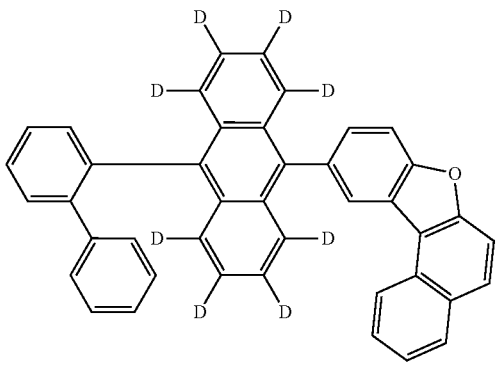
1-141
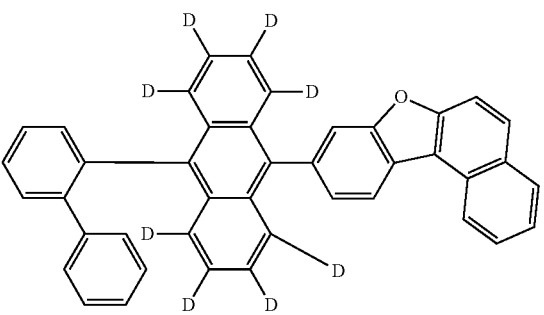
1-142
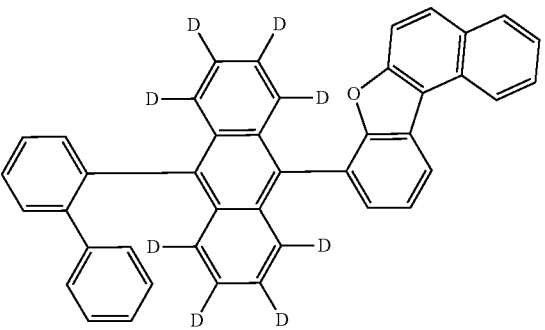
1-143

1-144
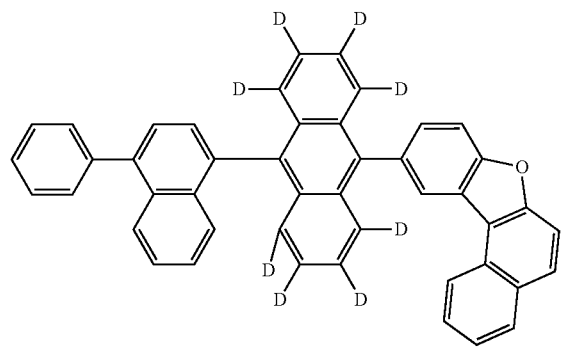
1-145
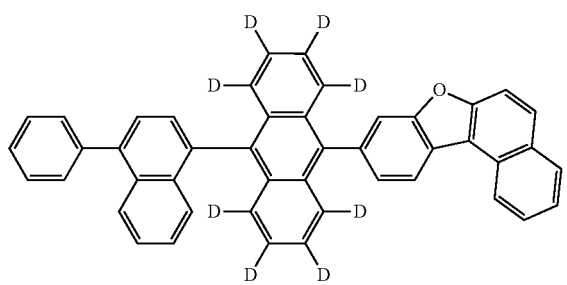
1-146
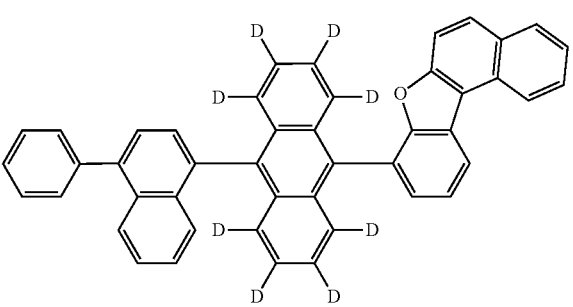
1-147
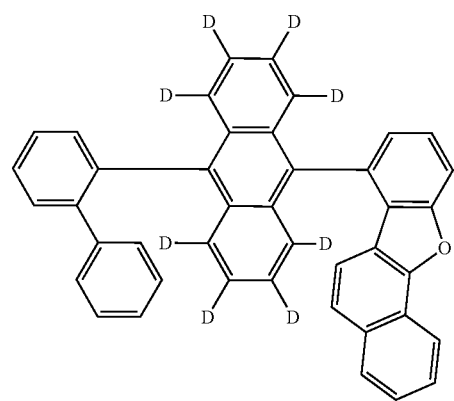
1-148
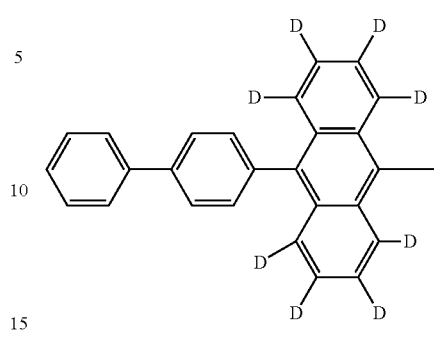
1-149
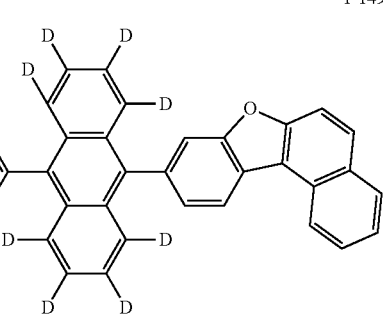
1-150
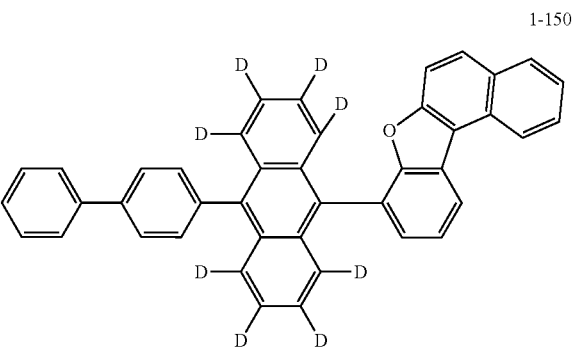
1-151
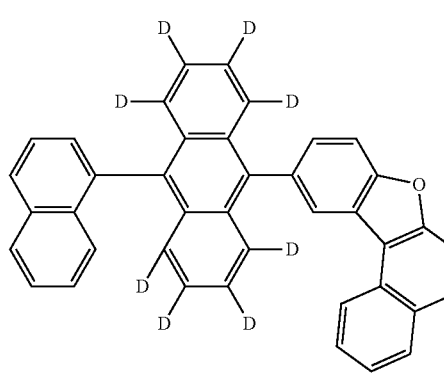

1-152
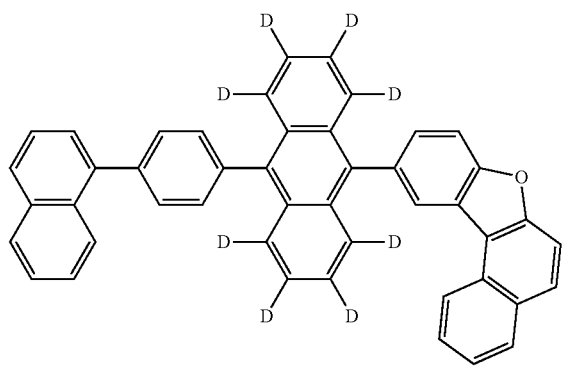
1-153
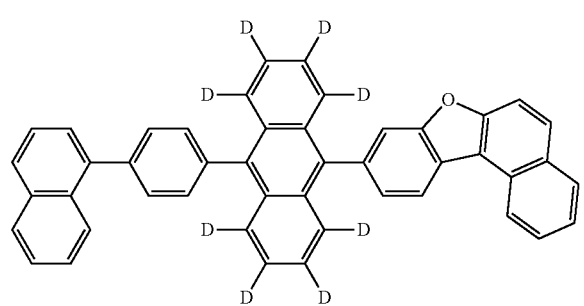
1-154
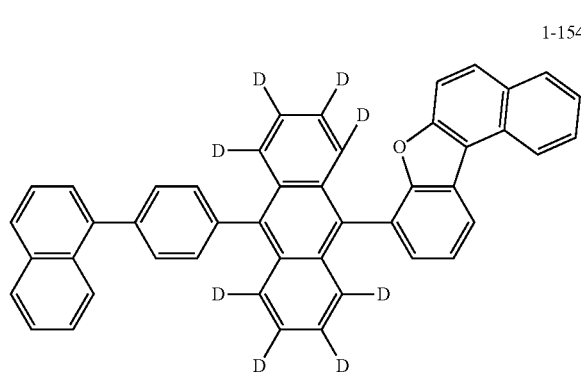
1-155
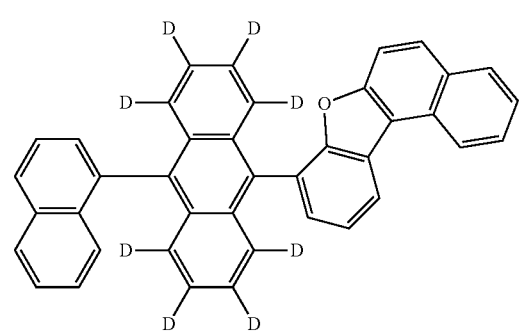
1-156
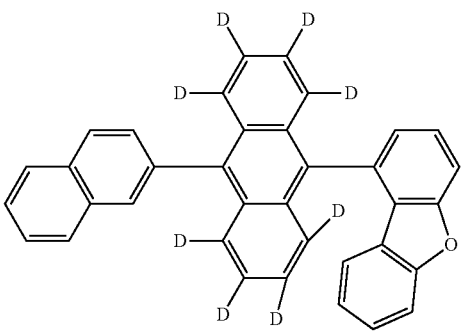
1-157
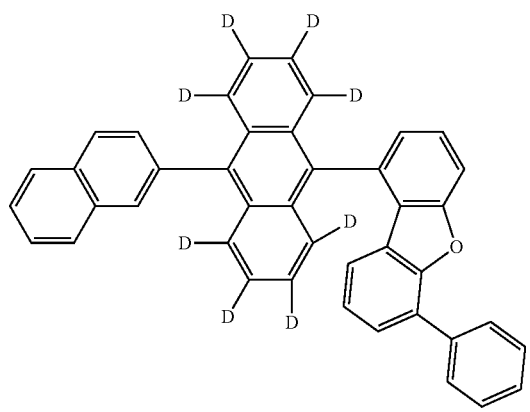
1-158
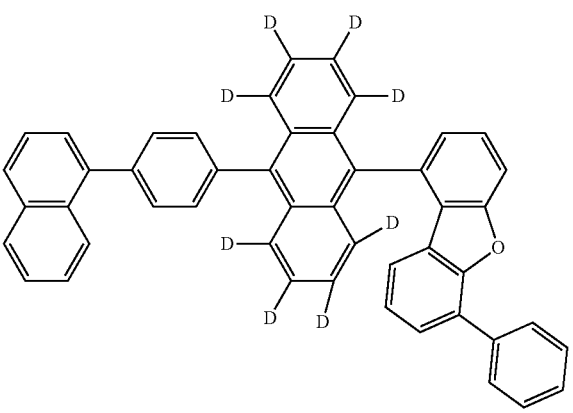
1-159
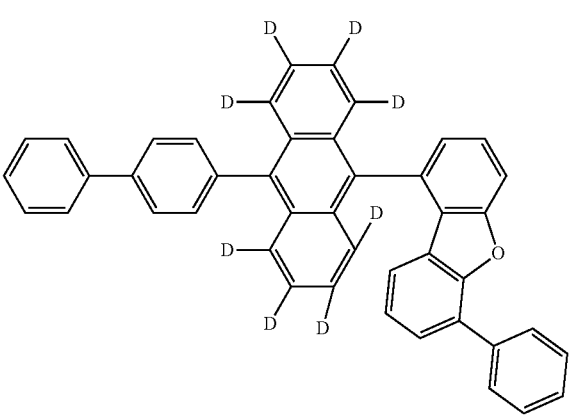

1-160
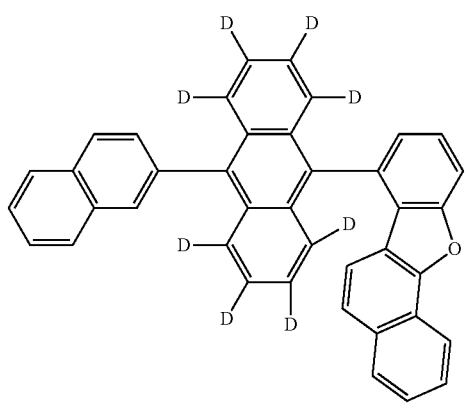
1-161
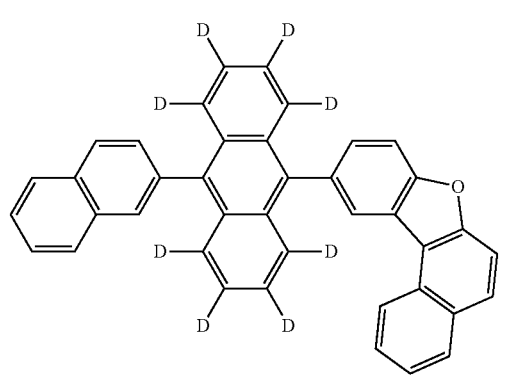
1-162
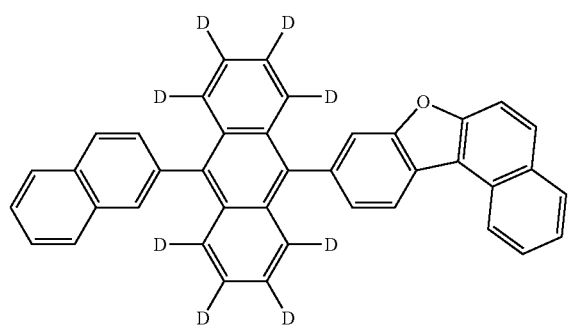
1-163
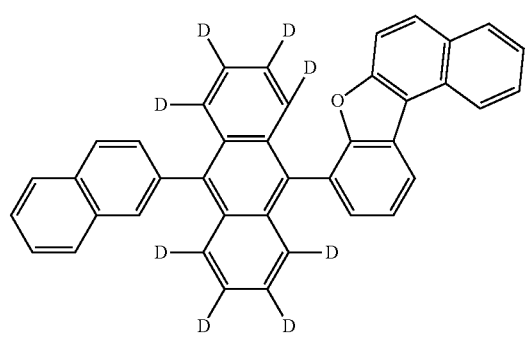
1-164
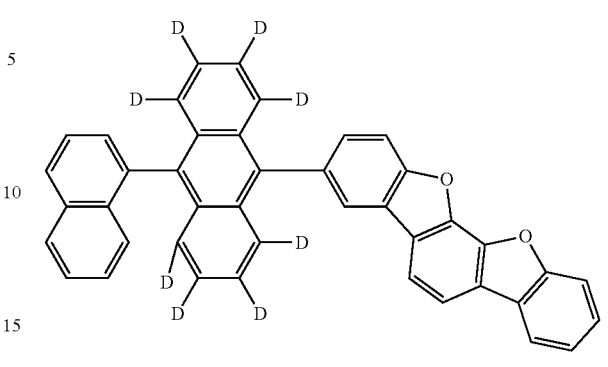
1-165
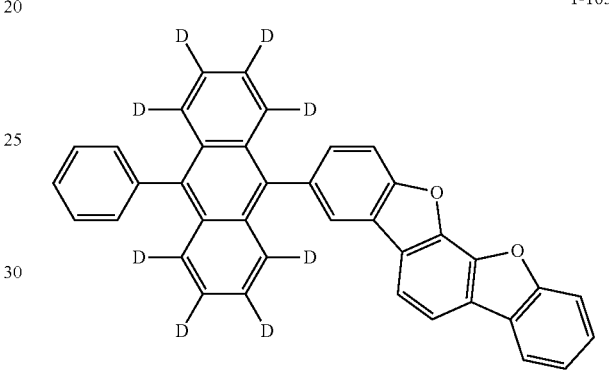
1-166
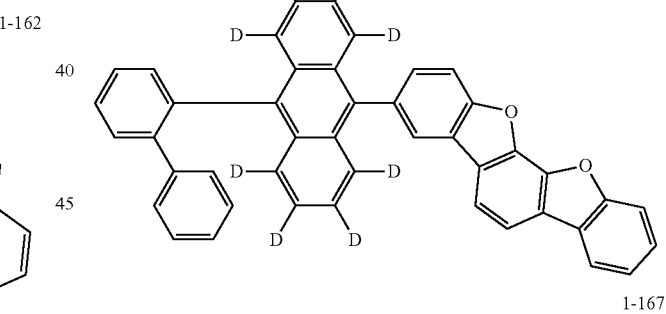
1-167
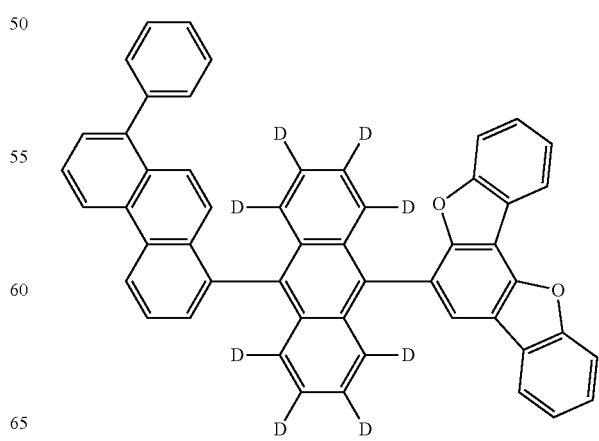

1-168
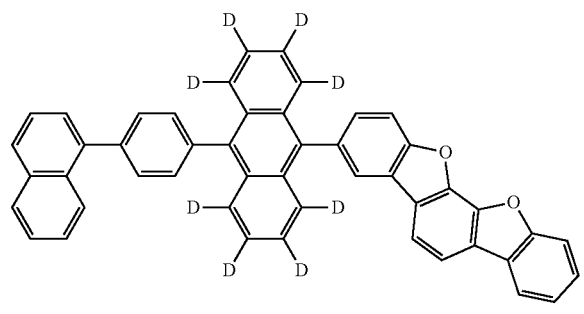
1-169
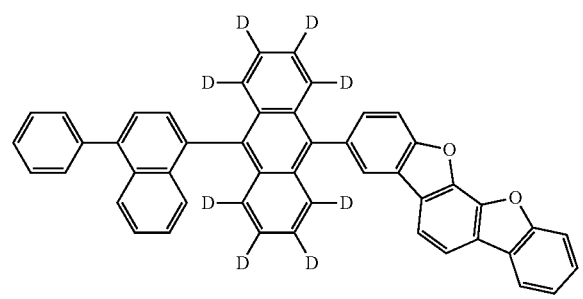
1-170
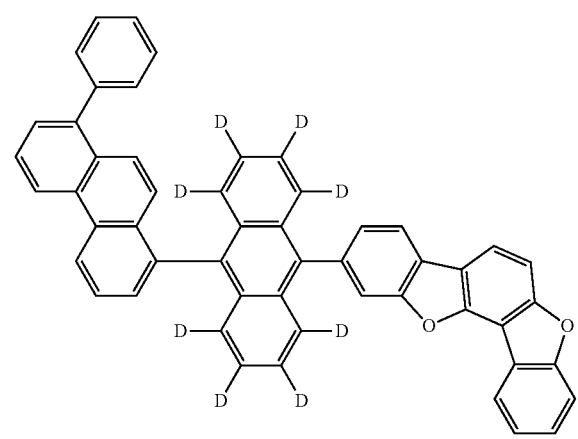
1-171
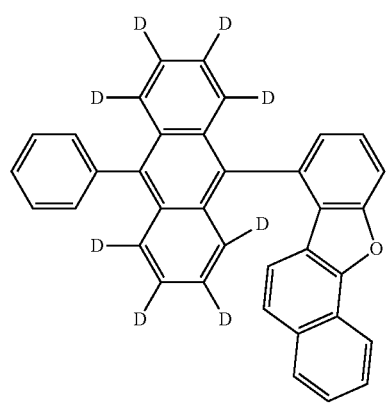
1-172
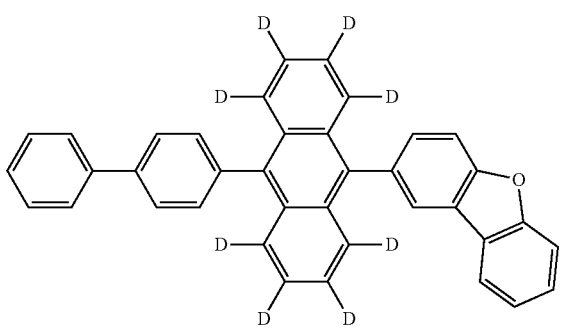
1-173
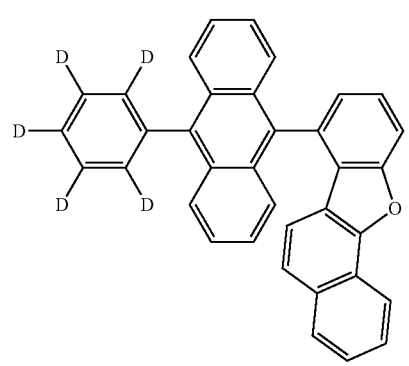
1-174
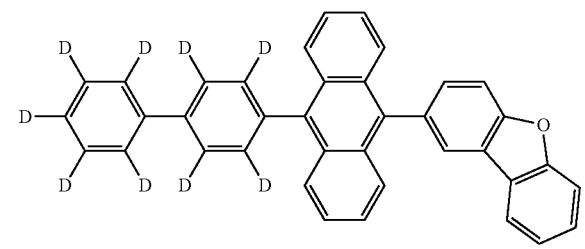
1-175
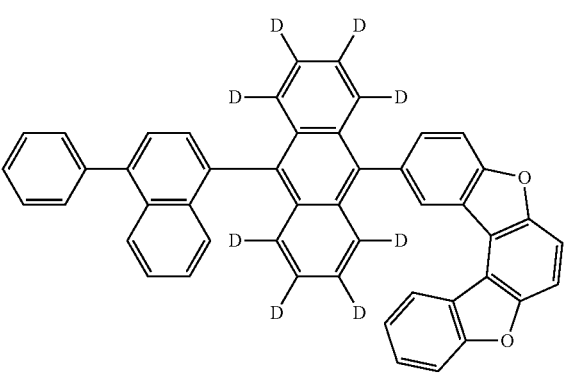

1-176
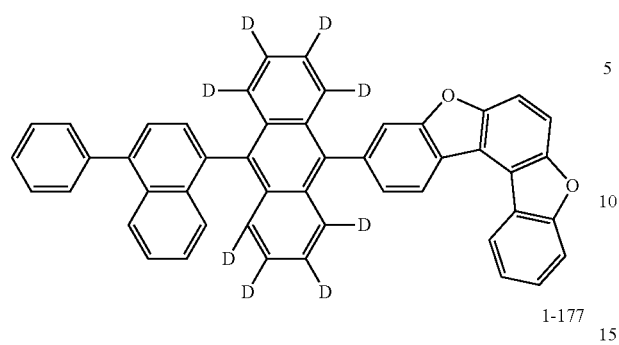
1-177
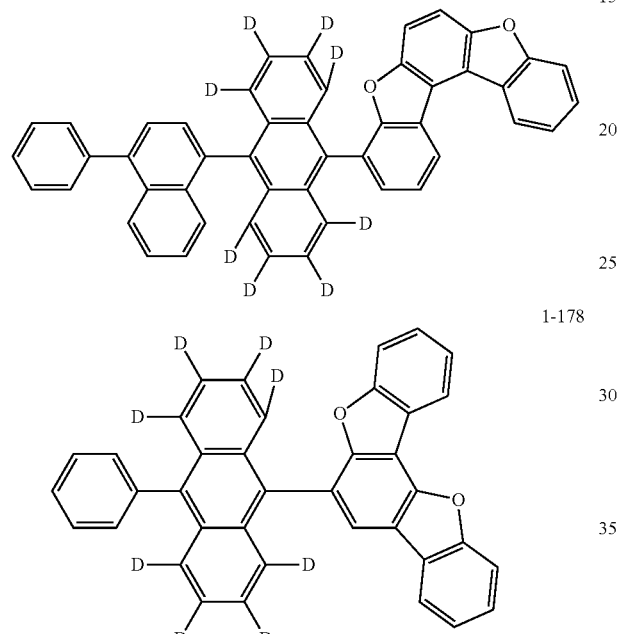
1-178
1-179
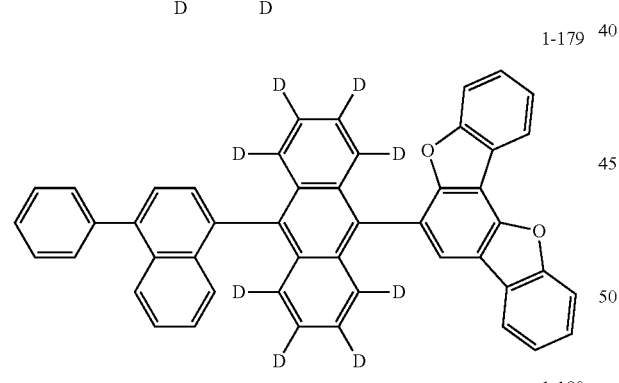
1-180
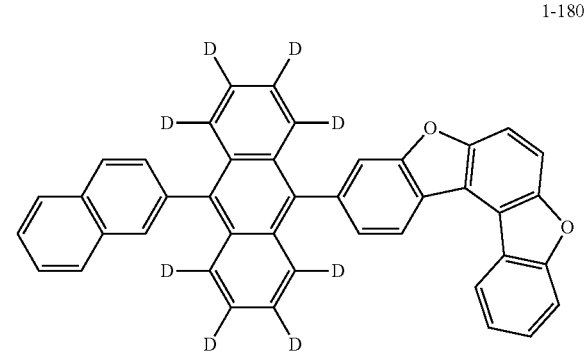
1-181
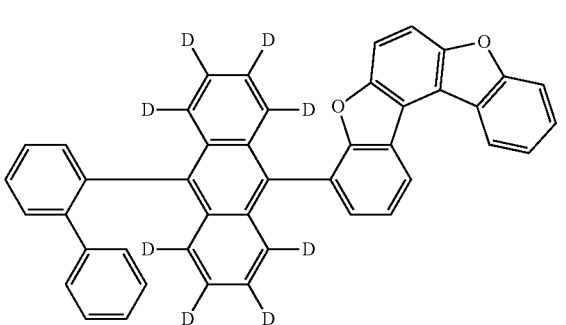
1-182
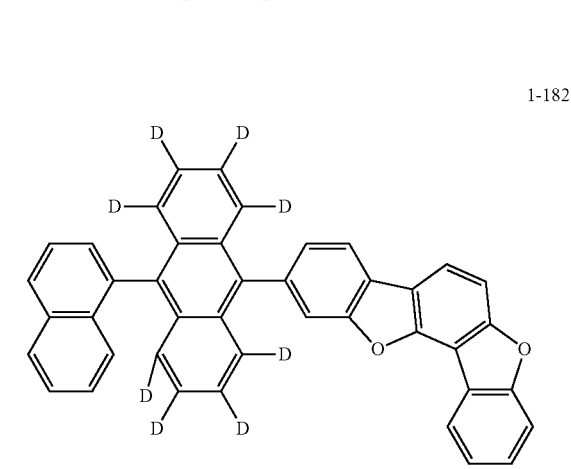
1-183
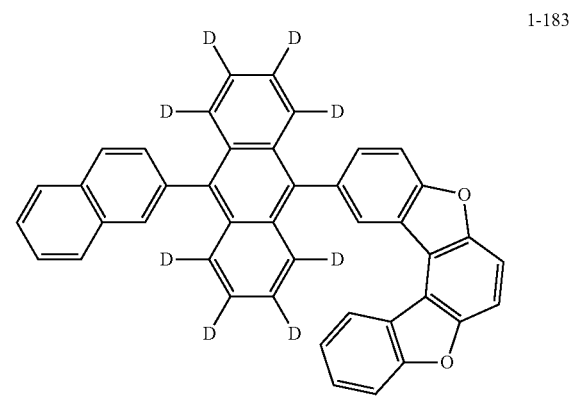
1-184
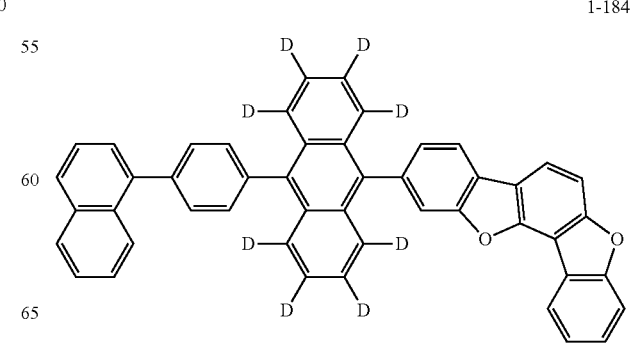

1-185

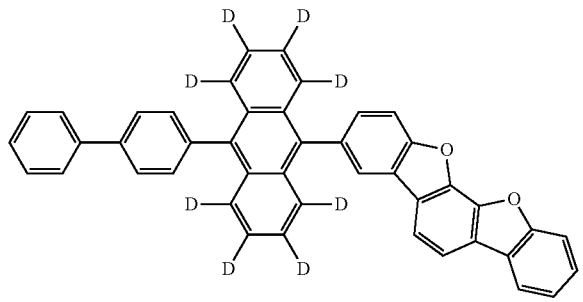

1-189

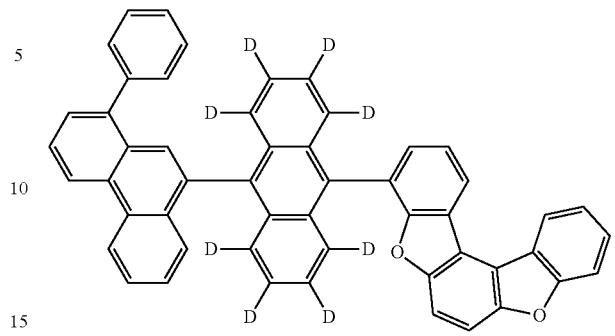

1-186

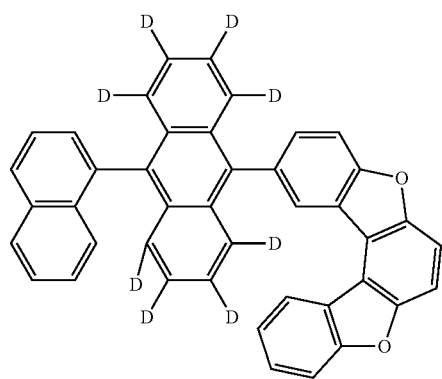

1-187

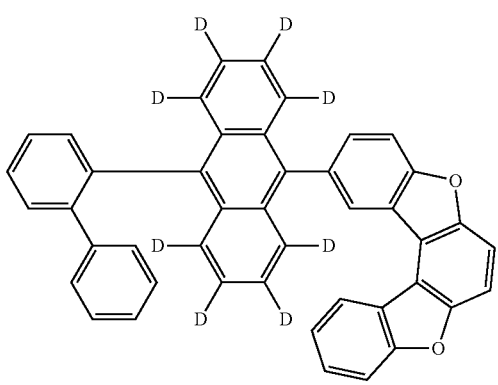

1-190

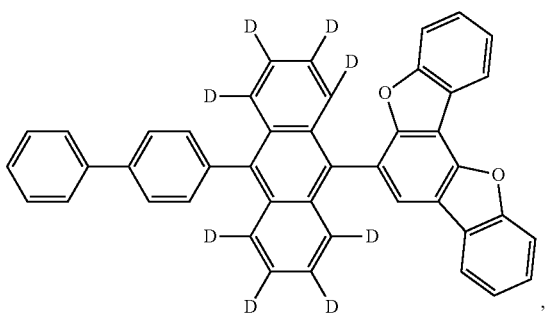

1-188

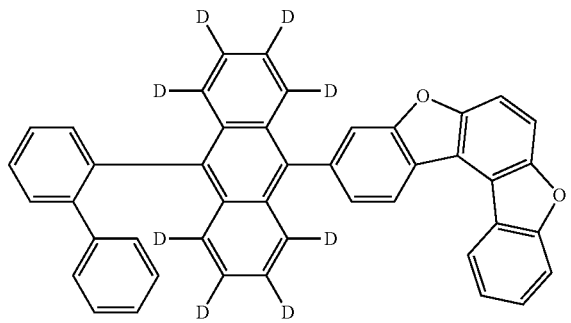

where D represents deuterium.

The present disclosure further provides an organic electroluminescent device. The organic electroluminescent device includes the organic compound as described in any one of the embodiments above.

The present disclosure further provides an organic electroluminescent device. The organic electroluminescent device includes:

a substrate;

a first electrode, the first electrode being located on the substrate;

an organic light-emitting functional layer, the organic light-emitting functional layer being located on the first electrode; and the second electrode, the second electrode being located the organic light-emitting functional layer.

The organic light-emitting functional layer includes a light-emitting layer. The light-emitting layer includes the organic compound as described above.

In some embodiments, the light-emitting layer further includes a boron-nitrogen compound having a structure as shown in a following formula (III):

Formula (III)

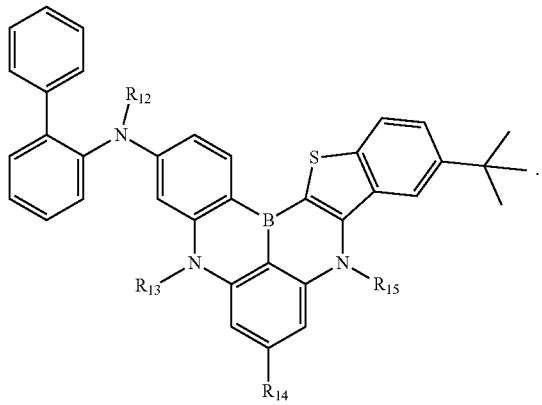

In formula (III), $R_{12}$-$R_{15}$ are each independently selected from hydrogen, deuterium, halogen, a C1-C20 alkyl group, a C3-C20 cycloalkyl group, a C6-C30 aryl group, a C5-C30 heteroaryl group, a C3-C30 silyl group, a C6-C30 aryl silyl group and a C5-C30 fused ring group, and a combination thereof, the combination including a combination in a form of a fused ring, a heteroatom being O.

In some embodiments, in formula (III), $R_{12}$ is selected from a methyl group, a tert-butyl group, a tert-butylphenyl group, an aryl cyclohexyl group and a phenyl group, and a combination thereof.

In some embodiments, in formula (III), $R_{13}$ is a tert-butylphenyl group or a diphenylfuranyl group.

In some embodiments, in formula (III), $R_{14}$ is selected from deuterium, fluorine (F), a methyl group, a tert-butyl group, a phenyl group, a triaryl silane group and a tert-butyldiphenylsilyl group, and a combination thereof.

In some embodiments, in formula (III), $R_{15}$ is selected from a methyl group, a tert-butyl group, a phenyl group, a tert-butylphenyl group and a benzocyclohexyl group, and a combination thereof.

In some embodiments, the boron-nitrogen compound is selected from any one of following chemical structures:

2-001

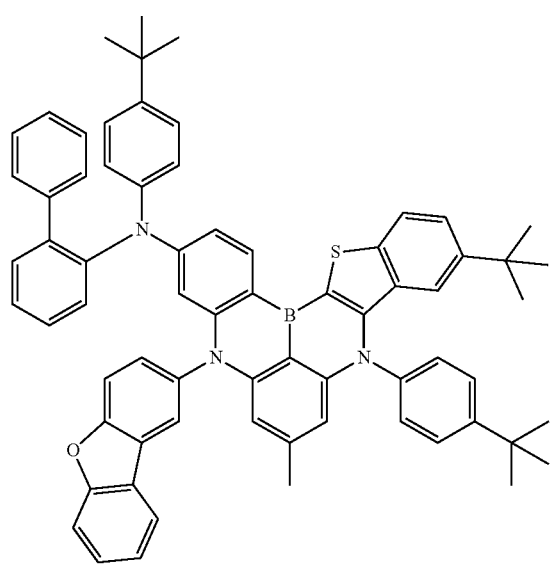

2-002

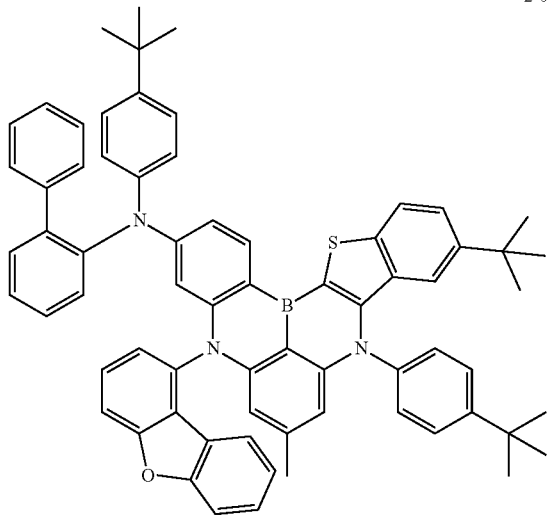

2-003

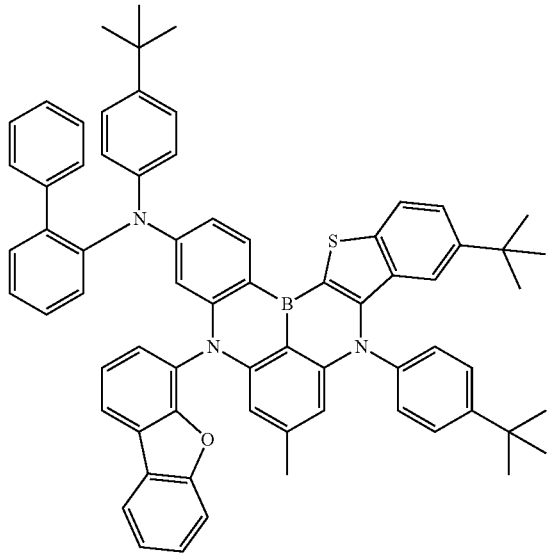

2-004
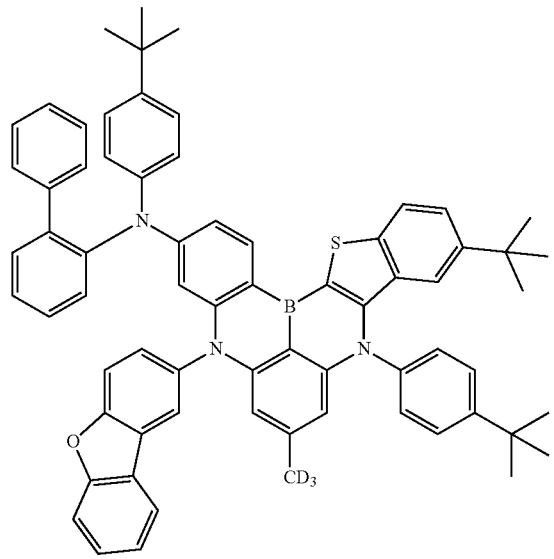
2-006
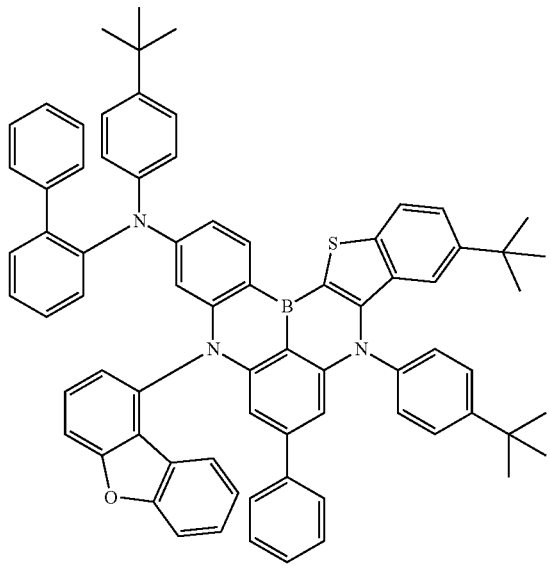
2-005
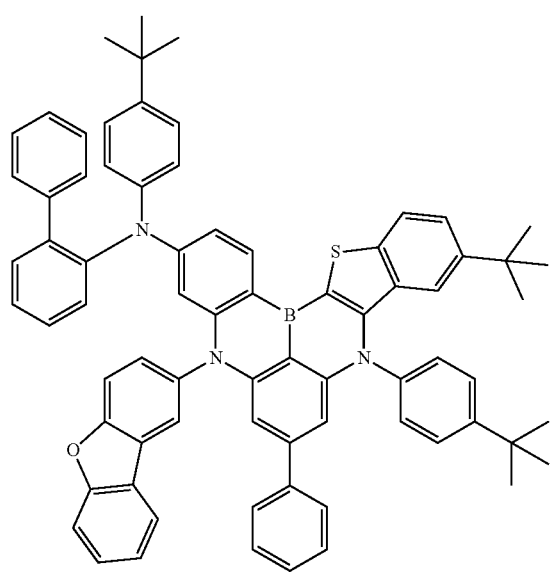
2-007
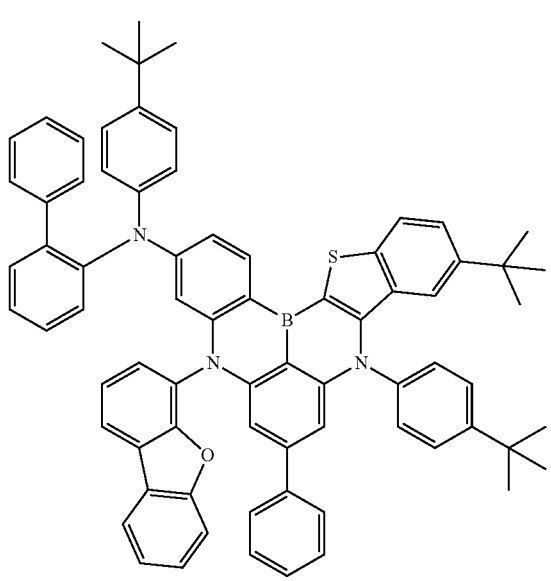

2-008
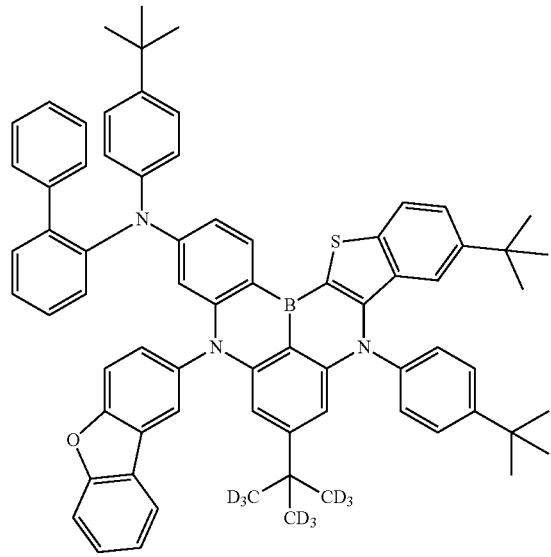
2-010
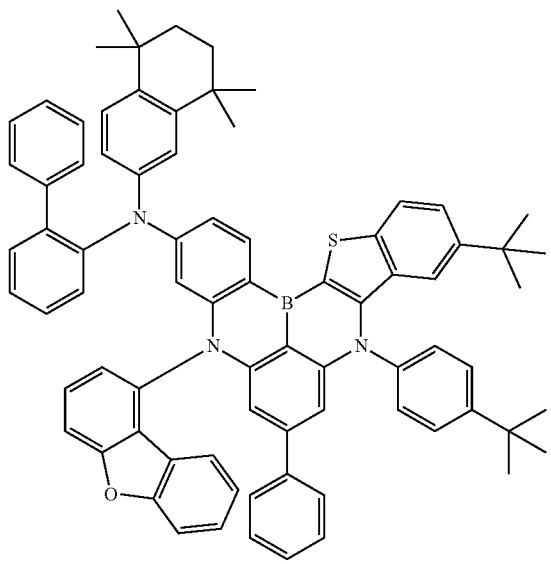
2-009
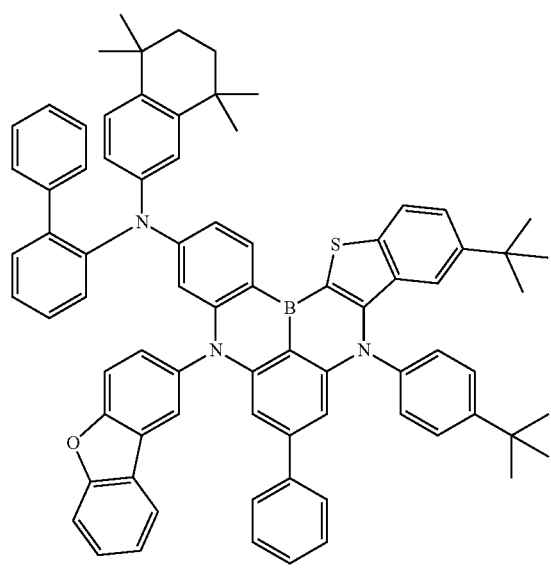
2-011
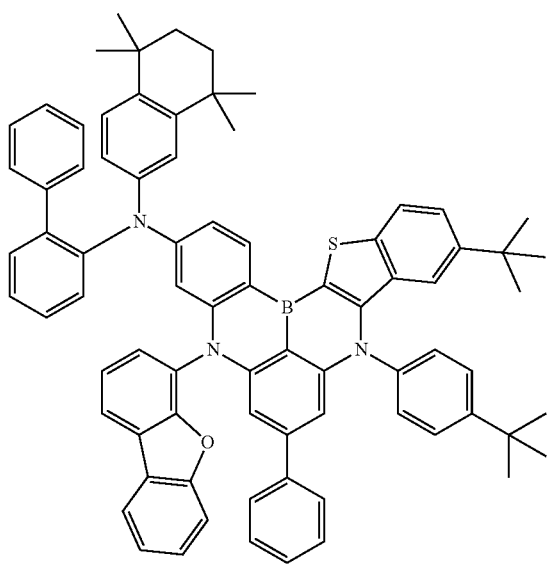

2-012
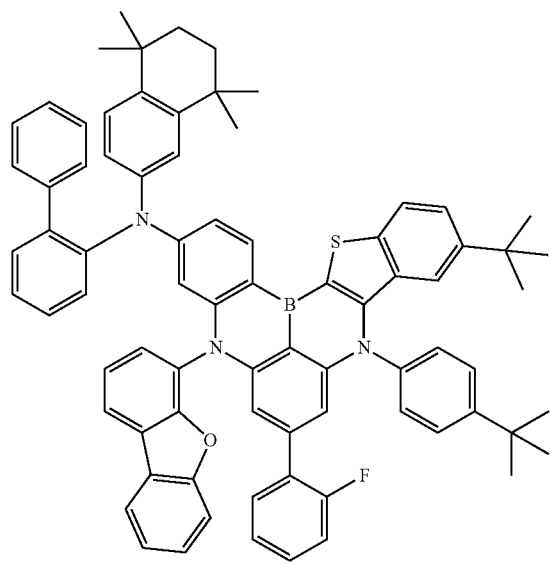
2-014
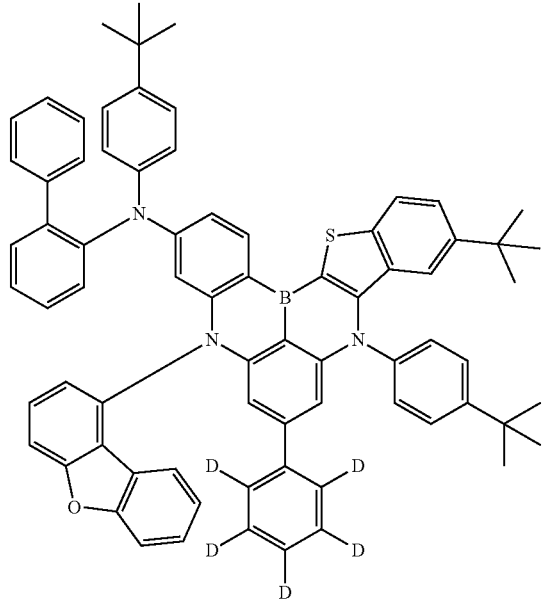
2-013
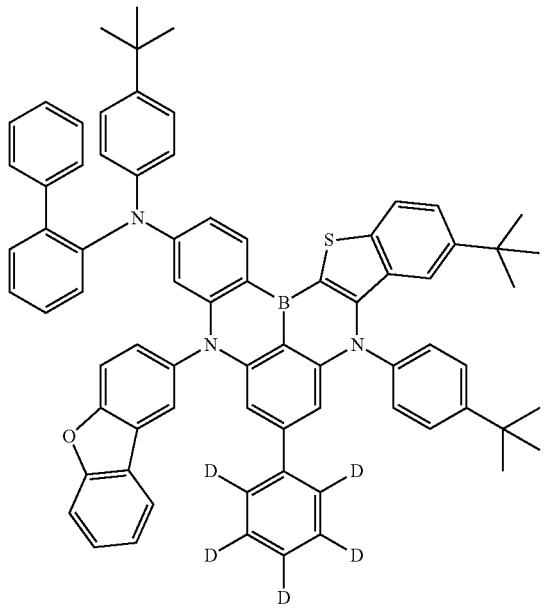
2-015
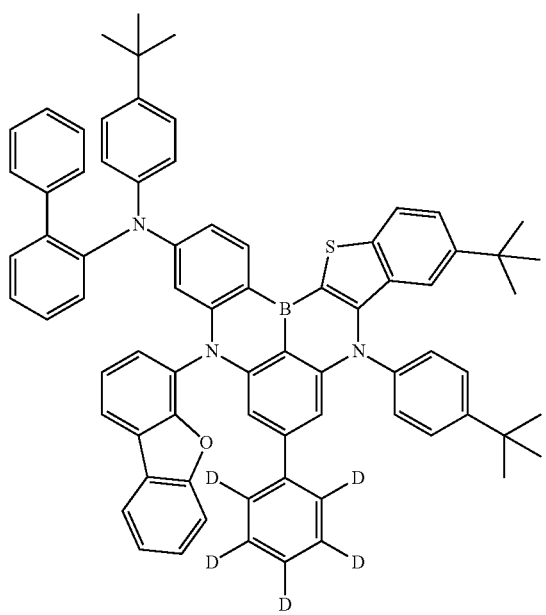

2-016
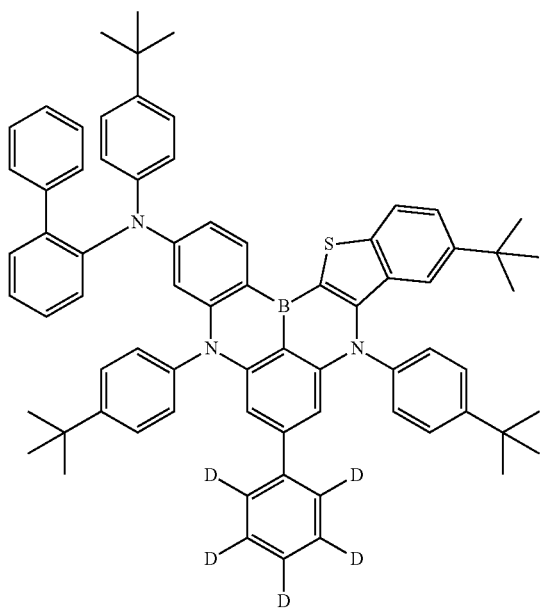
2-018
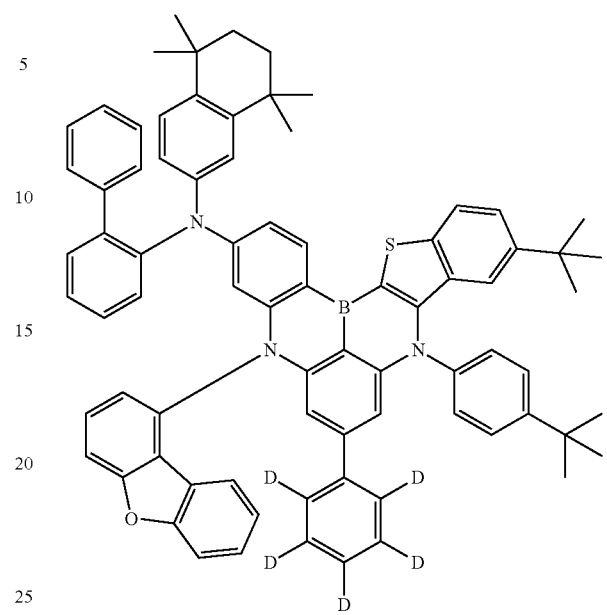
2-017
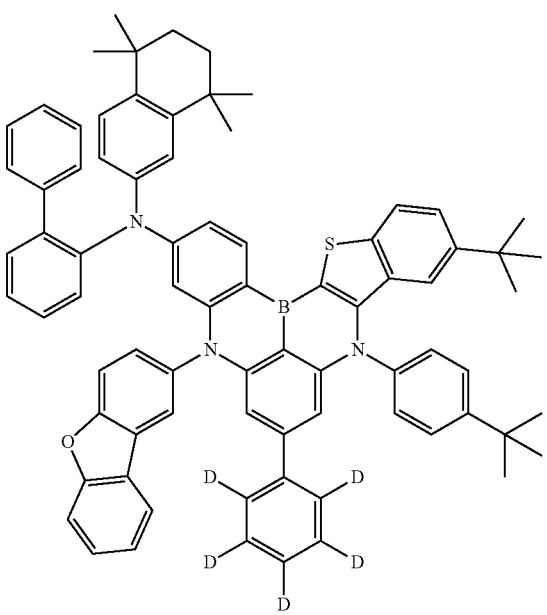
2-019
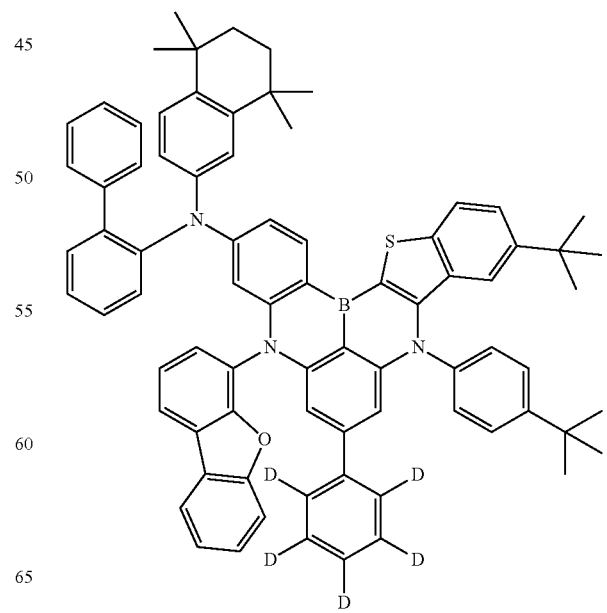

2-020
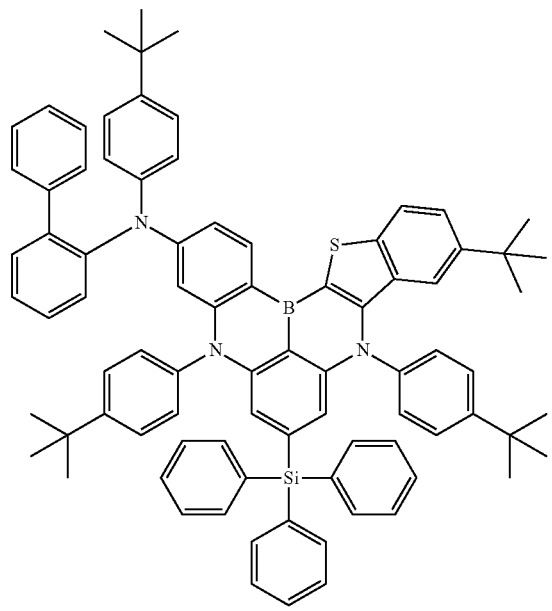
2-022
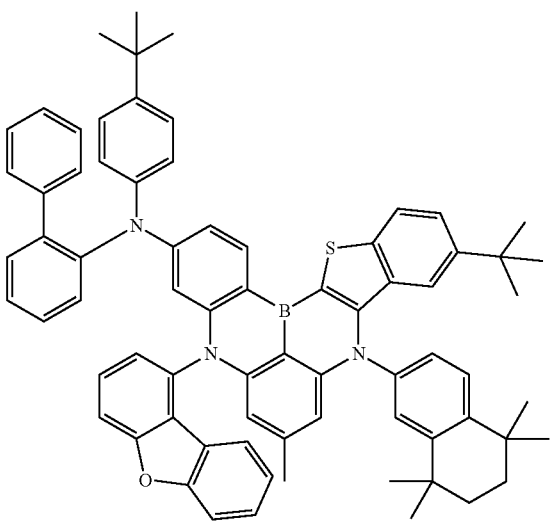
2-021
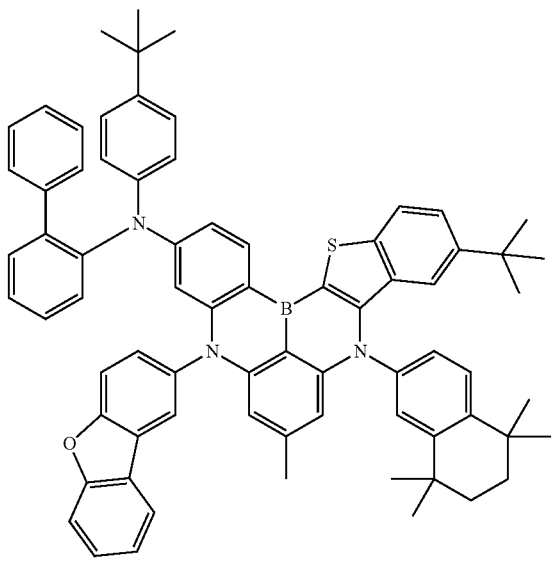
2-023
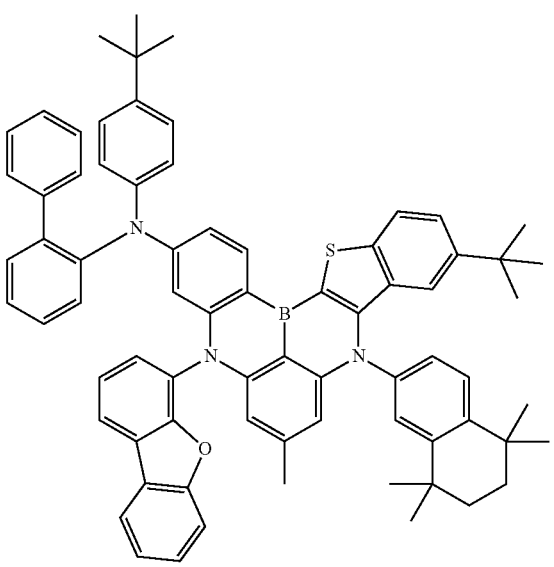

2-024
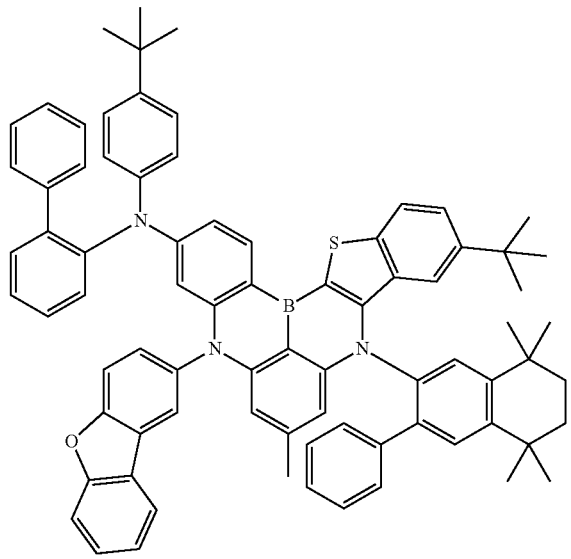
2-025
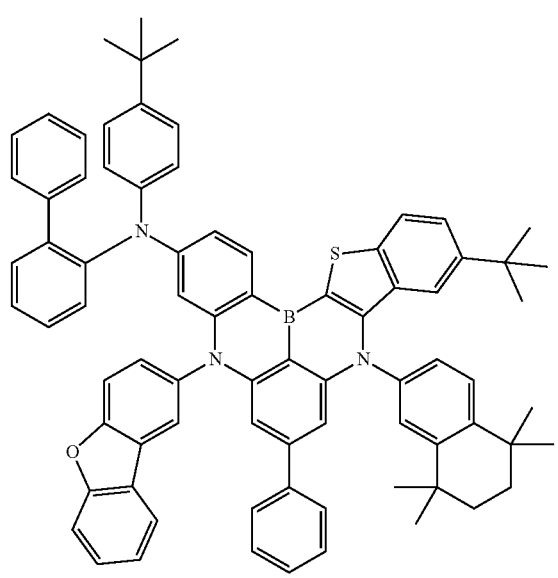
2-026
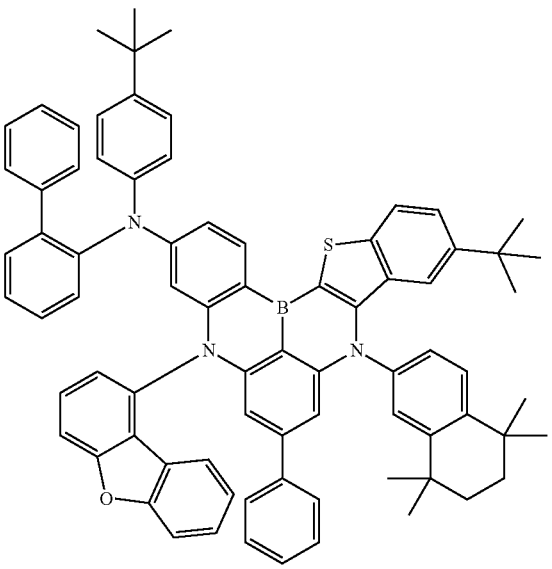
2-027
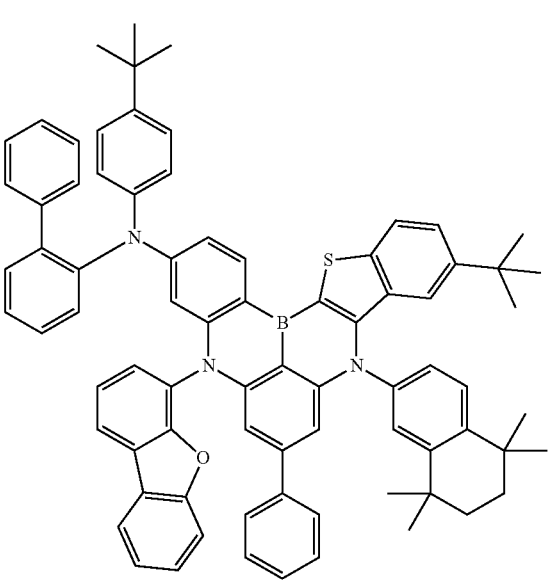

2-028
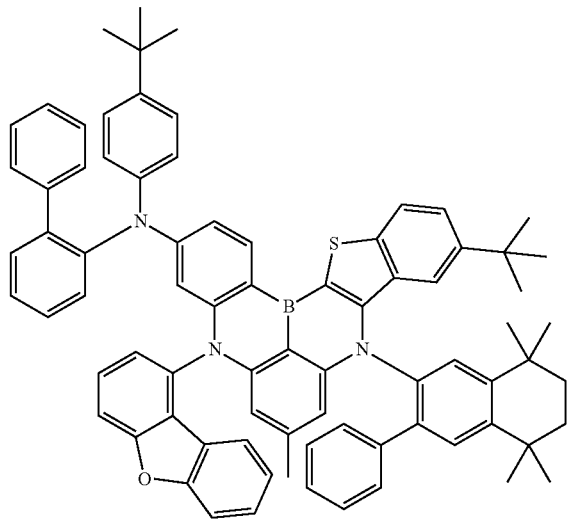
2-030
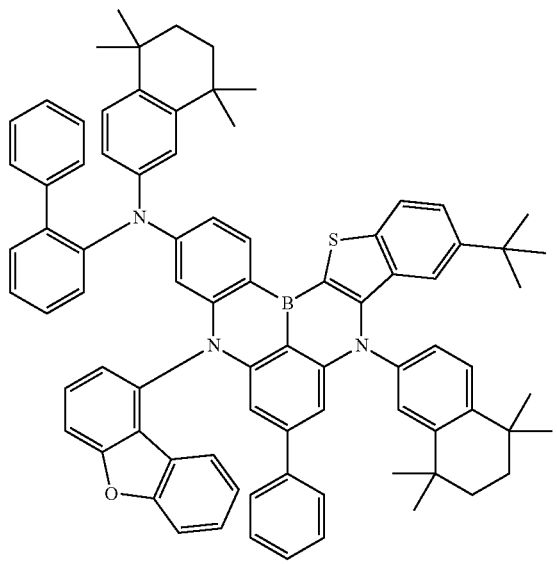
2-029
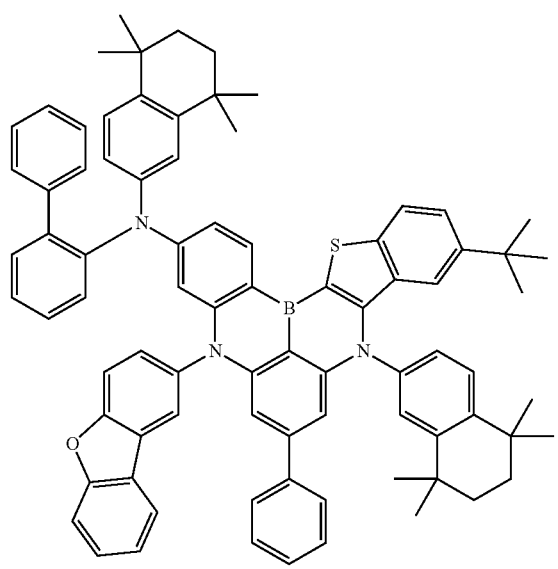
2-031
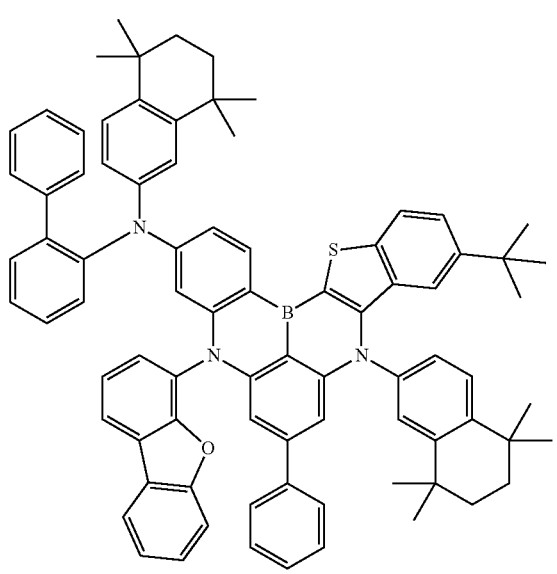

2-032
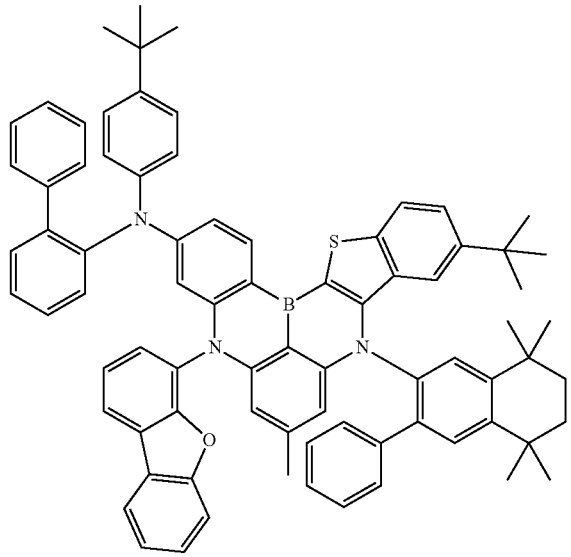
2-034
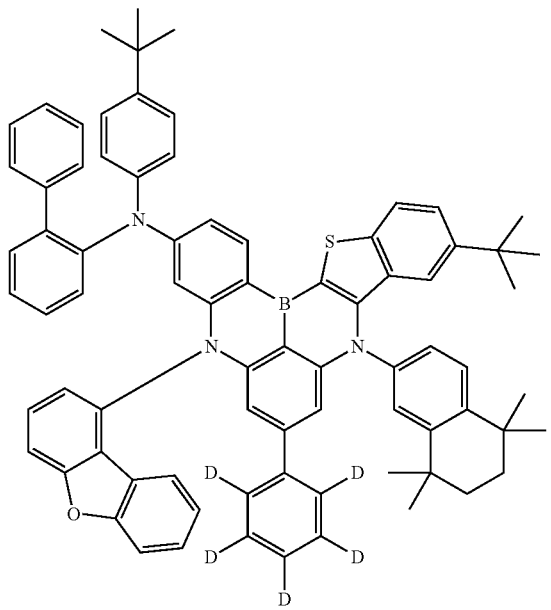
2-033
2-035

2-036
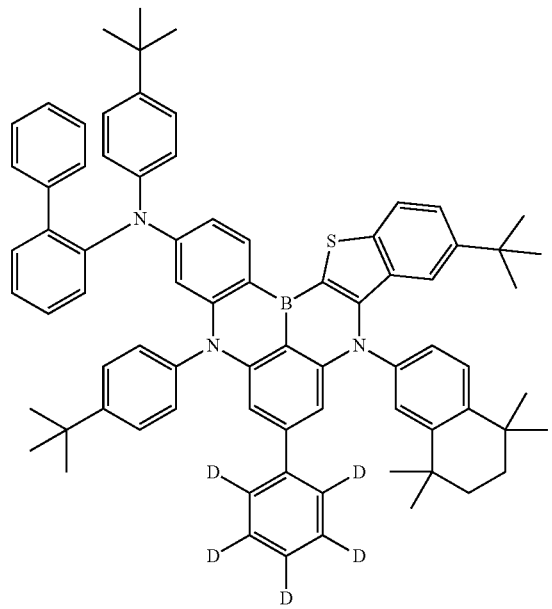
2-038
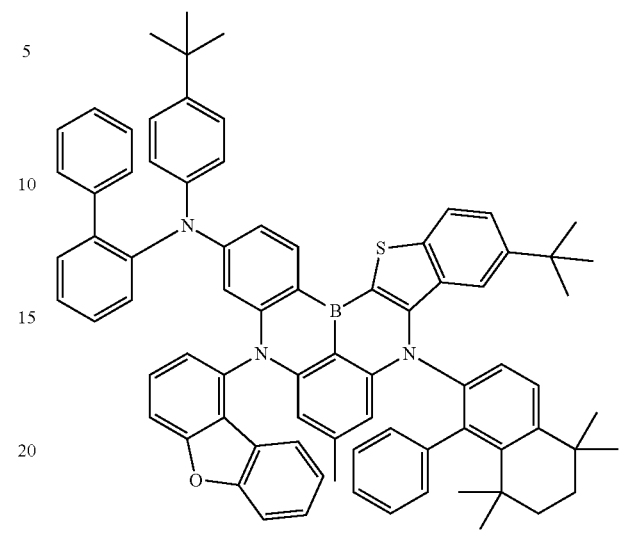
2-037
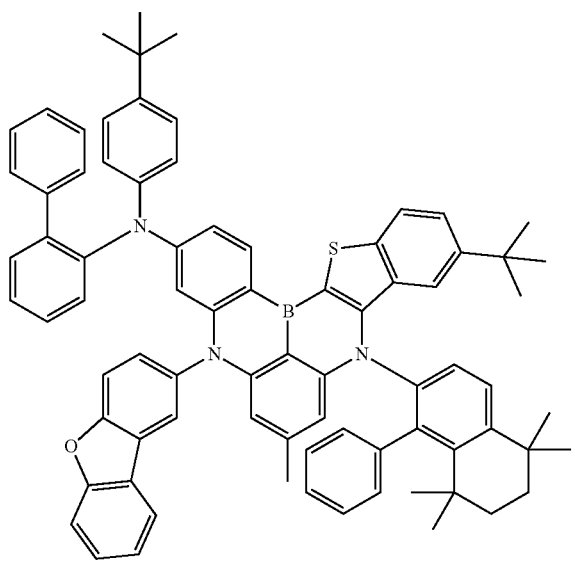
2-039
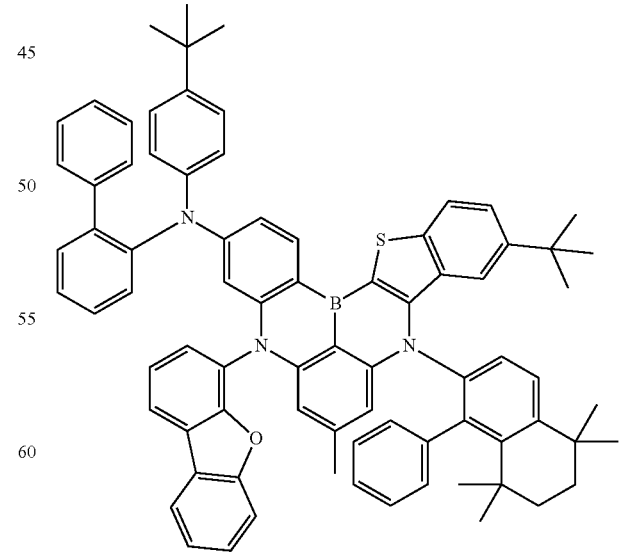

2-040
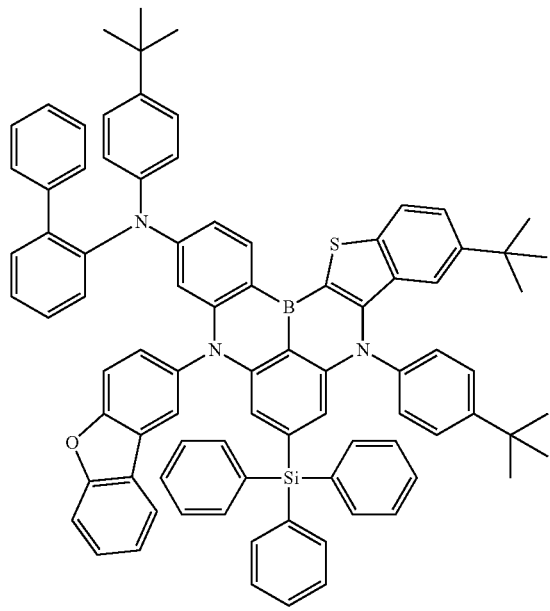
2-042
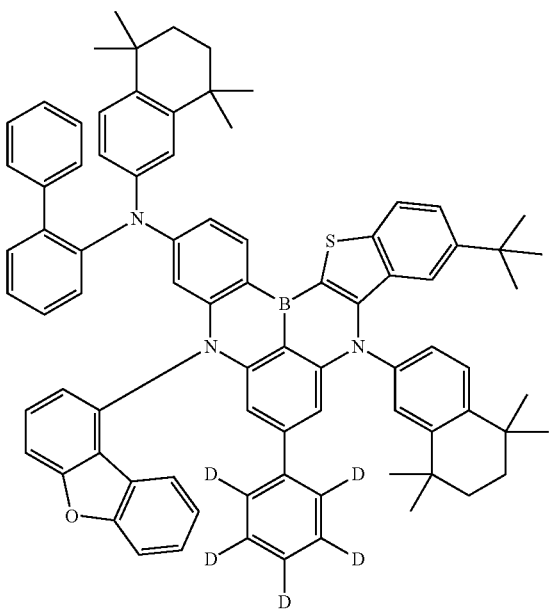
2-041
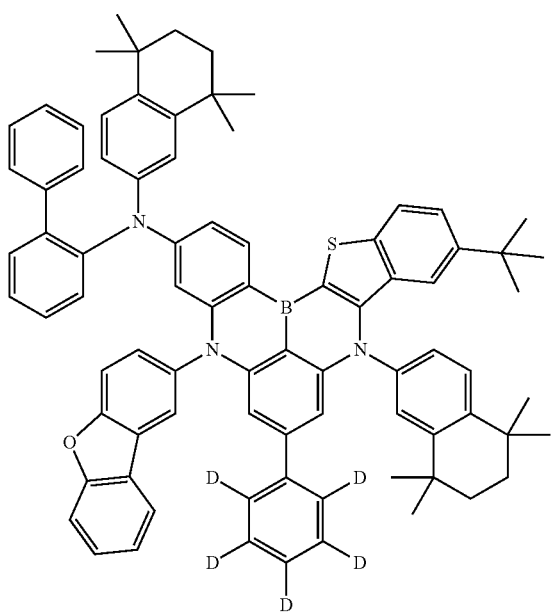
2-043
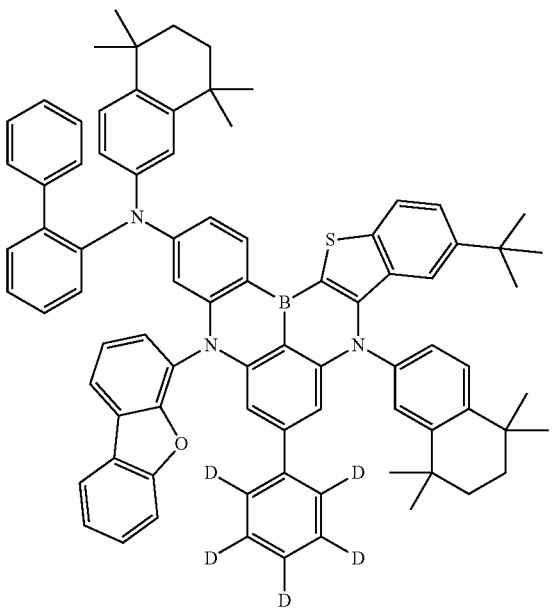

-continued

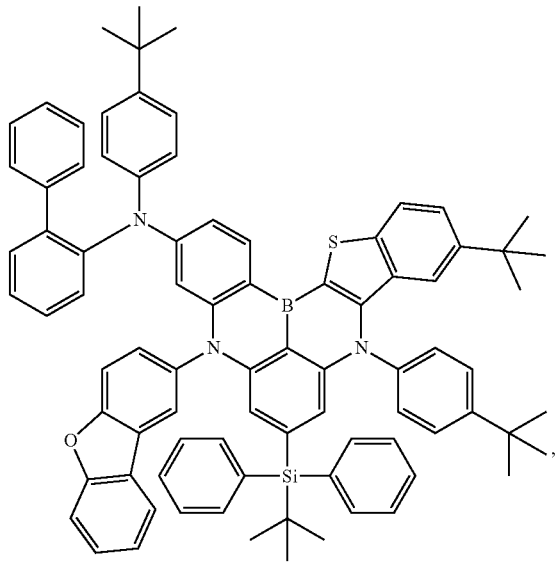
2-044 where D represents deuterium.

The organic electroluminescent device in the present disclosure may be used in an OLED lighting or display apparatus. Specially, the organic electroluminescent devices in the present disclosure may be used in the commercial field, e.g., in display screens of products and equipment such as point of sale (POS) machines, automated teller machines (ATMs), copying machines, automatic vending machines, game machines, gas stations, card punching machines, access control systems and electronic scales; in the communication field, e.g., in display screens of products such as mobile phones, various types of visual intercom systems (video telephones), mobile network terminals and electronic books (e-books); in the computer field, e.g., in display screens of home computers and/or commercial computers (such as personal computers (PCs) or workstations), personal digital assistants (PDAs) and laptop computers; in display screens of consumer electronic products such as decorative articles (flexible screens) and lamps, various types of audio equipment, moving picture experts group audio layer-3 (MP3) players, calculators, digital cameras, head-mounted displays, digital video cameras, portable digital video disks (DVDs), portable televisions (TVs), electronic timepieces, handheld game consoles and various household appliances (OLED TVs); in the transportation field, e.g., in display screens of a global position system (GPS), in-vehicle acoustic systems, vehicle-installed telephones and aircraft instruments and equipment, and other various indicative iconic display screens.

For example, the organic electroluminescent device provided in the present disclosure is used in smart phones, tablet computers, smart wearable devices, TVs, virtual reality (VR) devices, micro-display fields, automobile center control screens and automobile rear lamps.

The present disclosure further provides a preparation. The preparation includes the organic compound having a structure as shown in formula (I) above and at least one solvent. The are no special limits to the solvent. The solvent may be a solvent that is well known to a person skilled in the art. For example, the solvent may be an unsaturated hydrocarbon solvent such as toluene, xylene, mesitylene, tetraline, decahydronaphthalene, bicyclohexane, n-butylbenzene, sec-butylbenzene or tert-butylbenzene; or may be a halogenated saturated hydrocarbon solvent such as carbon tetrachloride, chloroform, dichloromethane, dichlorethane, chlorobutane, bromobutane, chloropentane, bromopentane, chlorohexane, bromohexane, chlorocyclohexane or bromocyclohexane; or may be an halogenated unsaturated hydrocarbon solvent such as chlorobenzene, dichlorobenzene or trichlorobenzene; or may be an ether solvent such as tetrahydrofuran or tetrahydropyra; or may be an ester-based solvent such as alkyl benzoate.

The organic electroluminescent device in the present disclosure may be used in an OLED lighting or display apparatus.

The present disclosure further provides a display or lighting apparatus. The apparatus includes one or more of the organic electroluminescent devices as described in any one of the embodiments above.

In summary, compared with the prior art, the present disclosure has the following beneficial effects:

for the organic compound in the present disclosure, by the combination of an anthracene ring and a specific substituent group, a structure of the organic compound has good hole and electron mobility and injection characteristics, and the stability of the compound may be improved; the boron-nitrogen compound provided in the present disclosure has excellent luminescence characteristics due to a narrow full width at half maximum; and when an organic light-emitting device is fabricated by using both the boron-nitrogen compound and the organic compound provided in the present disclosure as a light-emitting layer material, it may be possible to effectively enable the organic light-emitting device to have a relatively low driving voltage and maintain the stability of the voltage, the light-emitting efficiency may be improved, and the service life of the device can also be relatively long.

DETAILED DESCRIPTION OF THE EMBODIMENTS

Technical solutions of the present disclosure will be described clearly and completely by using embodiments below. However, the described embodiments are merely some but not all embodiments of the present disclosure. On the basis of the embodiments of the present disclosure, all other embodiments obtained by a person of ordinary skill in the art without making creative labour shall be included in the protection scope of the present disclosure.

An aryl group in the present disclosure refers to a generic term for monovalent groups remaining after removal of a hydrogen atom from a carbon atom of an aromatic nucleus of an aromatic molecule, and may be a monocyclic aryl group or a fused ring aryl group; and examples thereof may include a phenyl group, a biphenyl group, a naphthyl group, an anthryl group, a phenanthryl group, a pyrenyl group, etc., but are not limited thereto.

A heteroaryl group in the present disclosure refers to a generic term for groups obtained by replacing one or more carbon atoms of an aromatic nucleus of an aryl group by heteroatoms. A heteroatom includes but is not limited to an oxygen atom, a sulphur atom or a nitrogen atom. The heteroaryl group may be a monocyclic heteroaryl group or a fused ring heteroaryl group; and examples thereof may include a pyridyl group, a pyrrolyl group, a thienyl group, a furanyl group, an indolyl group, a quinolyl group, an isoquinolyl group, a benzothienyl group, a benzofuranyl group, a dibenzofuranyl group, a dibenzothienyl group, a carbazolyl group, etc., but not limited thereto.

Throughout the description, unless explicitly described to the contrary, the expression "including/comprising" any component are construed as implying the inclusion of other element(s), but not the exclusion of any other element. In addition, it will be understood that, throughout the description, when an element such as a layer, a film, a region or a substrate is described as being "on" or "above" another element, the element may be "directly on" the another element, or there may be intermediate element(s) between the element and the another element. Furthermore, the term "on" or "above" means being located on a side of a target portion, but does not necessarily mean being located above the target portion in a direction of gravity.

One object of the present disclosure is to provide an organic electroluminescent device. The organic electroluminescent device includes: a substrate, a first electrode on the substrate, an organic light-emitting functional layer on the first electrode, and a second electrode on the organic light-emitting functional layer. The organic light-emitting functional layer includes a light-emitting layer. The light-emitting layer includes an organic compound having an anthracene ring structure.

In an embodiment of the present disclosure, the light-emitting layer of the organic electroluminescent device (e.g., an organic light-emitting diode (OLED)) includes one or more of compounds as shown in the above general formula (I) as a host light-emitting material; and further includes one or more of compounds as shown in the above general formula (III) as a light-emitting dopant material.

In an embodiment of the present disclosure, an OLED is provided. The OLED includes a substrate, an anode, a cathode and an organic light-emitting functional layer. The organic light-emitting functional layer may include a light-emitting layer, a hole transport layer, a hole injection layer, an electron transport layer and an electron injection layer; or the organic light-emitting functional layer may include only the light-emitting layer and one or more of the other layers. The light-emitting layer includes one or more of the compounds as shown in the above general formula (I). In some examples, the light-emitting layer further includes one or more of the compounds as shown in the above general formula (III). Optionally, a cover layer, a protective layer and/or an encapsulation layer are further provided on the organic light-emitting functional layer.

The substrate in the present disclosure may be any substrate selected from substrates applied in typical organic light-emitting apparatuses. The substrate may be a glass substrate or a transparent plastic substrate, or may be a substrate of an opaque material such as silicon or stainless steel, or may be a flexible polyimide (PI) film. Different substrates are different in mechanical strength, thermal stability, transparency, surface smoothness and waterproofness; and depending on natures of the different substrates, the different substrates are used in different directions.

Materials of the hole injection layer, the hole transport layer and the electron injection layer may be any materials selected from known relevant materials used in OLED apparatuses.

As guest materials capable of generating blue fluorescence, green fluorescence and blue-green fluorescence, the materials not only need to have extremely high fluorescence quantum light-emitting efficiency, but also needs to have appropriate energy levels so as to effectively absorb excitation energy of host materials to emit light.

The specific explanation of the present disclosure is given in conjunction with specific embodiments below. Unless otherwise specified, all raw materials and solvents in synthetic embodiments may be purchased commercially, and the solvents are directly used without further processing.

EMBODIMENTS

Embodiment 1: Synthesis of Compound 1-031

Route of Synthesis

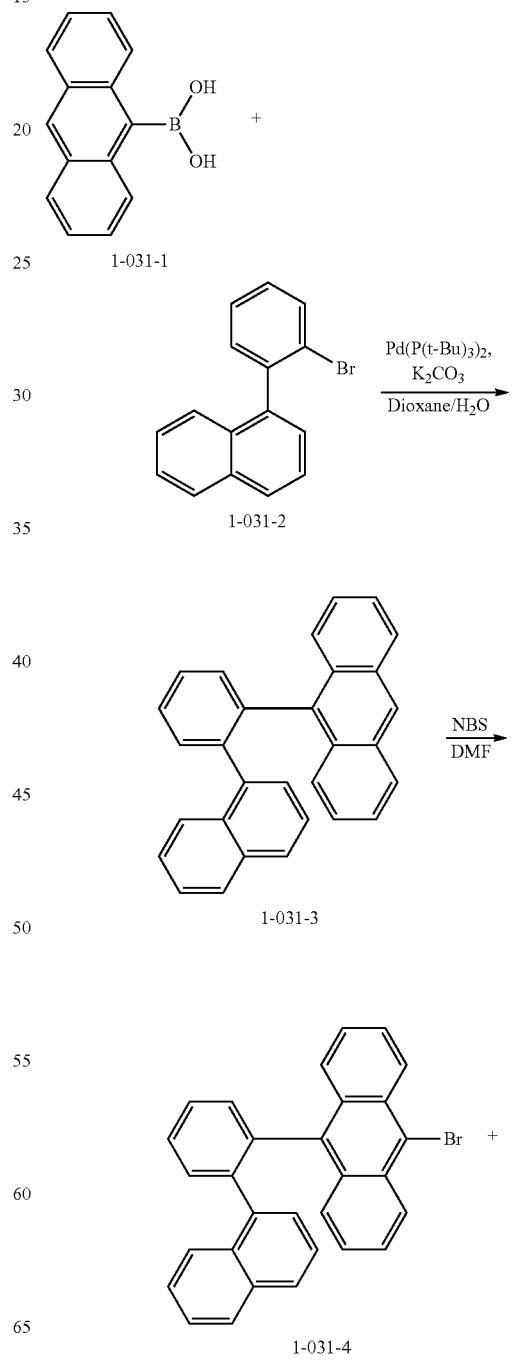

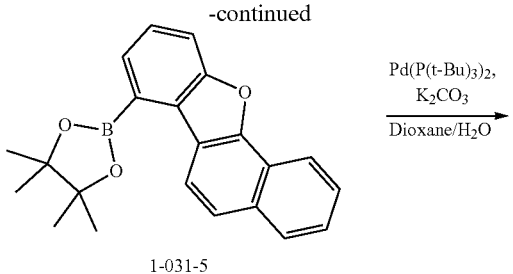

1-031-5

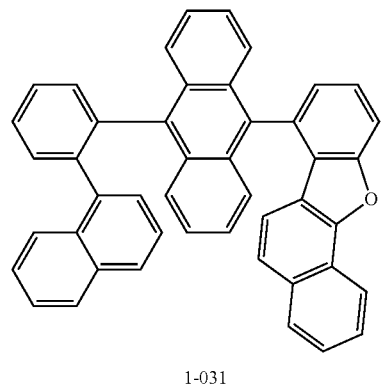

1-031

1) In a three-necked reaction flask, compound 1-031-1 (15 mmol) and compound 1-031-2 (15 mmol) are dissolved in 150 mL of 1,4-dioxane, and $K_2CO_3$ (20 mmol) which has been dissolved in 100 mL of $H_2O$ is added; then, $Pd(P(t-Bu)_3)_2$ (0.15 mmol) is added therein, and stirring is performed for 5 hours under a reflux condition in an argon atmosphere; after the reaction ends, a reaction solution in the three-necked reaction flask is cooled to room temperature; then the reaction solution is transferred to a separatory funnel, and extraction is performed with water and toluene to obtained an extract; the extract is dried by using $MgSO_4$; filtering and concentration are performed to obtained a sample; and finally chromatography purification is performed on the sample by using silica gel column to obtain an intermediate product 1-031-3.

2) In a double-necked reaction flask, the intermediate product 1-031-3 (10 mmol), N-bromosuccinimide (NBS) (12 mmol) and 100 mL of dimethylformamide (DMF) are added, and stirring is performed in an argon atmosphere at room temperature for 10 hours; after the reaction ends, a reaction solution in the double-necked reaction flask is transferred to a separatory funnel, and extraction is performed with water and ethyl acetate to obtain an extract; the extract is dried by using $MgSO_4$; filtering and concentration are performed to obtained a sample; and finally chromatography purification is performed on the sample by using silica gel column to obtain an intermediate product 1-031-4.

3) In a three-necked reaction flask, the intermediate product 1-031-4 (6 mmol), compound 1-031-5 (6 mmol) are dissolved in 150 mL of 1,4-dioxane, and $K_2CO_3$ (20 mmol) which has been dissolved in 100 mL of $H_2O$ is added; then, $Pd(P(t-Bu)_3)_2$ (0.06 mmol) is added therein, and stirring is performed for 5 hours under a reflux condition in an argon atmosphere; after the reaction ends, a reaction solution in the three-necked reaction flask is cooled to room temperature; then the reaction solution is transferred to a separatory funnel, and extraction is performed with water and toluene to obtained an extract; the extract is dried by using $MgSO_4$; filtering and concentration are performed to obtained a sample; and finally chromatography purification is performed on the sample by using silica gel column to obtain a target product 1-031. A structure of the target product 1-031 is tested. Through liquid chromatography-mass spectrometry (LC-MS) analysis, a following result of LC-MS (m/z) (M+) is obtained: a theoretical value being 596.21, and a tested value being 596.49.

Embodiment 2: Synthesis of Compound 1-003

With reference to the synthesis steps and reaction conditions of Embodiment 1, compound 1-003 is synthesized. Through LC-MS analysis, a following result of LC-MS (m/z) (M+) is obtained: a theoretical value being 496.18, and a tested value being 496.48.

Embodiment 3: Synthesis of Compound 1-004

With reference to the synthesis steps and reaction conditions of Embodiment 1, compound 1-004 is synthesized. Through LC-MS analysis, a following result of LC-MS (m/z) (M+) is obtained: a theoretical value being 546.20, and a tested value being 546.54.

Embodiment 4: Synthesis of Compound 1-005

With reference to the synthesis steps and reaction conditions of Embodiment 1, compound 1-005 is synthesized. Through LC-MS analysis, a following result of LC-MS (m/z) (M+) is obtained: a theoretical value being 470.17, and a tested value being 470.49.

Embodiment 5: Synthesis of Compound 1-019

With reference to the synthesis steps and reaction conditions of Embodiment 1, compound 1-019 is synthesized. Through LC-MS analysis, a following result of LC-MS (m/z) (M+) is obtained: a theoretical value being 520.18, and a tested value being 520.52.

Embodiment 6: Synthesis of Compound 1-022

With reference to the synthesis steps and reaction conditions of Embodiment 1, compound 1-022 is synthesized. Through LC-MS analysis, a following result of LC-MS (m/z) (M+) is obtained: a theoretical value being 596.21, and a tested value being 596.49.

Embodiment 7: Synthesis of Compound 1-025

With reference to the synthesis steps and reaction conditions of Embodiment 1, compound 1-025 is synthesized. Through LC-MS analysis, a following result of LC-MS (m/z) (M+) is obtained: a theoretical value being 646.23, and a tested value being 646.56.

Embodiment 8: Synthesis of Compound 1-032

With reference to the synthesis steps and reaction conditions of Embodiment 1, compound 1-032 is synthesized. Through LC-MS analysis, a following result of LC-MS (m/z) (M+) is obtained: a theoretical value being 570.20, and a tested value being 570.53.

Embodiment 9: Synthesis of Compound 1-036

With reference to the synthesis steps and reaction conditions of Embodiment 1, compound 1-036 is synthesized.

Through LC-MS analysis, a following result of LC-MS (m/z) (M+) is obtained: a theoretical value being 546.20, and a tested value being 546.48.

Embodiment 10: Synthesis of Compound 1-037

With reference to the synthesis steps and reaction conditions of Embodiment 1, compound 1-037 is synthesized. Through LC-MS analysis, a following result of LC-MS (m/z) (M+) is obtained: a theoretical value being 596.21, and a tested value being 596.54.

Embodiment 11: Synthesis of Compound 1-050

With reference to the synthesis steps and reaction conditions of Embodiment 1, compound 1-050 is synthesized. Through LC-MS analysis, a following result of LC-MS (m/z) (M+) is obtained: a theoretical value being 546.20, and a tested value being 546.55.

Embodiment 12: Synthesis of Compound 1-051

With reference to the synthesis steps and reaction conditions of Embodiment 1, compound 1-051 is synthesized. Through LC-MS analysis, a following result of LC-MS (m/z) (M+) is obtained: a theoretical value being 622.23, and a tested value being 622.64.

Embodiment 13: Synthesis of Compound 1-053

With reference to the synthesis steps and reaction conditions of Embodiment 1, compound 1-053 is synthesized. Through LC-MS analysis, a following result of LC-MS (m/z) (M+) is obtained: a theoretical value being 572.21, and a tested value being 572.51.

Embodiment 14: Synthesis of Compound 1-054

With reference to the synthesis steps and reaction conditions of Embodiment 1, compound 1-054 is synthesized. Through LC-MS analysis, a following result of LC-MS (m/z) (M+) is obtained: a theoretical value being 596.21, and a tested value being 596.61.

Embodiment 15: Synthesis of Compound 1-058

With reference to the synthesis steps and reaction conditions of Embodiment 1, compound 1-058 is synthesized. Through LC-MS analysis, a following result of LC-MS (m/z) (M+) is obtained: a theoretical value being 520.18, and a tested value being 520.53.

Embodiment 16: Synthesis of Compound 1-061

With reference to the synthesis steps and reaction conditions of Embodiment 1, compound 1-061 is synthesized. Through LC-MS analysis, a following result of LC-MS (m/z) (M+) is obtained: a theoretical value being 560.18, and a tested value being 560.62.

Embodiment 17: Synthesis of Compound 1-062

With reference to the synthesis steps and reaction conditions of Embodiment 1, compound 1-062 is synthesized. Through LC-MS analysis, a following result of LC-MS (m/z) (M+) is obtained: a theoretical value being 510.16, and a tested value being 510.45.

Embodiment 18: Synthesis of Compound 1-064

With reference to the synthesis steps and reaction conditions of Embodiment 1, compound 1-064 is synthesized. Through LC-MS analysis, a following result of LC-MS (m/z) (M+) is obtained: a theoretical value being 686.22, and a tested value being 686.63.

Embodiment 19: Synthesis of Compound 1-065

With reference to the synthesis steps and reaction conditions of Embodiment 1, compound 1-065 is synthesized. Through LC-MS analysis, a following result of LC-MS (m/z) (M+) is obtained: a theoretical value being 636.21, and a tested value being 636.56.

Embodiment 20: Synthesis of Compound 1-068

With reference to the synthesis steps and reaction conditions of Embodiment 1, compound 1-068 is synthesized. Through LC-MS analysis, a following result of LC-MS (m/z) (M+) is obtained: a theoretical value being 610.19, and a tested value being 610.48.

Embodiment 21: Synthesis of Compound 1-103

With reference to the synthesis steps and reaction conditions of Embodiment 1, compound 1-103 is synthesized. Through LC-MS analysis, a following result of LC-MS (m/z) (M+) is obtained: a theoretical value being 586.19, and a tested value being 586.47.

Embodiment 22: Synthesis of Compound 1-165

Route of Synthesis

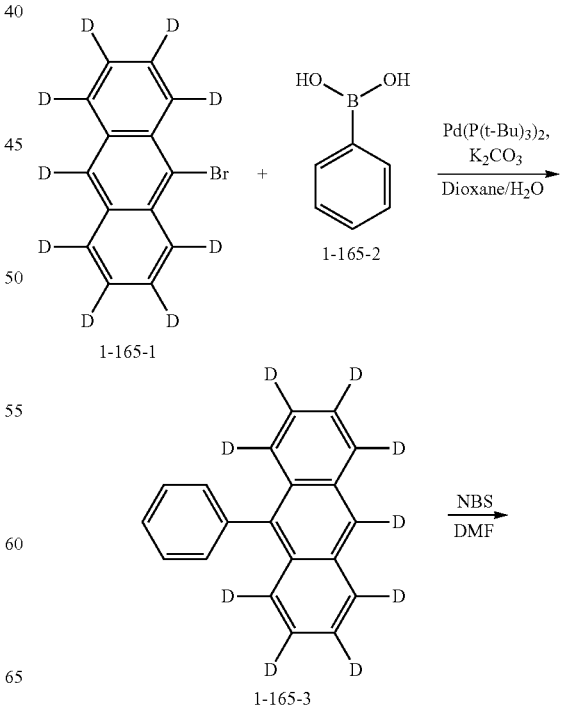

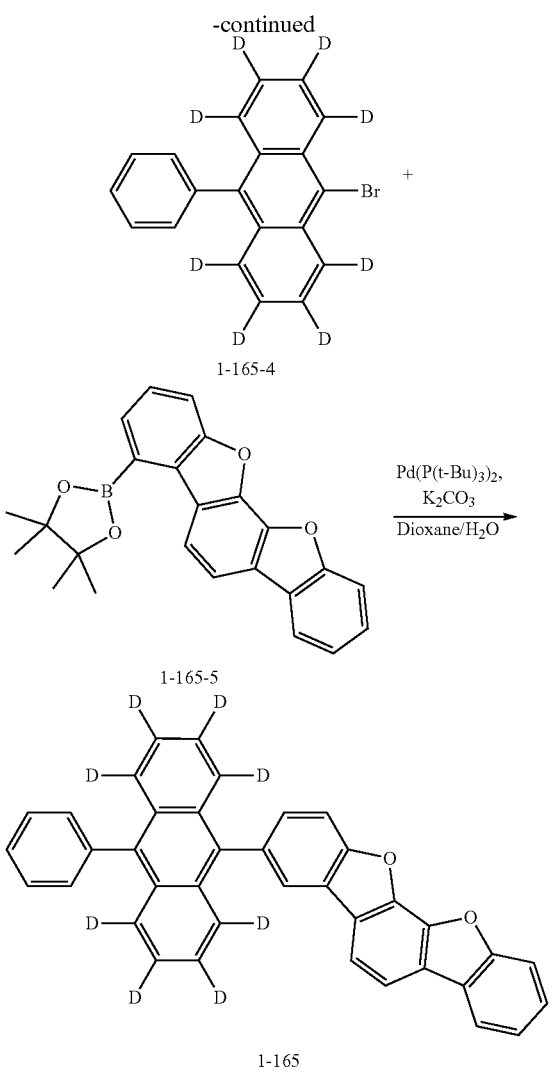

raphy purification is performed on the sample by using silica gel column to obtain an intermediate product 1-165-4.

3) In a three-necked reaction flask, the intermediate product 1-165-4 (6 mmol), compound 1-165-5 (6 mmol) are dissolved in 150 mL of 1,4-dioxane, and $K_2CO_3$ (20 mmol) which has been dissolved in 100 mL of H2O is added; then, $Pd(P(t-Bu)_3)_2$ (0.06 mmol) is added therein, and stirring is performed for 5 hours under a reflux condition in an argon atmosphere; after the reaction ends, a reaction solution in the three-necked reaction flask is cooled to room temperature; then, the reaction solution is transferred to a separatory funnel, and extraction is performed with water and toluene to obtained an extract; the extract is dried by using $MgSO_4$; filtering and concentration are performed to obtained a sample; and finally chromatography purification is performed on the sample by using silica gel column to obtain a target product 1-165. A structure of the target product 1-165 is tested. Through LC-MS analysis, a following result of LC-MS (m/z) (M+) is obtained: a theoretical value being 518.21, and a tested value being 518.53.

Embodiment 23: Synthesis of Compound 1-108

With reference to the synthesis steps and reaction conditions of Embodiment 22, compound 1-108 is synthesized. Through LC-MS analysis, a following result of LC-MS (m/z) (M+) is obtained: a theoretical value being 618.24, and a tested value being 618.57.

Embodiment 24: Synthesis of Compound 1-110

With reference to the synthesis steps and reaction conditions of Embodiment 22, compound 1-110 is synthesized. Through LC-MS analysis, a following result of LC-MS (m/z) (M+) is obtained: a theoretical value being 594.24, and a tested value being 594.61.

Embodiment 25: Synthesis of Compound 1-111

With reference to the synthesis steps and reaction conditions of Embodiment 22, compound 1-111 is synthesized. Through LC-MS analysis, a following result of LC-MS (m/z) (M+) is obtained: a theoretical value being 644.26, and a tested value being 644.57.

Embodiment 26: Synthesis of Compound 1-115

With reference to the synthesis steps and reaction conditions of Embodiment 22, compound 1-115 is synthesized. Through LC-MS analysis, a following result of LC-MS (m/z) (M+) is obtained: a theoretical value being 568.23, and a tested value being 568.58.

Embodiment 27: Synthesis of Compound 1-124

With reference to the synthesis steps and reaction conditions of Embodiment 22, compound 1-124 is synthesized. Through LC-MS analysis, a following result of LC-MS (m/z) (M+) is obtained: a theoretical value being 694.27, and a tested value being 694.64.

Embodiment 28: Synthesis of Compound 1-132

With reference to the synthesis steps and reaction conditions of Embodiment 22, compound 1-132 is synthesized.

1) In a three-necked reaction flask, compound 1-165-1 (15 mmol) and compound 1-165-2 (15 mmol) are dissolved in 150 mL of 1,4-dioxane, and $K_2CO_3$ (20 mmol) which has been dissolved in 100 mL of $H_2O$ is added; then, $Pd(P(t-Bu)_3)_2$ (0.15 mmol) is added therein, and stirring is performed for 5 hours under a reflux condition in an argon atmosphere; after the reaction ends, a reaction solution in the three-necked reaction flask is cooled to room temperature; then the reaction solution is transferred to a separatory funnel, and extraction is performed with water and toluene to obtained an extract; the extract is dried by using $MgSO_4$; filtering and concentration are performed to obtained a sample; and finally chromatography purification is performed on the sample by using silica gel column to obtain an intermediate product 1-165-3.

2) In a double-necked reaction flask, the intermediate product 1-165-3 (10 mmol), N-bromosuccinimide (NBS) (12 mmol) and 100 mL of dimethylformamide (DMF) are added, and stirring is performed in an argon atmosphere at room temperature for 10 hours; after the reaction ends, a reaction solution in the double-necked reaction flask is transferred to a separatory funnel, and extraction is performed with water and ethyl acetate to obtain an extract; the extract is dried by using $MgSO_4$; filtering and concentration are performed to obtained a sample; and finally chromatog- Through LC-MS analysis, a following result of LC-MS (m/z) (M+) is obtained: a theoretical value being 654.28, and a tested value being 654.65.

Embodiment 29: Synthesis of Compound 1-137

With reference to the synthesis steps and reaction conditions of Embodiment 22, compound 1-137 is synthesized. Through LC-MS analysis, a following result of LC-MS (m/z) (M+) is obtained: a theoretical value being 604.26, and a tested value being 604.66.

Embodiment 30: Synthesis of Compound 1-139

With reference to the synthesis steps and reaction conditions of Embodiment 22, compound 1-139 is synthesized. Through LC-MS analysis, a following result of LC-MS (m/z) (M+) is obtained: a theoretical value being 578.25, and a tested value being 578.58.

Embodiment 31: Synthesis of Compound 1-140

With reference to the synthesis steps and reaction conditions of Embodiment 22, compound 1-140 is synthesized. Through LC-MS analysis, a following result of LC-MS (m/z) (M+) is obtained: a theoretical value being 554.25, and a tested value being 554.62.

Embodiment 32: Synthesis of Compound 1-151

With reference to the synthesis steps and reaction conditions of Embodiment 22, compound 1-151 is synthesized. Through LC-MS analysis, a following result of LC-MS (m/z) (M+) is obtained: a theoretical value being 528.23, and a tested value being 528.63.

Embodiment 33: Synthesis of Compound 1-171

With reference to the synthesis steps and reaction conditions of Embodiment 22, compound 1-171 is synthesized. Through LC-MS analysis, a following result of LC-MS (m/z) (M+) is obtained: a theoretical value being 478.22, and a tested value being 478.52.

Embodiment 34: Synthesis of Compound 1-173

With reference to the synthesis steps and reaction conditions of Embodiment 22, compound 1-173 is synthesized. Through LC-MS analysis, a following result of LC-MS (m/z) (M+) is obtained: a theoretical value being 475.20, and a tested value being 475.48.

Embodiment 35: Synthesis of Compound 1-174

With reference to the synthesis steps and reaction conditions of Embodiment 22, compound 1-174 is synthesized. Through LC-MS analysis, a following result of LC-MS (m/z) (M+) is obtained: a theoretical value being 505.24, and a tested value being 505.58.

Embodiment 36: Synthesis of Compound 2-009

Route of Synthesis

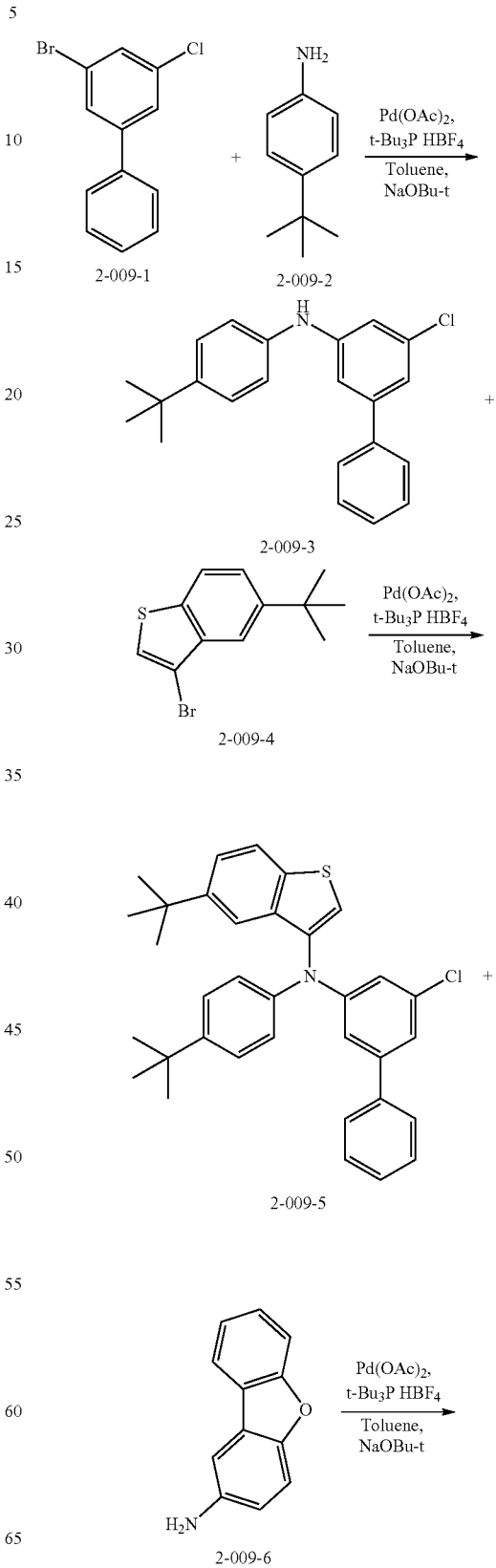

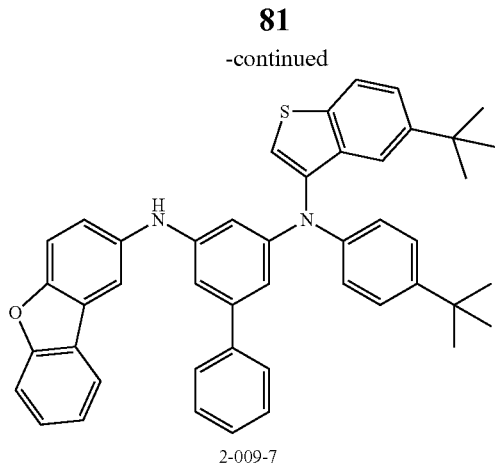

2-009-7

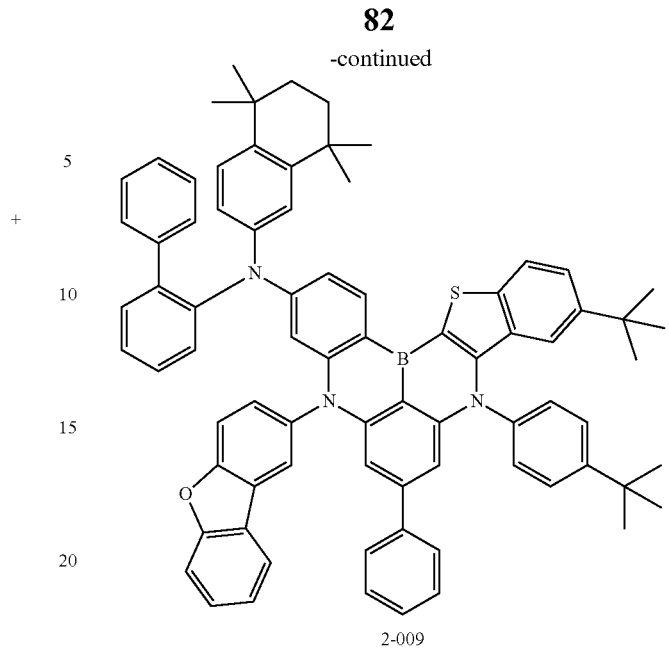

2-009

1) Compound 2-009-1 (1 mmol) and compound 2-009-2 (1 mmol) are dissolved in 50 mL of toluene; in a nitrogen atmosphere, sodium tert-butoxide (NaOBu-t) (2 mmol), palladium acetate (Pd(OAc) 2) (0.05 mmol) and tri-tert-butylphosphine tetrafluoroborate (t-Bu3P HBF4) (0.5 mmol) are added; refluxing is perform for 72 hours, and then such a reaction system is cooled to room temperature; a solvent of the reaction system is removed through rotary evaporation; extraction is performed on the residue with 100 mL of dichloromethane, and this step is repeated three times to obtain an organic phase; the organic phase is washed with water, and then is dried with sodium sulfate; and a solvent is removed through reduced pressure distillation to obtain a crude product, and the crude product is separated and purified by means of silica gel chromatography column, where an eluent used therein is a mixture of dichloromethane and petroleum ether, and a volume ratio of dichloromethane to petroleum ether is 1:4. Thus, an intermediate product 2-009-3 is obtained.

2) The intermediate product 2-009-3 (1 mmol) and compound 2-009-4 (1 mmol) are dissolved in 50 mL of toluene; in a nitrogen atmosphere, sodium tert-butoxide (2 mmol), palladium acetate (0.05 mmol) and tri-tert-butylphosphine tetrafluoroborate (0.5 mmol) are added; refluxing is perform for 72 hours, and then such a reaction system is cooled to room temperature; a solvent of the reaction system is removed through rotary evaporation; extraction is performed on the residue with 100 mL of dichloromethane, and this step is repeated three times to obtain an organic phase; the organic phase is washed with water, and then is dried with sodium sulfate; and a solvent is removed through reduced pressure distillation to obtain a crude product, and the crude product is separated and purified by means of silica gel chromatography column, where an eluent used therein is a mixture of dichloromethane and petroleum ether, and a volume ratio of dichloromethane to petroleum ether is 1:4. Thus, an intermediate product 2-009-5 is obtained.

3) The intermediate product 2-009-5 (1 mmol) and compound 2-009-6 (1 mmol) are dissolved in 50 mL of toluene; in a nitrogen atmosphere, sodium tert-butoxide (2 mmol), palladium acetate (0.05 mmol) and tri-tert-butylphosphine tetrafluoroborate (0.5 mmol) are added; refluxing is perform

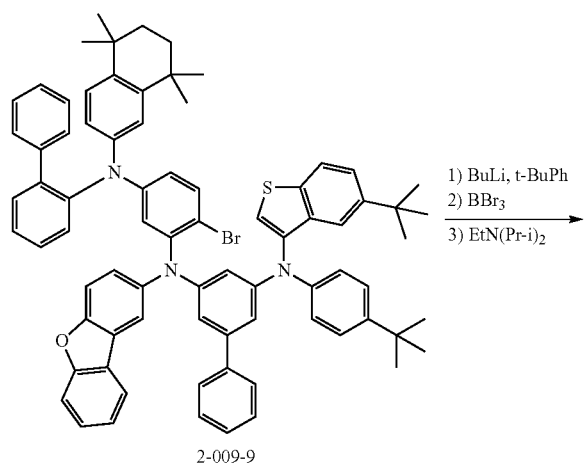

2-009-9 for 72 hours, and then such a reaction system is cooled to room temperature; a solvent of the reaction system is removed through rotary evaporation; extraction is performed on the residue with 100 mL of dichloromethane, and this step is repeated three times to obtain an organic phase; the organic phase is washed with water, and then is dried with sodium sulfate; and a solvent is removed through reduced pressure distillation to obtain a crude product, and the crude product is separated and purified by means of silica gel chromatography column, where an eluent used therein is a mixture of dichloromethane and petroleum ether, and a volume ratio of dichloromethane to petroleum ether is 1:4. Thus, an intermediate product 2-009-7 is obtained.

4) The intermediate product 2-009-7 (1 mmol) and compound 2-009-8 (1 mmol) are dissolved in 50 mL of toluene. in a nitrogen atmosphere, sodium tert-butoxide (2 mmol), palladium acetate (0.05 mmol) and tri-tert-butylphosphine tetrafluoroborate (0.5 mmol) are added; refluxing is perform for 72 hours, and then such a reaction system is cooled to room temperature; a solvent of the reaction system is removed through rotary evaporation; extraction is performed on the residue with 100 mL of dichloromethane, and this step is repeated three times to obtain an organic phase; the organic phase is washed with water, and then is dried with sodium sulfate; a solvent is removed through reduced pressure distillation to obtain a crude product, and the crude product is separated and purified by means of silica gel chromatography column, where an eluent used therein is a mixture of dichloromethane and petroleum ether, and a volume ratio of dichloromethane to petroleum ether is 1:4. Thus, an intermediate product 2-009-9 is obtained.

5) The intermediate product 2-009-9 (1 mmol) is dissolved in 60 mL of anhydrous tert-butylbenzene (t-BuPh); such a reaction system is cooled to −78° C., and n-butyl lithium (BuLi) (1 mL, 2 mmol, 2 M in hexane) is slowly added; reaction is performed for 4 hours at −78° C., and then $BBr_3$ (250.5 mg, 1 mmol) is slowly added; reaction is performed for 1 hour at −50° C., the reaction system is warmed up to room temperature; then, N,N-diisopropylethylamine ($EtN(Pr-i)_2$) (387 mg, 3 mmol) is added, and the reaction system is heated to 120° C. for 12 hours; after the reaction is complete, the reaction system is cooled to room temperature, and 5 mL of aqueous sodium acetate solution (1 M) is added; a solvent is removed through rotary evaporation; extraction is performed on the residue with 100 mL of dichloromethane, and this step is repeated three times to obtain an organic phase; the organic phase is washed with water, and then is dried with sodium sulfate; and a solvent is removed through reduced pressure distillation to obtain a crude product, and the crude product is separated and purified by means of silica gel chromatography column, where an eluent used therein is a mixture of dichloromethane and petroleum ether, and a volume ratio of dichloromethane to petroleum ether is 1:8. Thus, a target product 2-009 is obtained. A structure of the target product 2-009 is tested. Through LC-MS analysis, a following result of LC-MS (m/z) (M+) is obtained: a theoretical value being 1107.53, and a tested value being 1107.97.

Embodiment 37: Synthesis of Compound 2-001

With reference to the synthesis steps and reaction conditions of Embodiment 36, compound 2-001 is synthesized. Through LC-MS analysis, a following result of LC-MS (m/z) (M+) is obtained: a theoretical value being 686.22, and a tested value being 686.63.

Embodiment 38: Synthesis of Compound 2-004

With reference to the synthesis steps and reaction conditions of Embodiment 36, compound 2-004 is synthesized. Through LC-MS analysis, a following result of LC-MS (m/z) (M+) is obtained: a theoretical value being 686.22, and a tested value being 686.63.

Embodiment 39: Synthesis of Compound 2-005

With reference to the synthesis steps and reaction conditions of Embodiment 36, compound 2-005 is synthesized. Through LC-MS analysis, a following result of LC-MS (m/z) (M+) is obtained: a theoretical value being 686.22, and a tested value being 686.63.

Embodiment 40: Synthesis of Compound 2-008

With reference to the synthesis steps and reaction conditions of Embodiment 36, compound 2-008 is synthesized. Through LC-MS analysis, a following result of LC-MS (m/z) (M+) is obtained: a theoretical value being 686.22, and a tested value being 686.63.

Embodiment 41: Synthesis of Compound 2-012

With reference to the synthesis steps and reaction conditions of Embodiment 36, compound 2-012 is synthesized. Through LC-MS analysis, a following result of LC-MS (m/z) (M+) is obtained: a theoretical value being 1125.52, and a tested value being 1125.86.

Embodiment 42: Synthesis of Compound 2-013

With reference to the synthesis steps and reaction conditions of Embodiment 36, compound 2-013 is synthesized. Through LC-MS analysis, a following result of LC-MS (m/z) (M+) is obtained: a theoretical value being 1058.52, and a tested value being 1058.86.

Embodiment 43: Synthesis of Compound 2-016

With reference to the synthesis steps and reaction conditions of Embodiment 36, compound 2-016 is synthesized. Through LC-MS analysis, a following result of LC-MS (m/z) (M+) is obtained: a theoretical value being 1024.57, and a tested value being 1024.93.

Embodiment 44: Synthesis of Compound 2-017

With reference to the synthesis steps and reaction conditions of Embodiment 36, compound 2-017 is synthesized. Through LC-MS analysis, a following result of LC-MS (m/z) (M+) is obtained: a theoretical value being 1024.57, and a tested value being 1024.93.

Embodiment 45: Synthesis of Compound 2-020

With reference to the synthesis steps and reaction conditions of Embodiment 36, compound 2-020 is synthesized. Through LC-MS analysis, a following result of LC-MS (m/z) (M+) is obtained: a theoretical value being 1201.59, and a tested value being 1201.87.

Embodiment 46: Synthesis of Compound 2-021

With reference to the synthesis steps and reaction conditions of Embodiment 36, compound 2-021 is synthesized.

Through LC-MS analysis, a following result of LC-MS (m/z) (M+) is obtained: a theoretical value being 1201.59, and a tested value being 1201.87.

Embodiment 47: Synthesis of Compound 2-025

With reference to the synthesis steps and reaction conditions of Embodiment 36, compound 2-025 is synthesized. Through LC-MS analysis, a following result of LC-MS (m/z) (M+) is obtained: a theoretical value being 1201.59, and a tested value being 1201.87.

Embodiment 48: Synthesis of Compound 2-029

With reference to the synthesis steps and reaction conditions of Embodiment 36, compound 2-029 is synthesized. Through LC-MS analysis, a following result of LC-MS (m/z) (M+) is obtained: a theoretical value being 1201.59, and a tested value being 1201.87.

Embodiment 49: Synthesis of Compound 2-036

Route of Synthesis

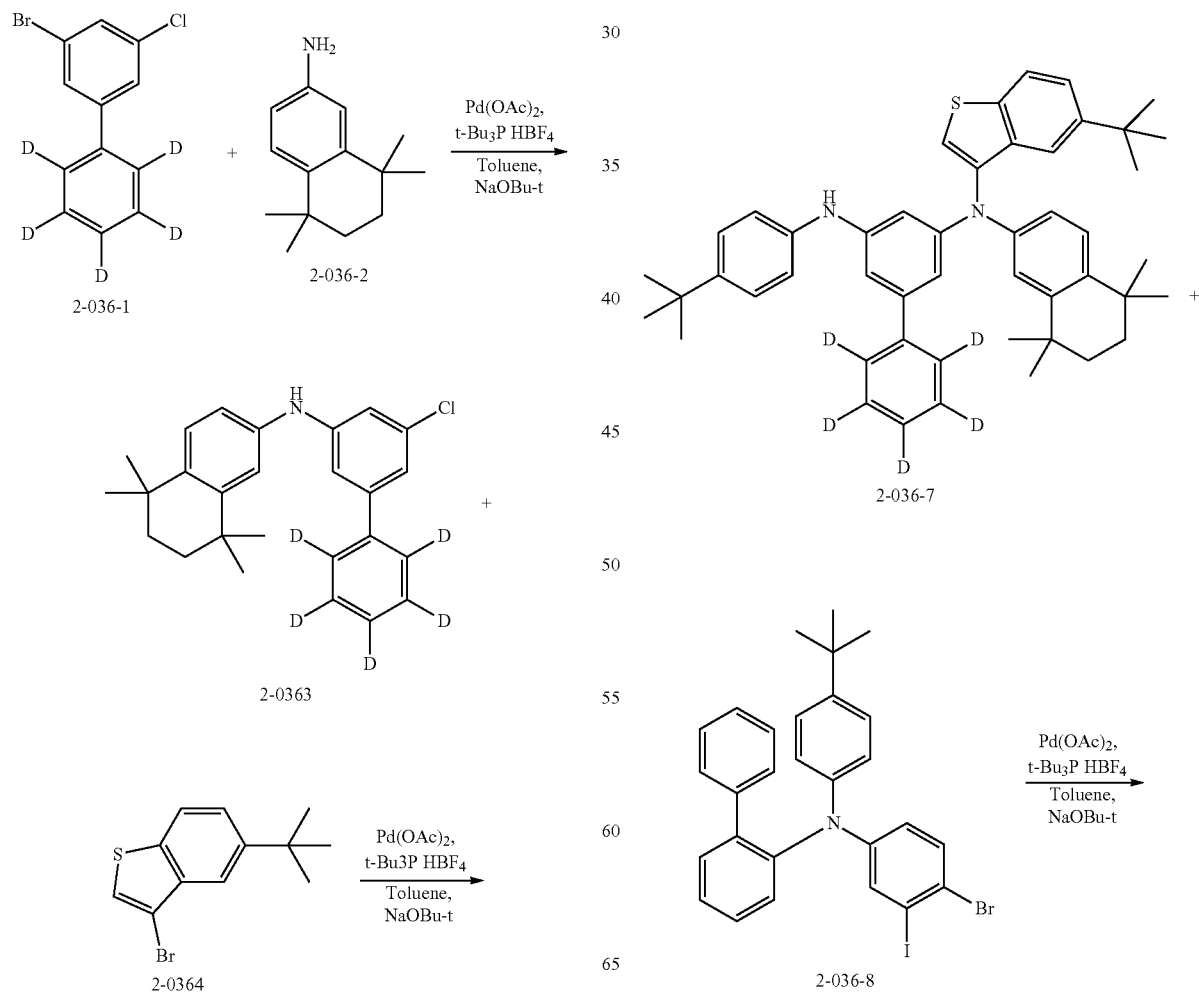

-continued

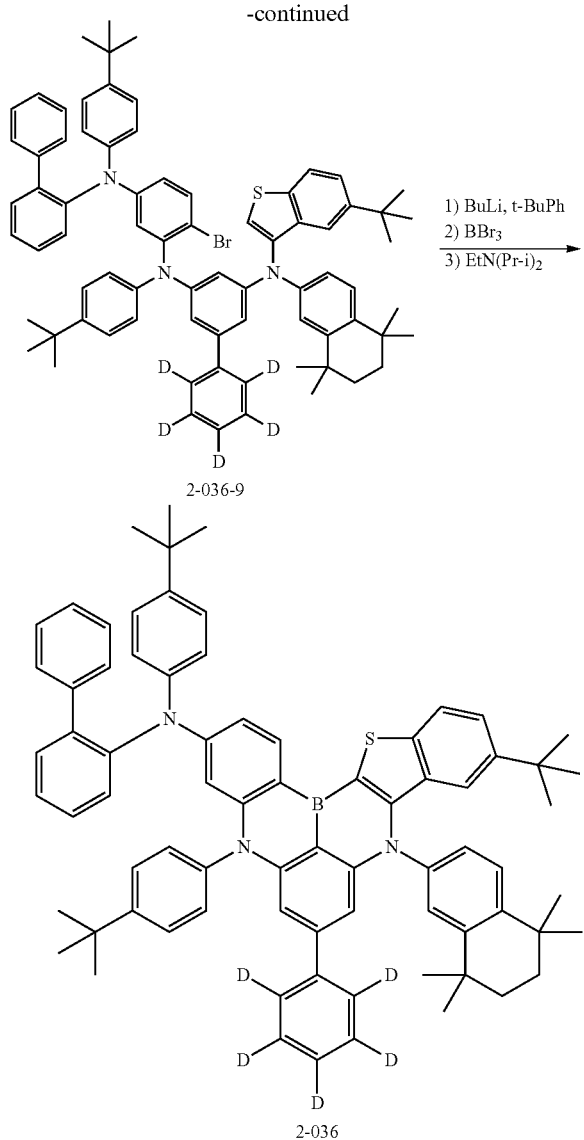

2-036-9

2-036

1) BuLi, t-BuPh
2) BBr₃
3) EtN(Pr-i)₂

1) Compound 2-036-1 (1 mmol) and compound 2-036-2 (1 mmol) are dissolved in 50 mL of toluene; in a nitrogen atmosphere, sodium tert-butoxide (2 mmol), palladium acetate (0.05 mmol) and tri-tert-butylphosphine tetrafluoroborate (0.5 mmol) are added; refluxing is perform for 72 hours, and then such a reaction system is cooled to room temperature; a solvent of the rection system is removed through rotary evaporation; extraction is performed on the residue with 100 mL of dichloromethane, and this step is repeated three times to obtain an organic phase; the organic phase is washed with water, and then is dried with sodium sulfate; and a solvent is removed through reduced pressure distillation to obtain a crude product, and the crude product is separated and purified by means of silica gel chromatography column, where an eluent used therein is a mixture of dichloromethane and petroleum ether, and a volume ratio of dichloromethane to petroleum ether is 1:4. Thus, an intermediate product 2-036-3 is obtained.

2) The intermediate product 2-036-3 (1 mmol) and compound 2-036-4 (1 mmol) are dissolved in 50 mL of toluene; in a nitrogen atmosphere, sodium tert-butoxide (2 mmol), palladium acetate (0.05 mmol) and tri-tert-butylphosphine tetrafluoroborate (0.5 mmol) are added; refluxing is perform for 72 hours, and then such a reaction system is cooled to room temperature; a solvent of the reaction system is removed through rotary evaporation; extraction is performed on the residue with 100 mL of dichloromethane, and this step is repeated three times to obtain an organic phase; the organic phase is washed with water, and then is dried with sodium sulfate; and a solvent is removed through reduced pressure distillation to obtain a crude product, and the crude product is separated and purified by means of silica gel chromatography column, where an eluent used therein is a mixture of dichloromethane and petroleum ether, and a volume ratio of dichloromethane to petroleum ether is 1:4. Thus, an intermediate product 2-036-5 is obtained.

3) The intermediate product 2-036-5 (1 mmol) and compound 2-036-6 (1 mmol) are dissolved in 50 mL of toluene; in a nitrogen atmosphere, sodium tert-butoxide (2 mmol), palladium acetate (0.05 mmol) and tri-tert-butylphosphine tetrafluoroborate (0.5 mmol) are added; refluxing is perform for 72 hours, and then such a reaction system is cooled to room temperature; a solvent of the reaction system is removed through rotary evaporation; extraction is performed on the residue with 100 ml of dichloromethane, and this step is repeated three times to obtain an organic phase; the organic phase is washed with water, and then is dried with sodium sulfate; and a solvent is removed through reduced pressure distillation to obtain a crude product, and the crude product is separated and purified by means of silica gel chromatography column, where an eluent used therein is a mixture of dichloromethane and petroleum ether, and a volume ratio of dichloromethane to petroleum ether is 1:4. Thus, an intermediate product 2-036-7 is obtained.

4) The intermediate product 2-036-7 (1 mmol) and compound 2-036-8 (1 mmol) are dissolved in 50 mL of toluene. in a nitrogen atmosphere, sodium tert-butoxide (2 mmol), palladium acetate (0.05 mmol) and tri-tert-butylphosphine tetrafluoroborate (0.5 mmol) are added; refluxing is perform for 72 hours, and then such a reaction system is cooled to room temperature; a solvent of the reaction system is removed through rotary evaporation; extraction is performed on the residue with 100 mL of dichloromethane, and this step is repeated three times to obtain an organic phase; the organic phase is washed with water, and then is dried with sodium sulfate; and a solvent is removed through reduced pressure distillation to obtain a crude product, and the crude product is separated and purified by means of silica gel chromatography column, where an eluent used therein is a mixture of dichloromethane and petroleum ether, and a volume ratio of dichloromethane to petroleum ether is 1:4. Thus, an intermediate product 2-036-9 is obtained.

5) The intermediate product 2-036-9 (1 mmol) is dissolved in 60 mL of anhydrous tert-butylbenzene; such a reaction system is cooled to −78° C., and n-butyl lithium (BuLi) (1 mL, 2 mmol, 2 M in hexane) is slowly added; reaction is performed for 4 hours at −78° C., and then BBr₃ (250.5 mg, 1 mmol) is slowly added; reaction is performed for 1 hour at −50° C., the reaction system is warmed up to room temperature; then N,N-diisopropylethylamine (EtN(Pr-i)₂) (387 mg, 3 mmol) is added, and then the reaction system is heated to 120° C. for 12 hours; after the reaction is complete, the reaction system is cooled to room temperature, and 5 mL of aqueous sodium acetate solution (1 M) is added; a solvent is removed through rotary evaporation; extraction is performed on the residue with 100 mL of dichloromethane, and this step is repeated three times to obtain an organic phase; the organic phase is washed with water, and then is dried with sodium sulfate; and a solvent is removed through reduced pressure distillation to obtain a crude product, and the crude product is separated and purified by means of silica gel chromatography column, where an eluent used therein is a mixture of dichloromethane and petroleum ether, and a volume ratio of dichloromethane to petroleum ether is 1:8. Thus, a target product 2-036 is obtained. A structure of the target product 2-036 is tested. Through LC-MS analysis, a following result of LC-MS (m/z) (M+) is obtained: a theoretical value being 1078.62, and a tested value being 1078.98.

Embodiment 50: Synthesis of Compound 2-033

With reference to the synthesis steps and reaction conditions of Embodiment 49, compound 2-033 is synthesized. Through LC-MS analysis, a following result of LC-MS (m/z) (M+) is obtained: a theoretical value being 1112.56, and a tested value being 1112.92.

Embodiment 51: Synthesis of Compound 2-038

With reference to the synthesis steps and reaction conditions of Embodiment 49, compound 2-038 is synthesized. Through LC-MS analysis, a following result of LC-MS (m/z) (M+) is obtained: a theoretical value being 1121.55, and a tested value being 1121.89.

Embodiment 52: Synthesis of Compound 2-040

With reference to the synthesis steps and reaction conditions of Embodiment 49, compound 2-040 is synthesized. Through LC-MS analysis, a following result of LC-MS (m/z) (M+) is obtained: a theoretical value being 1235.54, and a tested value being 1235.87.

Embodiment 53: Synthesis of Compound 2-042

With reference to the synthesis steps and reaction conditions of Embodiment 49, compound 2-042 is synthesized. Through LC-MS analysis, a following result of LC-MS (m/z) (M+) is obtained: a theoretical value being 1166.61, and a tested value being 1166.97.

Embodiment 54: Synthesis of Compound 2-044

With reference to the synthesis steps and reaction conditions of Embodiment 49, compound 2-044 is synthesized. Through LC-MS analysis, a following result of LC-MS (m/z) (M+) is obtained: a theoretical value being 1215.57, and a tested value being 1215.93.

Application examples, in which several of the organic compounds described in the present disclosure are applied in OLED devices, are listed below, so as to further illustrate the beneficial effects of the compounds in the present disclosure. Materials used in the examples are purchased commercially or synthesized in-house.

Fabrication of OLED Devices

As a reference fabrication method for device embodiments of, in the present disclosure, 50-500 nm of indium tin oxide/Ag/indium tin oxide (ITO/Ag/ITO) is evaporated on an alkali-free glass substrate to serve as an anode; a hole injection layer (5-20 nm), a hole transport layer (50-120 nm), a light-emitting auxiliary layer (5-120 nm), a light-emitting layer (20-50 nm), an electron transport layer (20-80 nm) and an electron injection layer (1-10 nm) are evaporated on the anode; Mg and Ag (a weight ratio of 10:1, 10-50 nm) are co-evaporated to form a semi-transparent cathode; then, a cover layer compound is evaporated; and finally, such a light-emitting device is encapsulated in a nitrogen atmosphere by using an epoxy resin adhesive.

In a specific embodiment, a fabrication method for an OLED device provided in the present disclosure is as follows: an alkali-free glass substrate is first washed with isopropanol by using an ultrasonic cleaning instrument for 15 minutes, and then ultraviolet (UV) ozone washing treatment is performed in air for 30 minutes; on the treated substrate, 100 nm of ITO/Ag/ITO is evaporated by using a vacuum evaporation method to form an anode; on the anode, a hole injection layer (made of compound HT and compound PD, a ratio of a film thickness of compound HT to a film thickness of compound PD being 2:100, 10 nm), a hole transport layer (made of N,N'-diphenyl-N,N'-bis(1-naphthyl)-(1,1'-biphenyl)-4,4'-diamine (NPB), 30 nm), a light-emitting auxiliary layer (made of compound BP, 5 nm), a blue light-emitting layer (respectively using compound 1-031 and compound 2-009 as a host material and a dopant material, a weight ratio of host material to the dopant material (i.e., a weight ratio of compound 1-031 to compound 2-009) being 97:3, 30 nm), an electron transport layer (made of compound ET and compound Liq, a weight ratio of compound ET to compound Liq being 1:1, 30 nm), an electron injection layer (made of LiF, 1 nm) are sequentially evaporated in a stacked manner; Mg and Ag (with a weight ratio of 10:1, 15 nm) are co-evaporated to form a semi-transparent cathode; then, compound CPL (65 nm) is evaporated to form a cover layer; and finally, such a light-emitting device is encapsulated in a nitrogen atmosphere by using an epoxy resin adhesive. This embodiment is recorded as Application Example 1. Molecular structure formulas of the relevant materials are as follows:

HT

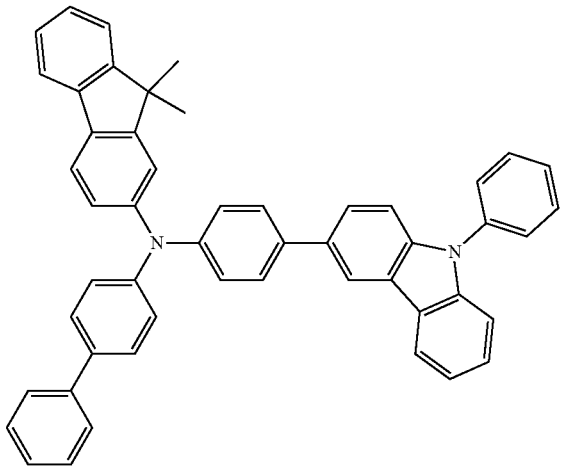

CPL

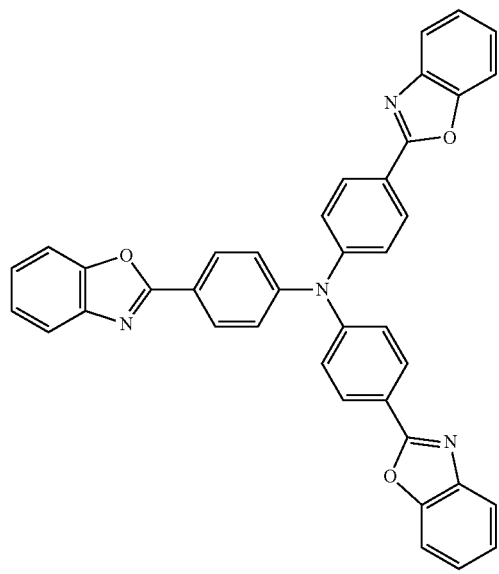

ET

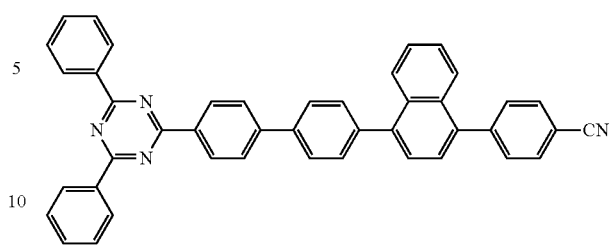

OLED devices in Application Examples 2 to 35 and Comparison Example 1 are each fabricated with reference to the method provided in Application Example 1, the only difference lies in that, respective compounds as listed in Table 1 replace compound 1-003 in Application Example 1 to serve as host materials in Application Examples 2 to 35 and Comparison Example 1. A structure of compound BH-002 in Comparison Example 1 is as follows:

PD

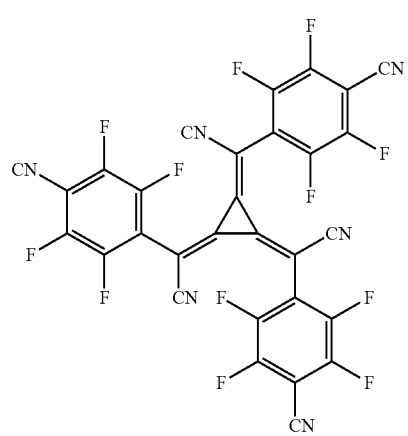

BH002

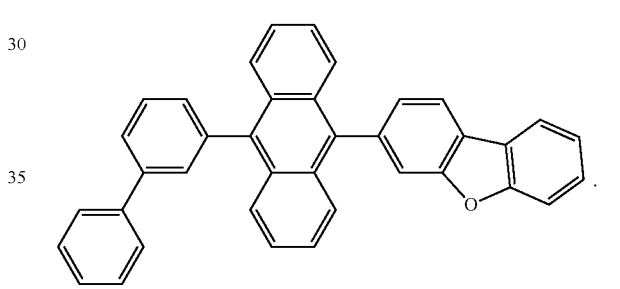

Liq

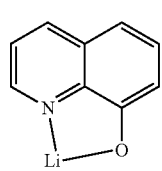

BP

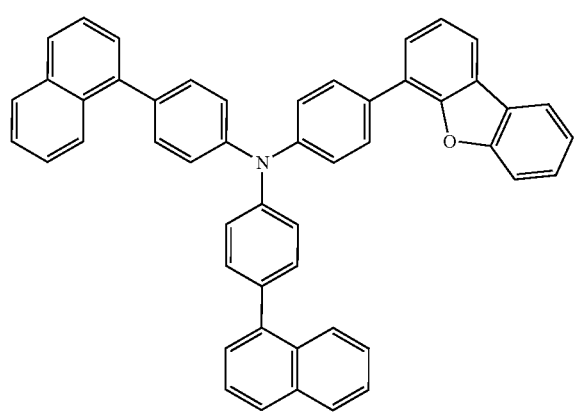

Performance Evaluation of OLED Devices

Currents of each OLED device at different voltages are tested by means of Keithley 2365A digital nanovoltmeter, and then current densities of the OLED device at the different voltages are obtained by dividing the currents by a light-emitting area of the OLED device; brightnesses and radiation energy flux densities of the OLED device at the different voltages are tested by means of Konicaminolta CS-2000 spectroradiometer, according to the current densities and the brightnesses of the OLED device at the different voltages, an operation voltage Volt and a current efficiency (cd/A) at the same current density (10 mA/cm$^2$) are obtained; BI=E/CIEy, where BI refers to a blue index of blue light, which is also a parameter for measuring the light-emitting efficiency of the blue light, E refers to a current efficiency, and CIEy refers to a color point of a vertical coordinate obtained by substituting a full band spectrum of the device into the software CIE1930 for integration. Test data are shown in Table 1.

TABLE 1

Organic electroluminescent devices and electroluminescent properties

| Device Embodiment | Host material | Light-emitting auxiliary material | Volt (V) | BI (cd/A/CIEy) | LT95 (hrs) |
|---|---|---|---|---|---|
| Application Example 1 | Compound 1-031 | Compound 2-009 | 3.66 | 218.4 | 128 |
| Application Example 2 | Compound 1-003 | Compound 2-009 | 3.70 | 214.8 | 125 |
| Application Example 3 | Compound 1-004 | Compound 2-009 | 3.69 | 216.2 | 126 |
| Application Example 4 | Compound 1-005 | Compound 2-009 | 3.70 | 212.3 | 122 |
| Application Example 5 | Compound 1-019 | Compound 2-009 | 3.69 | 211.1 | 123 |
| Application Example 6 | Compound 1-022 | Compound 2-009 | 3.66 | 212.4 | 124 |
| Application Example 7 | Compound 1-025 | Compound 2-009 | 3.61 | 216.5 | 132 |
| Application Example 8 | Compound 1-032 | Compound 2-009 | 3.63 | 214.0 | 127 |
| Application Example 9 | Compound 1-036 | Compound 2-009 | 3.64 | 217.8 | 130 |
| Application Example 10 | Compound 1-037 | Compound 2-009 | 3.67 | 217.2 | 128 |
| Application Example 11 | Compound 1-050 | Compound 2-009 | 3.65 | 214.8 | 129 |
| Application Example 12 | Compound 1-051 | Compound 2-009 | 3.69 | 215.7 | 126 |
| Application Example 13 | Compound 1-053 | Compound 2-009 | 3.70 | 218.6 | 131 |
| Application Example 14 | Compound 1-054 | Compound 2-009 | 3.70 | 216.5 | 130 |
| Application Example 15 | Compound 1-058 | Compound 2-009 | 3.69 | 217.2 | 127 |
| Application Example 16 | Compound 1-061 | Compound 2-009 | 3.70 | 216.9 | 126 |
| Application Example 17 | Compound 1-062 | Compound 2-009 | 3.62 | 215.7 | 125 |
| Application Example 18 | Compound 1-064 | Compound 2-009 | 3.68 | 218.2 | 127 |
| Application Example 19 | Compound 1-065 | Compound 2-009 | 3.69 | 217.4 | 125 |
| Application Example 20 | Compound 1-068 | Compound 2-009 | 3.67 | 217.9 | 129 |
| Application Example 21 | Compound 1-103 | Compound 2-009 | 3.72 | 218.2 | 132 |
| Application Example 22 | Compound 1-165 | Compound 2-009 | 3.65 | 218.9 | 131 |
| Application Example 23 | Compound 1-108 | Compound 2-009 | 3.70 | 217.6 | 126 |
| Application Example 24 | Compound 1-110 | Compound 2-009 | 3.71 | 216.9 | 127 |

TABLE 1-continued

Organic electroluminescent devices and electroluminescent properties

| Device Embodiment | Host material | Light-emitting auxiliary material | Volt (V) | BI (cd/A/CIEy) | LT95 (hrs) |
|---|---|---|---|---|---|
| Application Example 25 | Compound 1-111 | Compound 2-009 | 3.68 | 218.1 | 128 |
| Application Example 26 | Compound 1-115 | Compound 2-009 | 3.71 | 216.9 | 127 |
| Application Example 27 | Compound 1-124 | Compound 2-009 | 3.69 | 217.8 | 132 |
| Application Example 28 | Compound 1-132 | Compound 2-009 | 3.70 | 217.5 | 127 |
| Application Example 29 | Compound 1-137 | Compound 2-009 | 3.72 | 221.9 | 130 |
| Application Example 30 | Compound 1-139 | Compound 2-009 | 3.69 | 216.4 | 126 |
| Application Example 31 | Compound 1-140 | Compound 2-009 | 3.67 | 217.3 | 127 |
| Application Example 32 | Compound 1-151 | Compound 2-009 | 3.68 | 218.4 | 131 |
| Application Example 33 | Compound 1-171 | Compound 2-009 | 3.69 | 217.2 | 126 |
| Application Example 34 | Compound 1-173 | Compound 2-009 | 3.70 | 216.3 | 128 |
| Application Example 35 | Compound 1-174 | Compound 2-009 | 3.69 | 215.4 | 132 |
| Comparison Example 1 | Compound BH002 | Compound 2-009 | 3.86 | 202.3 | 111 |

It can be seen from Table 1 that, compared with the light-emitting device in Comparison Example 1, the light-emitting devices in Application Examples 1 to 35 have lower operation voltages, higher BI light-emitting efficiencies and longer service lives. The performance improvements of the light-emitting devices in the application examples are based on that the organic compound materials in the disclosure have better charge transport capabilities.

In order to further verify the excellent performances of the organic compounds provided in the present disclosure, with reference to the method provided in Application Example 1 above, light-emitting devices in Application Examples 36 to 58 and Comparison Examples 2 to 5 are fabricated. The only difference lies in that, respective compounds as listed in Table 2 replace compound 1-031 and 2-009 in Application Example 1 to serve as host materials and light-emitting auxiliary materials in Application Examples 36 to 58 and Comparison Examples 2 to 5. Structures of the new materials involved in the comparison examples in Table 2 are as follows:

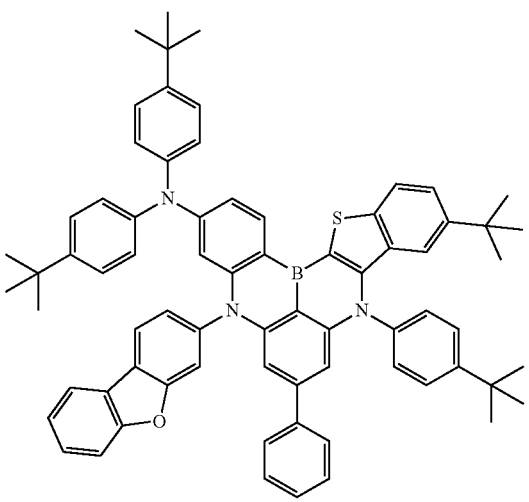

BD001

-continued

BD002

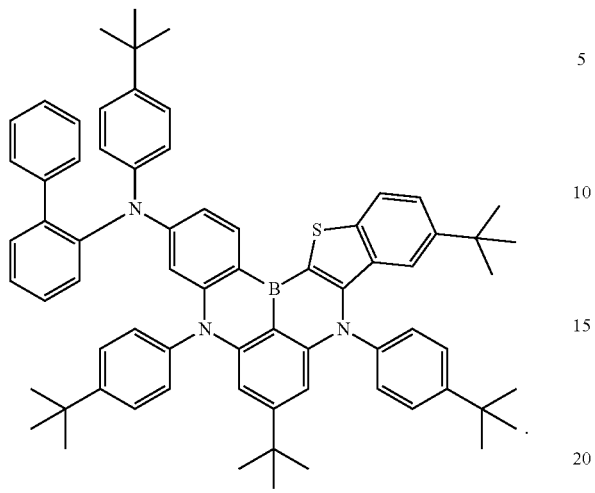

TABLE 2

Devices in combined material application examples and electroluminescent properties

| Device Embodiment | Host material | Light-emitting auxiliary material | Volt (V) | BI (cd/A/CIEy) | LT95 (hrs) |
|---|---|---|---|---|---|
| Application Example 36 | Compound 1-025 | Compound 2-001 | 3.64 | 213.3 | 136 |
| Application Example 37 | Compound 1-031 | Compound 2-004 | 3.65 | 218.5 | 137 |
| Application Example 38 | Compound 1-036 | Compound 2-005 | 3.75 | 218.9 | 130 |
| Application Example 39 | Compound 1-050 | Compound 2-008 | 3.66 | 214.0 | 130 |
| Application Example 40 | Compound 1-053 | Compound 2-012 | 3.64 | 216.7 | 121 |
| Application Example 41 | Compound 1-054 | Compound 2-013 | 3.70 | 215.9 | 123 |
| Application Example 42 | Compound 1-068 | Compound 2-016 | 3.75 | 214.9 | 128 |
| Application Example 43 | Compound 1-103 | Compound 2-017 | 3.72 | 217.0 | 124 |
| Application Example 44 | Compound 1-165 | Compound 2-020 | 3.71 | 219.4 | 125 |
| Application Example 45 | Compound 1-111 | Compound 2-021 | 3.64 | 219.3 | 128 |
| Application Example 46 | Compound 1-124 | Compound 2-025 | 3.68 | 220.1 | 134 |
| Application Example 47 | Compound 1-137 | Compound 2-029 | 3.69 | 221.6 | 136 |
| Application Example 48 | Compound 1-139 | Compound 2-036 | 3.74 | 219.4 | 129 |
| Application Example 49 | Compound 1-140 | Compound 2-033 | 3.63 | 216.4 | 126 |
| Application Example 50 | Compound 1-151 | Compound 2-038 | 3.69 | 218.8 | 125 |
| Application Example 51 | Compound 1-171 | Compound 2-040 | 3.75 | 219.4 | 120 |
| Application Example 52 | Compound 1-173 | Compound 2-042 | 3.64 | 214.0 | 129 |
| Application Example 53 | Compound 1-174 | Compound 2-044 | 3.65 | 215.9 | 126 |
| Application Example 54 | Compound 1-031 | Compound 2-005 | 3.70 | 218.1 | 131 |
| Application Example 55 | Compound 1-165 | Compound 2-016 | 3.72 | 219.5 | 130 |
| Application Example 56 | Compound 1-140 | Compound 2-020 | 3.67 | 217.4 | 137 |
| Application Example 57 | Compound 1-173 | Compound 2-025 | 3.68 | 218.0 | 136 |

TABLE 2-continued

Devices in combined material application examples and electroluminescent properties

| Device Embodiment | Host material | Light-emitting auxiliary material | Volt (V) | BI (cd/A/CIEy) | LT95 (hrs) |
|---|---|---|---|---|---|
| Application Example 58 | Compound 1-174 | Compound 2-036 | 3.74 | 217.9 | 126 |
| Comparison Example 2 | Compound 1-031 | Compound BD001 | 3.85 | 203.6 | 115 |
| Comparison Example 3 | Compound 1-165 | Compound BD002 | 3.86 | 204.2 | 113 |
| Comparison Example 4 | Compound BH002 | Compound BD001 | 3.91 | 197.6 | 98 |
| Comparison Example 5 | Compound BH002 | Compound BD002 | 3.93 | 198.2 | 99 |

It can be seen from Table 2 that, compared with the light-emitting devices in Comparison Examples 2 to 5, the light-emitting devices in Application Examples 36 to 58 have superior operation voltages, higher BI light-emitting efficiencies and longer service lives. It is clear that, the light-emitting host materials and the light-emitting dopant materials in the present disclosure have a better compatibility, which enables blue light-emitting layers to achieve a better balance between electron transport and hole transport and a better exciton conversion yield, significantly reduces the power consumption of a white light device and improves the service life of a panel. The light-emitting efficiency of the device can be improved significantly.

These specific embodiments are only explanations of the present disclosure, but not limitations of the present disclosure. Those skilled in the art may make modifications, without creative contribution, to these embodiments according to needs after reading this description, but those modifications shall be included in the scope, which are protected by the patent law, of the claims of the present disclosure.

What is claimed is:

1. An organic electroluminescent device, comprising:
a substrate;
a first electrode, the first electrode being located on the substrate;
an organic light-emitting functional layer, the organic light-emitting functional layer being located on the first electrode; and
the second electrode, the second electrode being located the organic light-emitting functional layer, wherein
the organic light-emitting functional layer includes a light-emitting layer, wherein the light-emitting layer includes an organic compound, and a chemical structure of the organic compound is selected from following chemical structures:

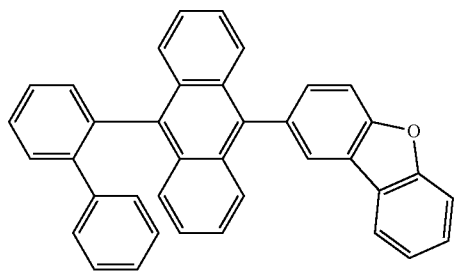

1-003

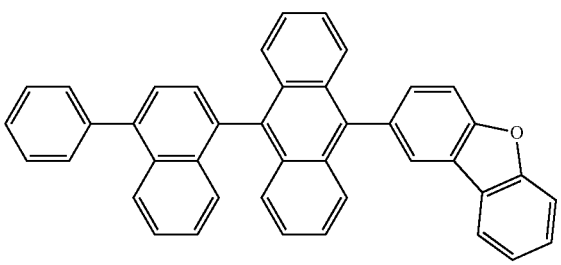

1-004

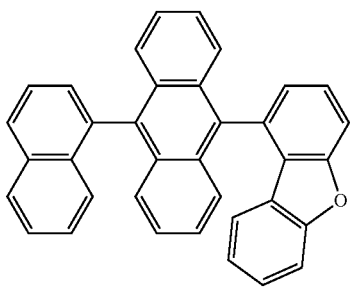

1-005

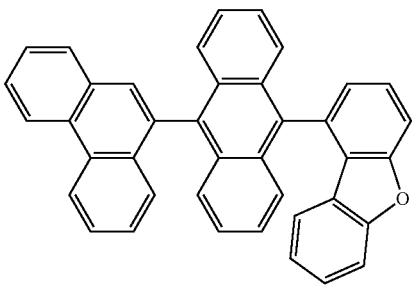

1-019

-continued
1-022
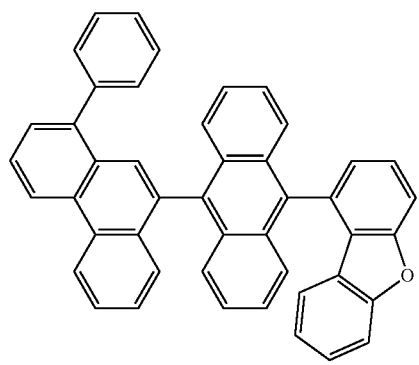
1-025
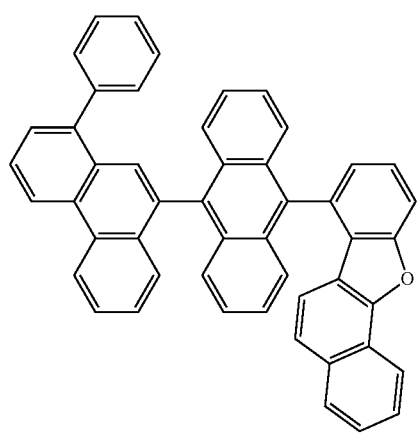
1-031
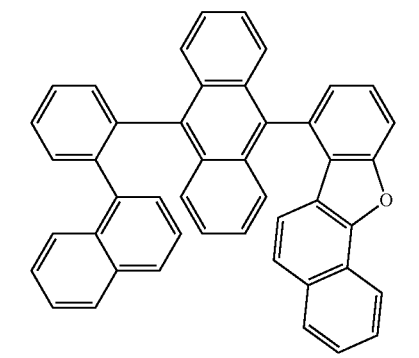
1-032
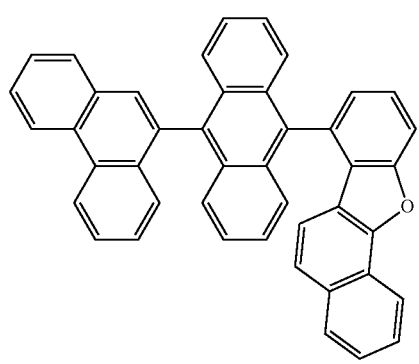
-continued
1-036
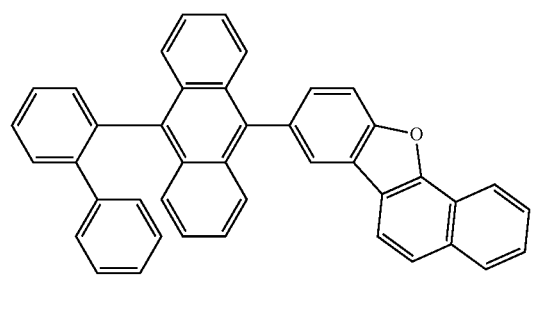
1-037
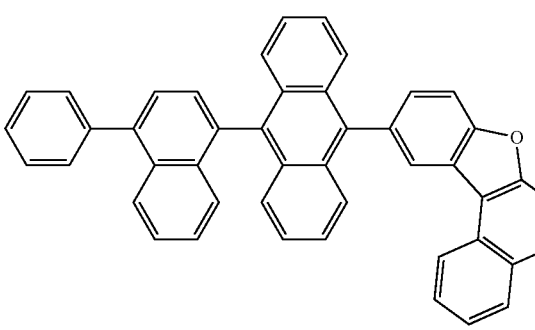
1-050
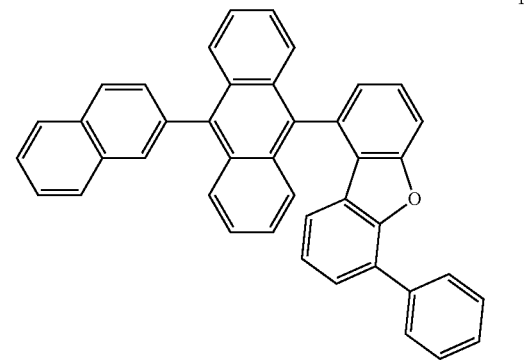
1-051
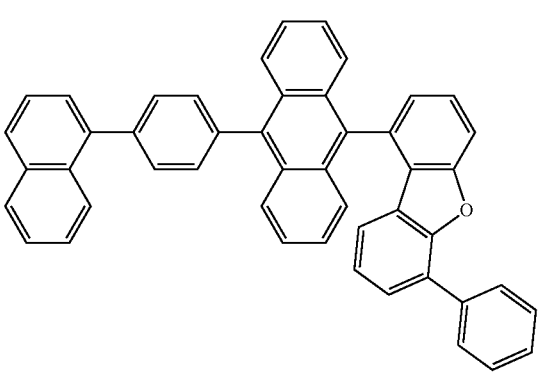

1-053
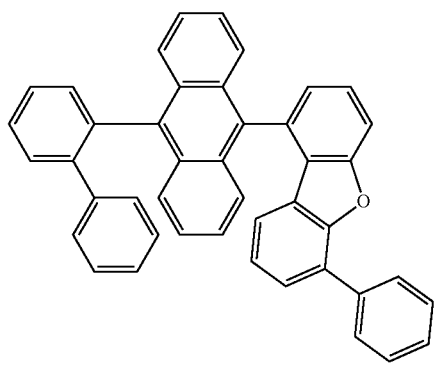
1-054
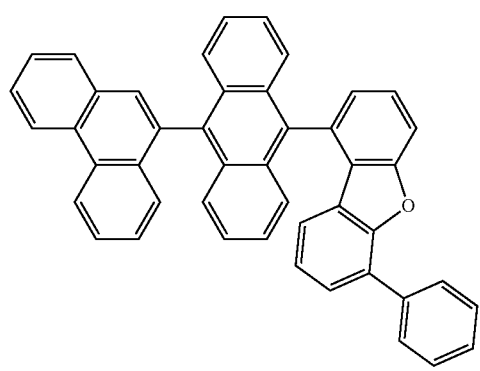
1-058
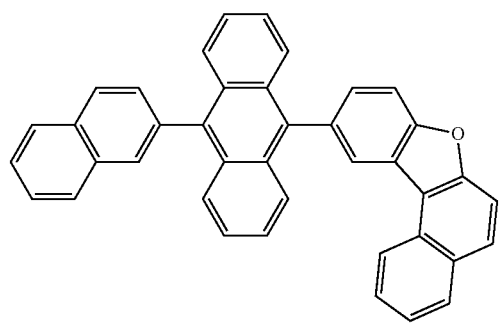
1-061
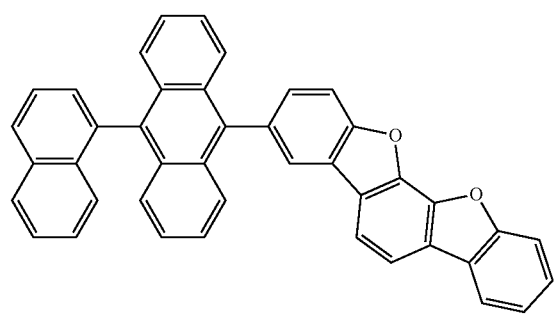
1-062
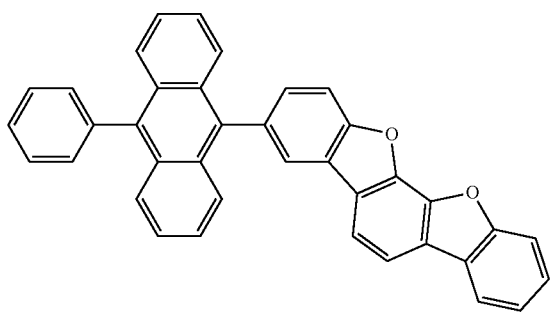
1-064
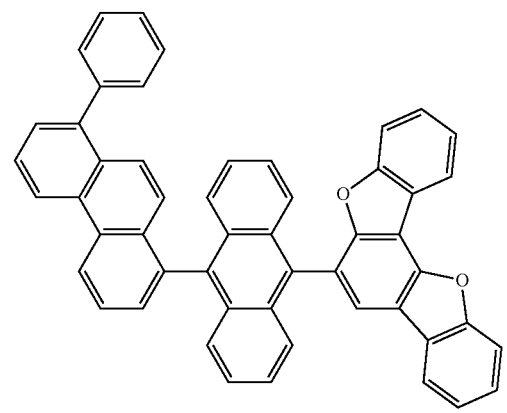
1-065
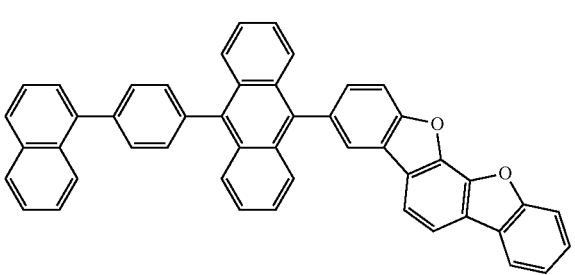
1-068
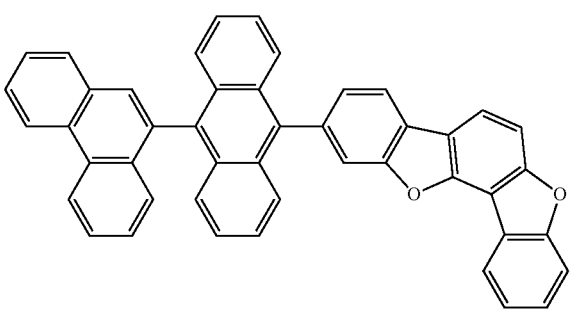

1-103
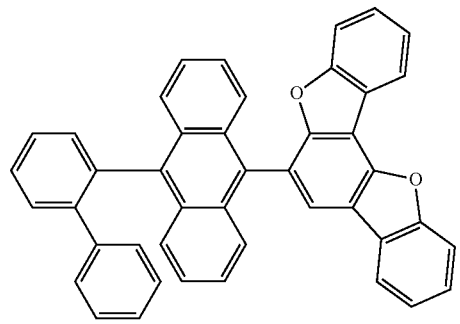
1-115
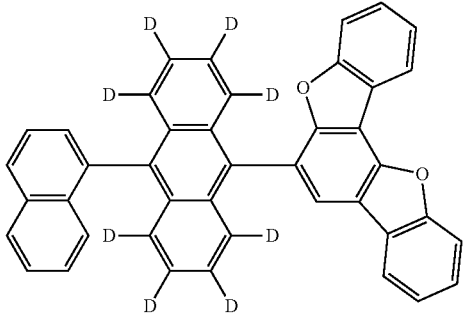
1-108
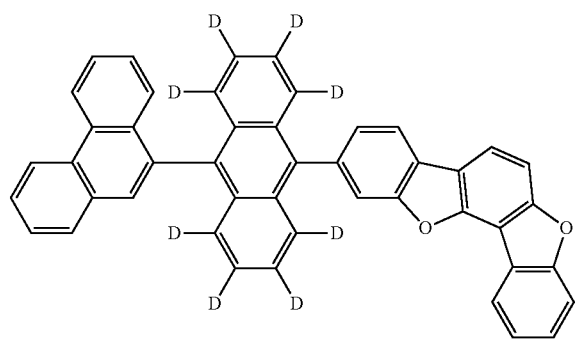
1-124
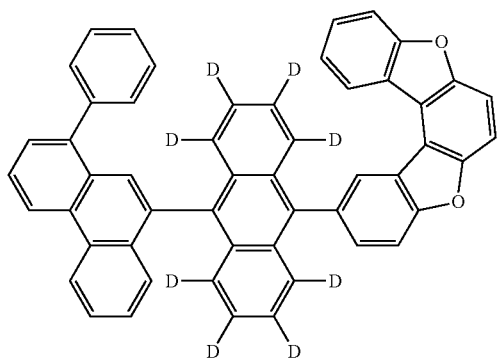
1-110
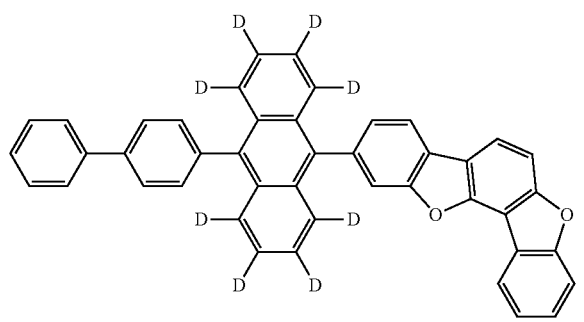
1-132
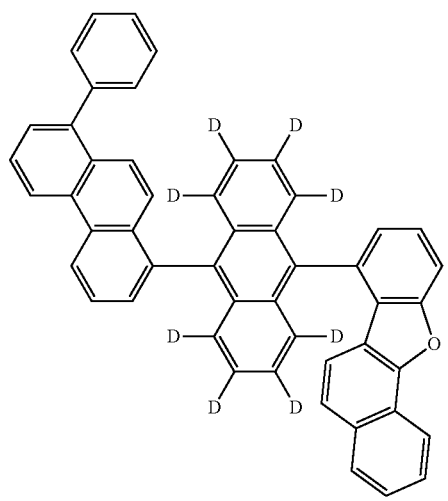
1-111
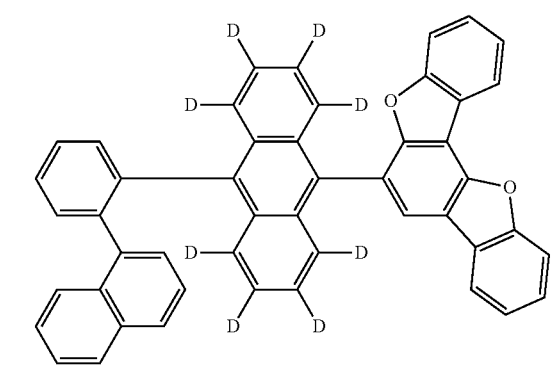
1-137
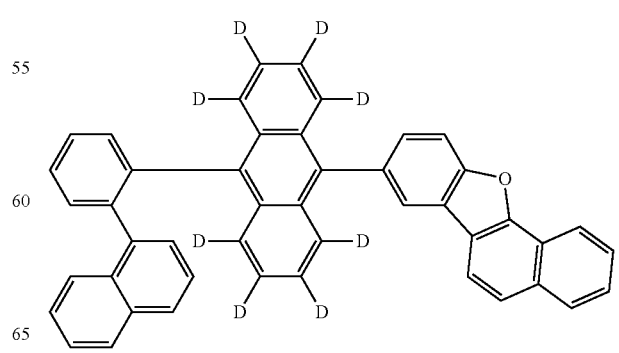

1-139
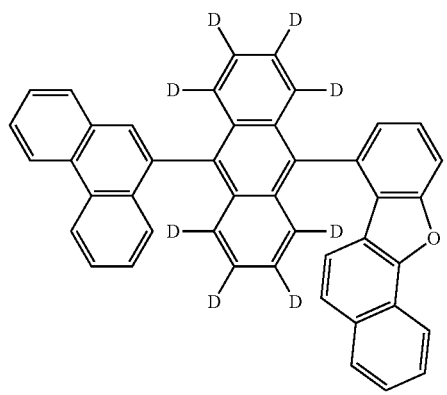
1-140
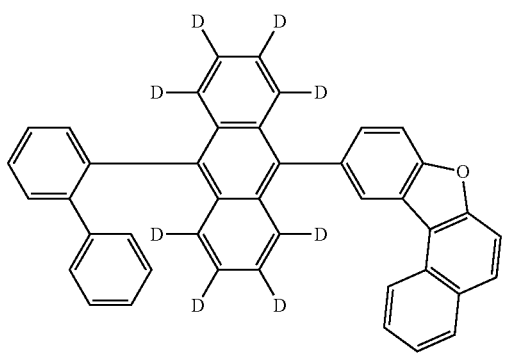
1-151
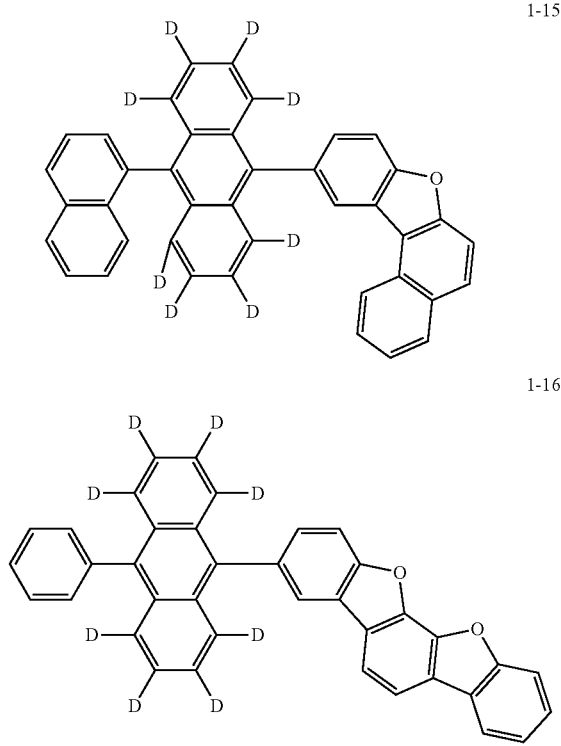
1-165
1-171
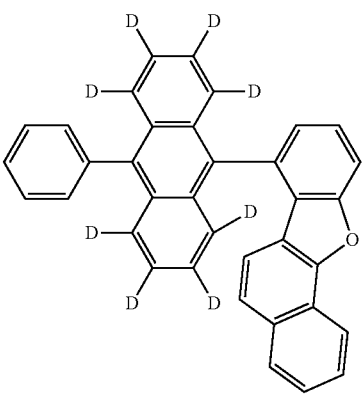
1-173
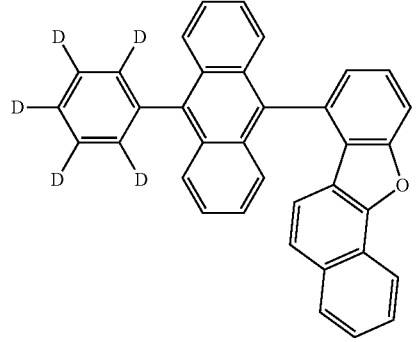
1-174
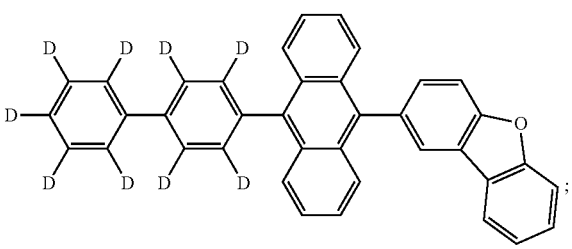
and the light-emitting layer further includes a boron-nitrogen compound, and a chemical structure of the boron-nitrogen compound is selected from following chemical structures:

2-001
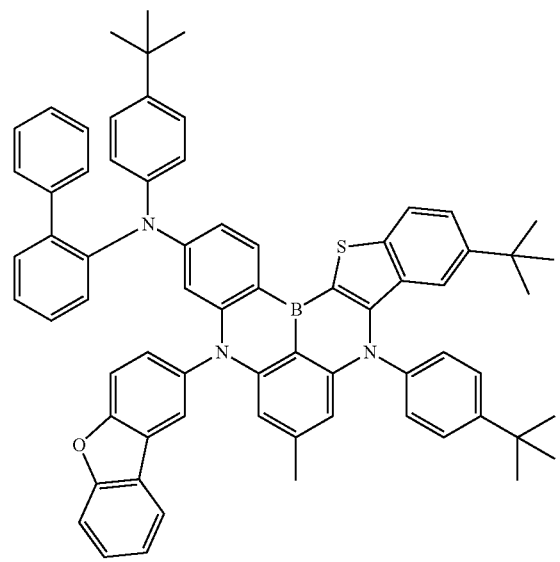
2-004
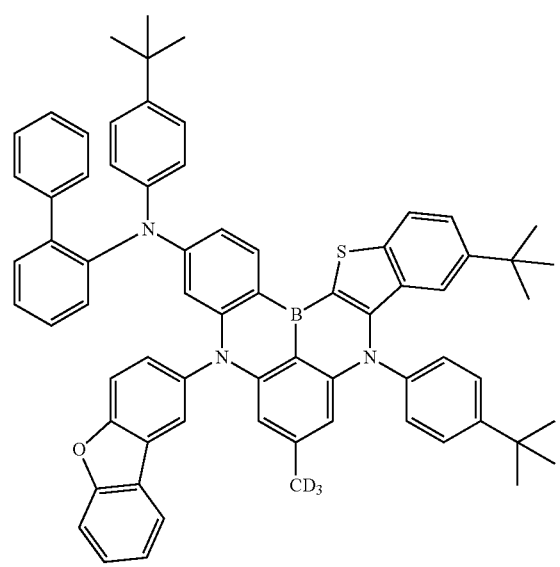
2-005
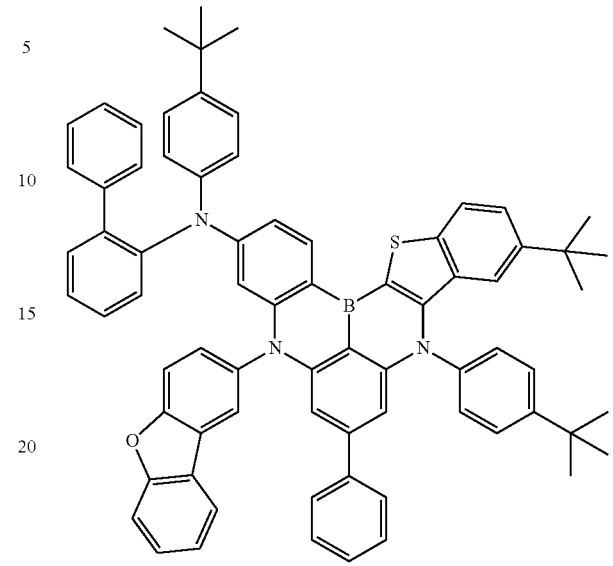
2-008
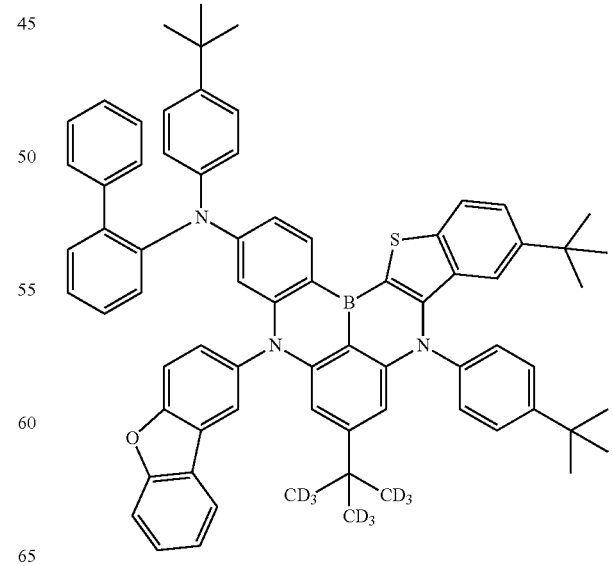

2-012
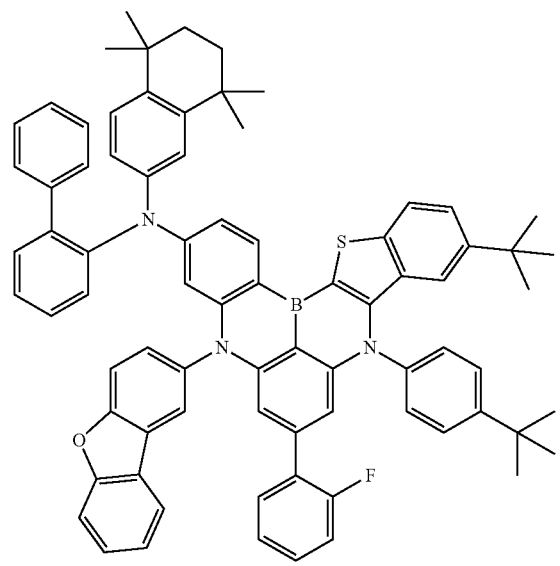
2-013
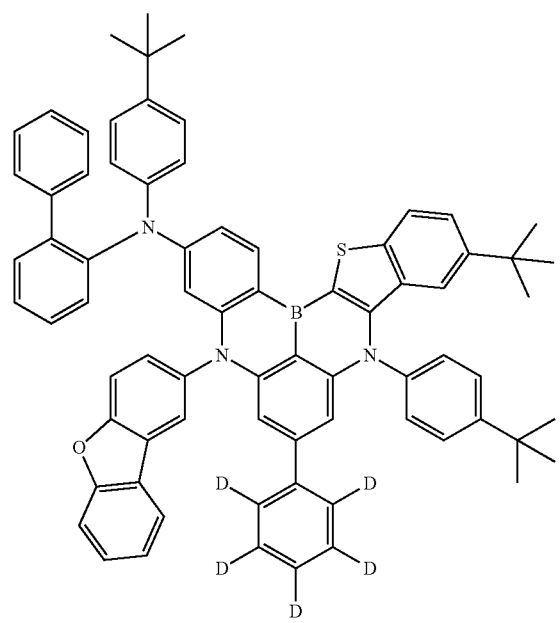
2-016
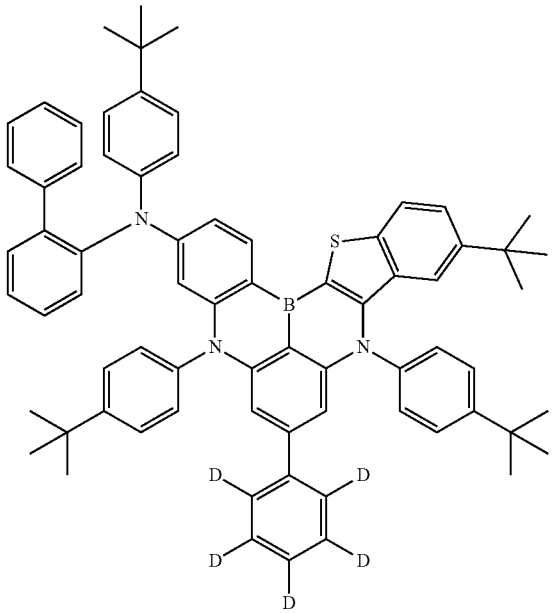
2-017
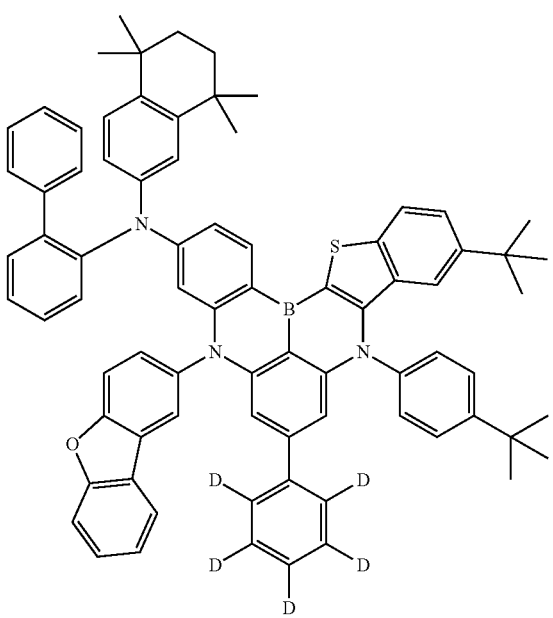

2-020
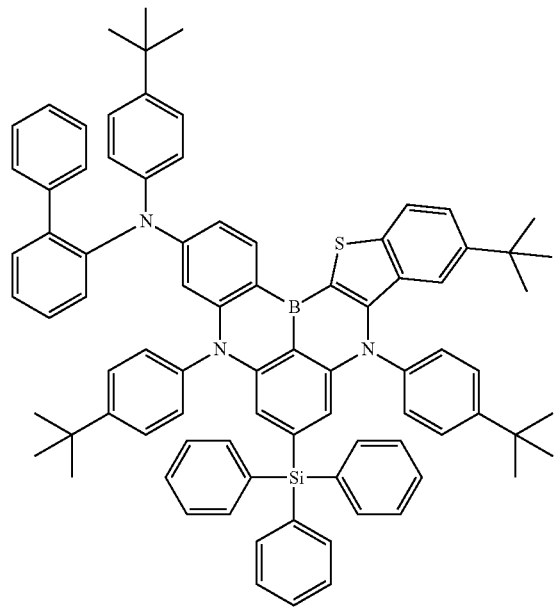
2-025
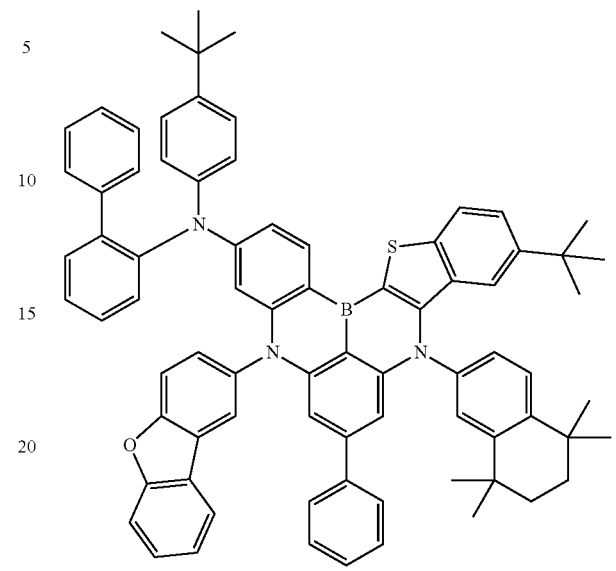
2-021
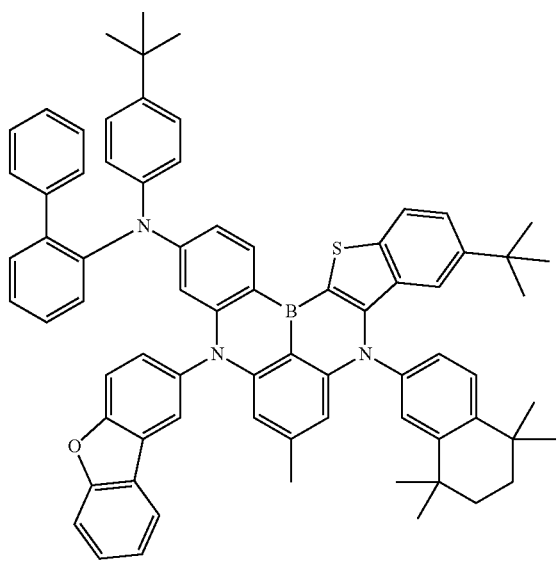
2-029
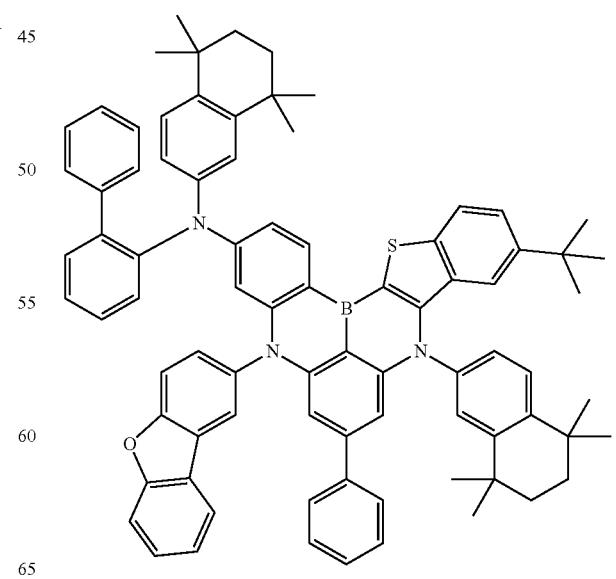

2-033
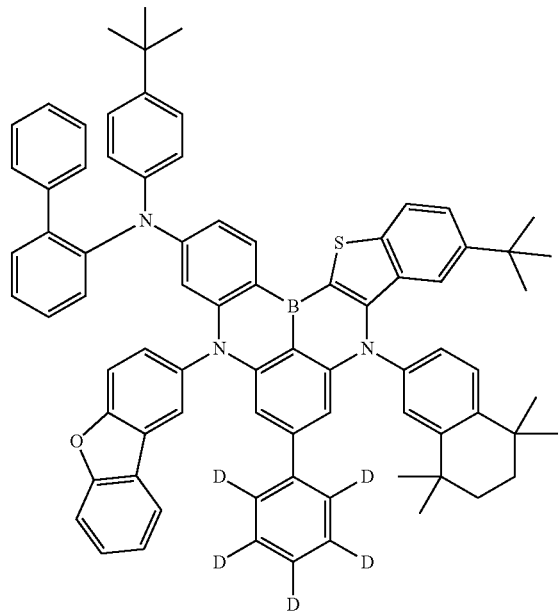
2-038
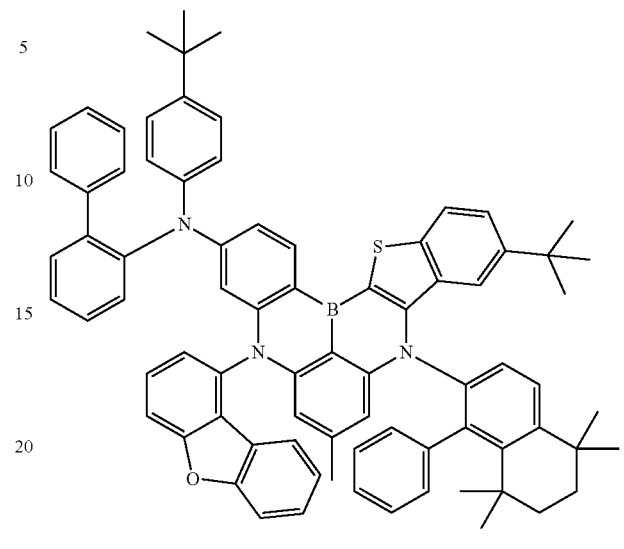
2-036
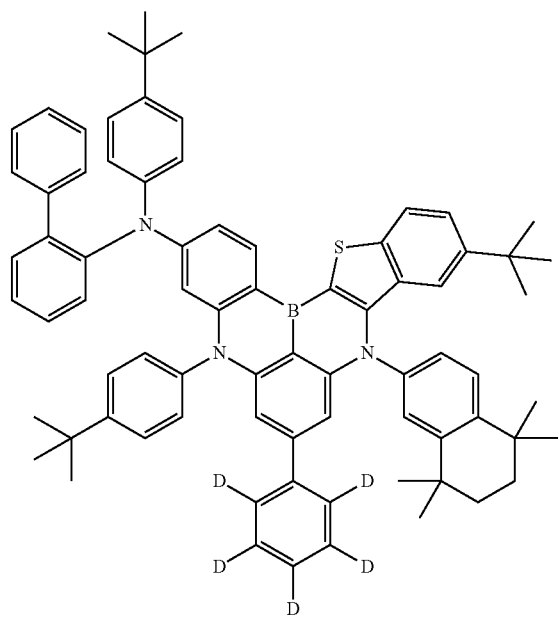
2-040
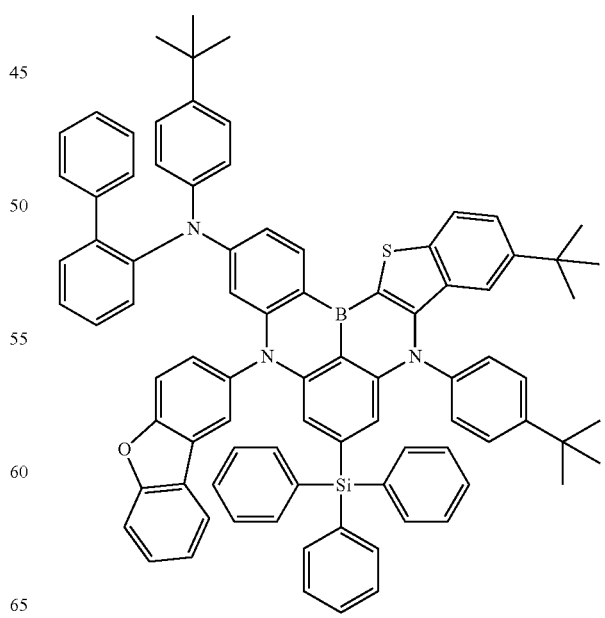

2-042
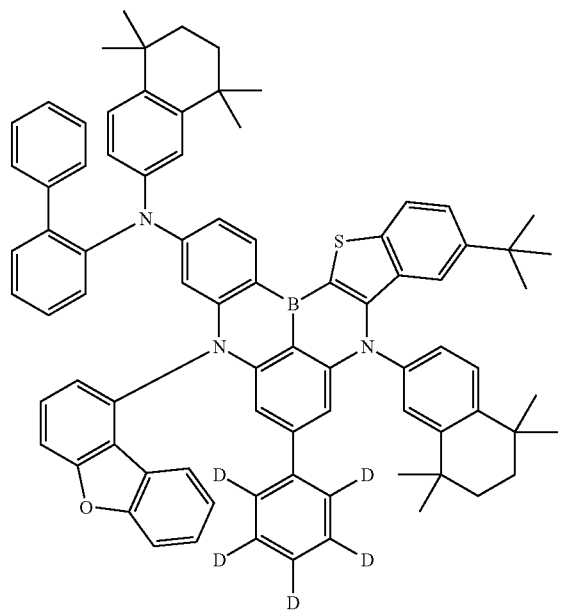
1-003
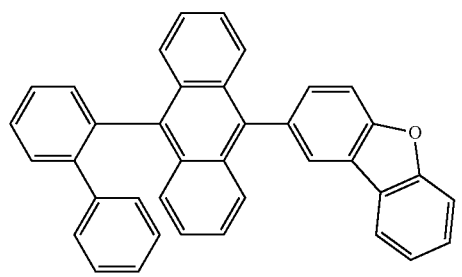
1-004
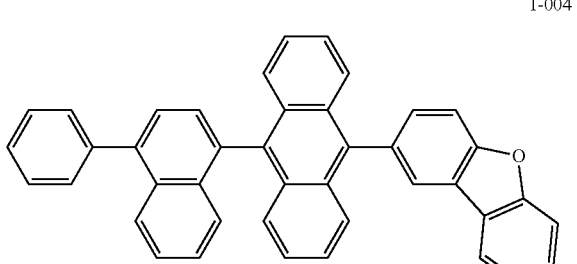
1-005
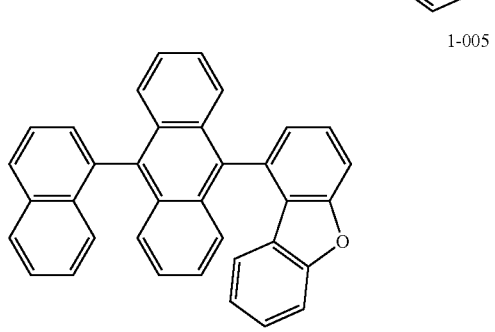
2-044
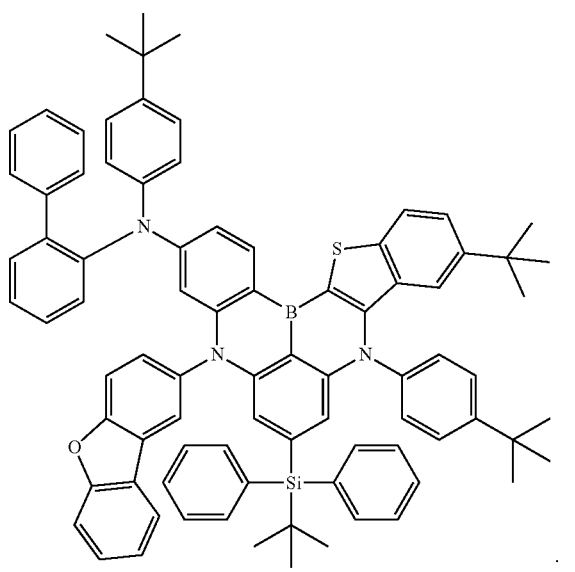
1-019
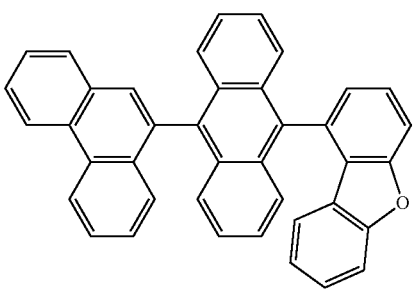
1-022
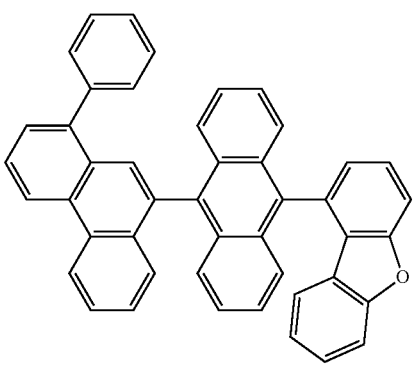
2. A display or lighting apparatus comprising: the organic electroluminescent device according to claim 1.
3. A composition, containing: an organic compound and a boron-nitrogen compound, wherein
a chemical structure of the organic compound is selected from following chemical structures:

1-025
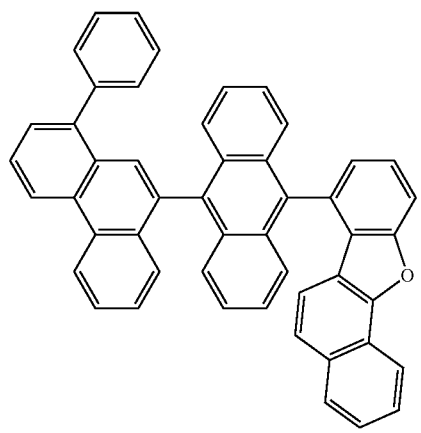
1-031
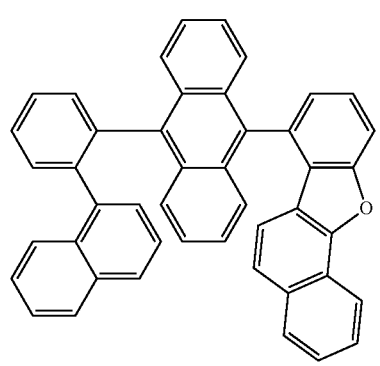
1-032
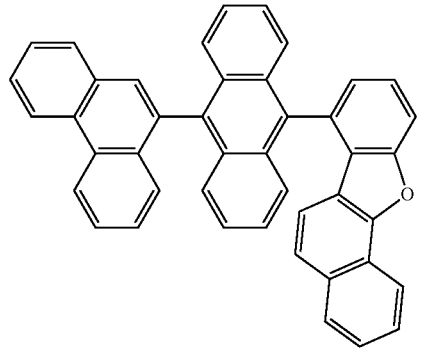
1-036
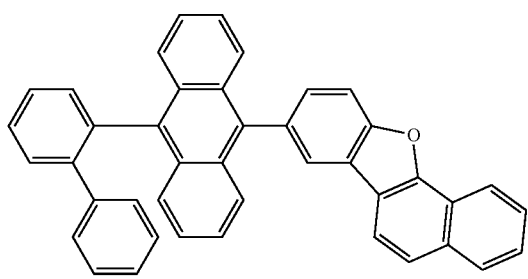
1-037
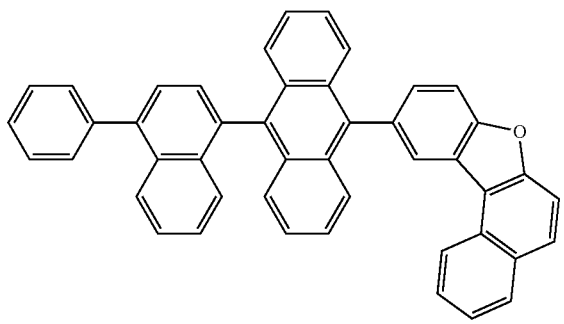
1-050
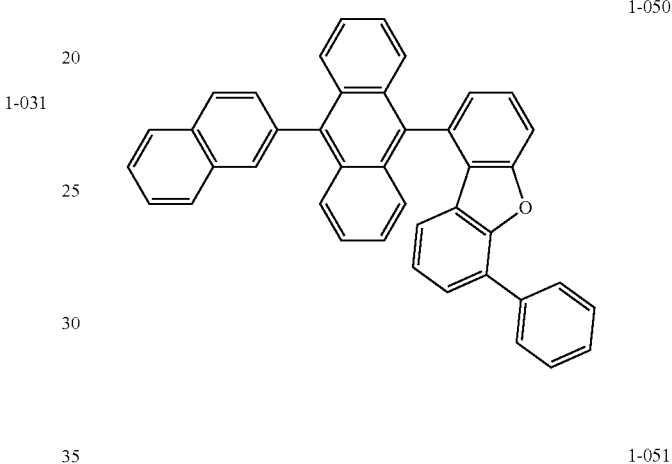
1-051
1-053
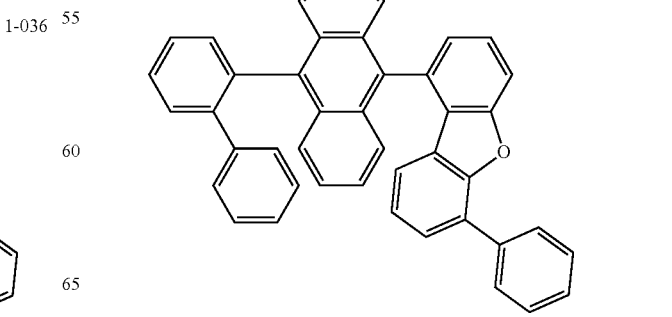

-continued
1-054
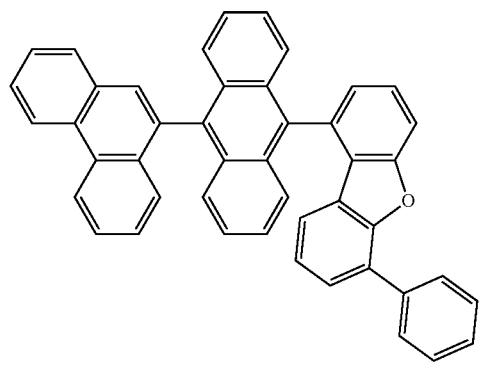
1-058
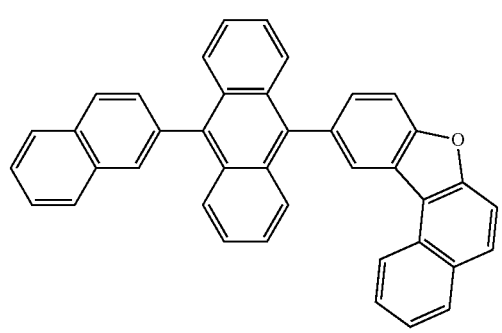
1-061
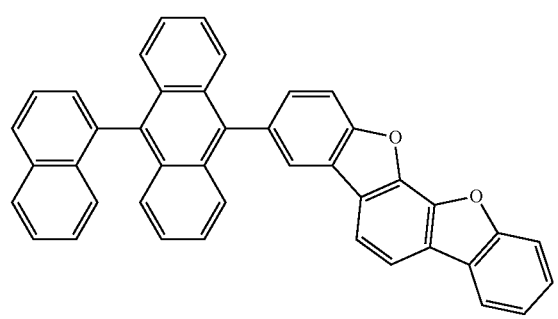
1-062
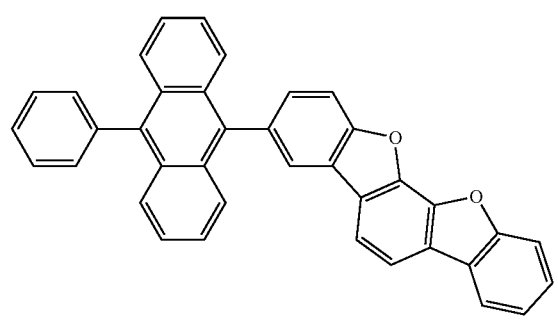
-continued
1-064
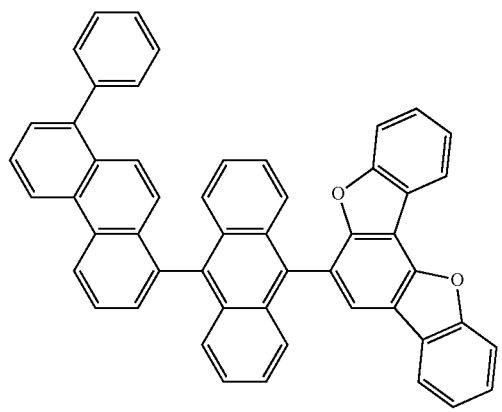
1-065
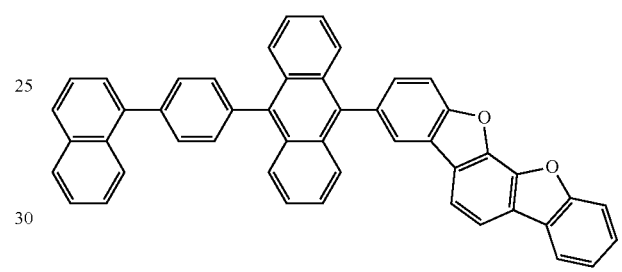
1-068
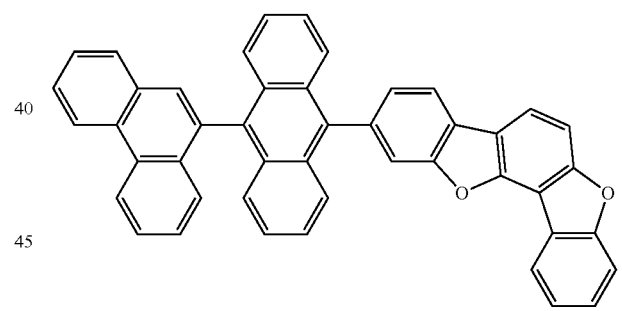
1-103
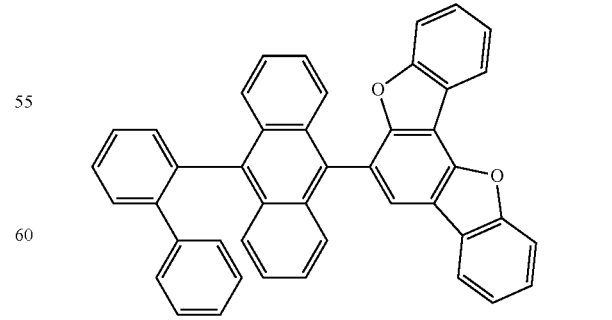

1-108
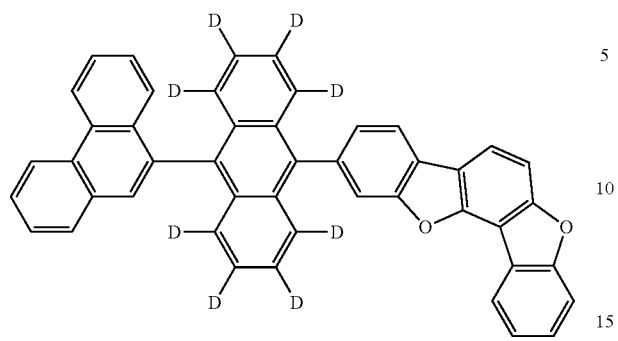
1-110
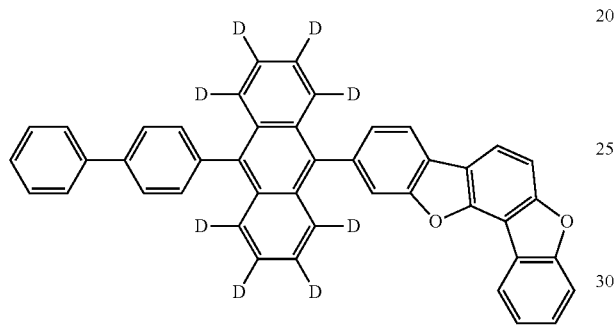
1-111
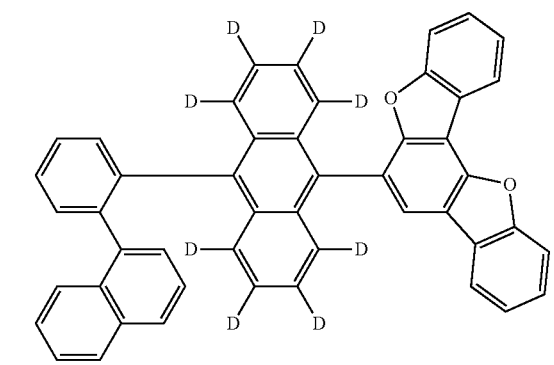
1-115
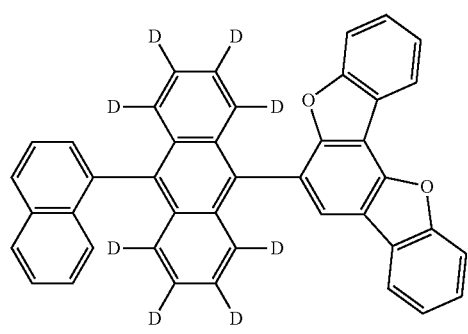
1-124
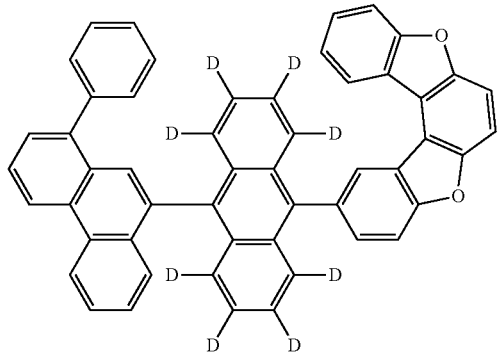
1-132
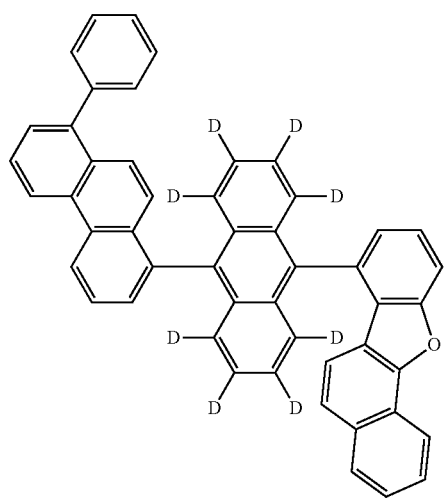
1-137
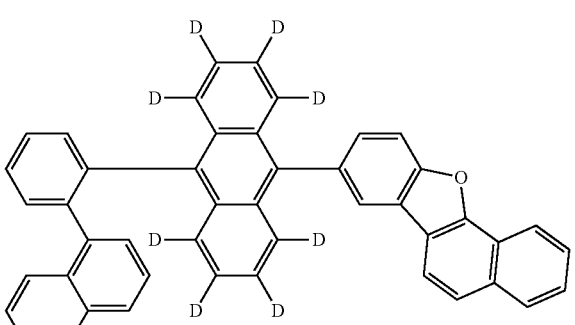
1-139
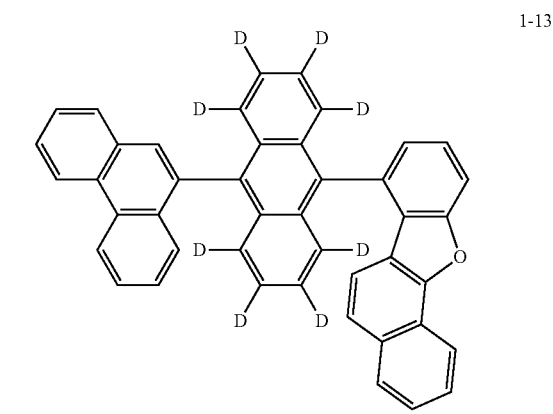

1-140
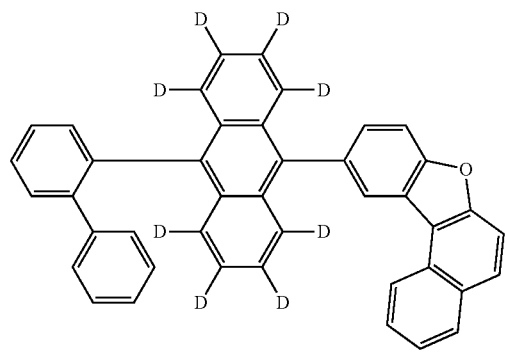
1-151
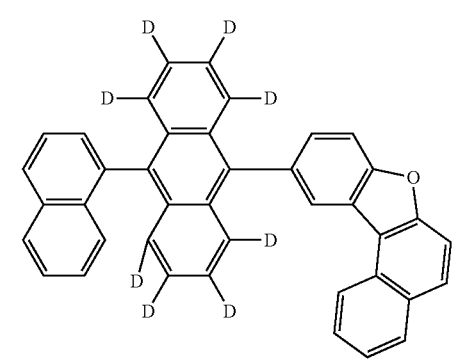
1-165
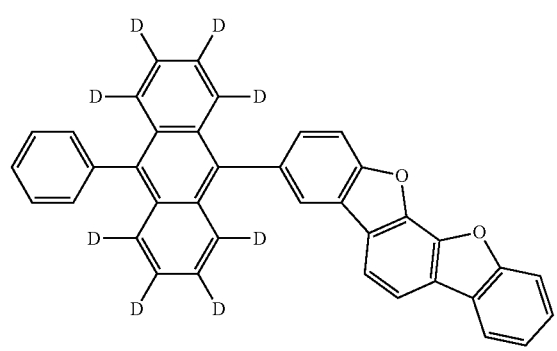
1-171
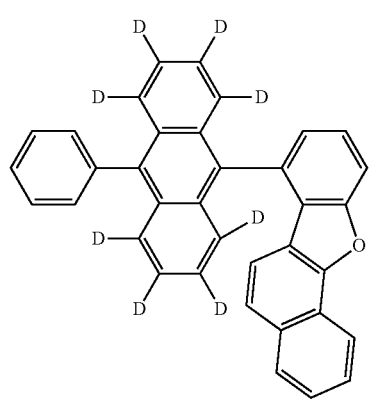
1-173
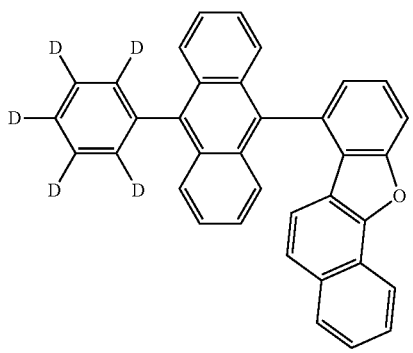
1-174
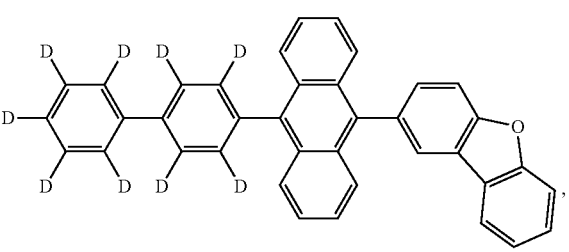
and a chemical structure of the boron-nitrogen compound is selected from following chemical structures:
2-001
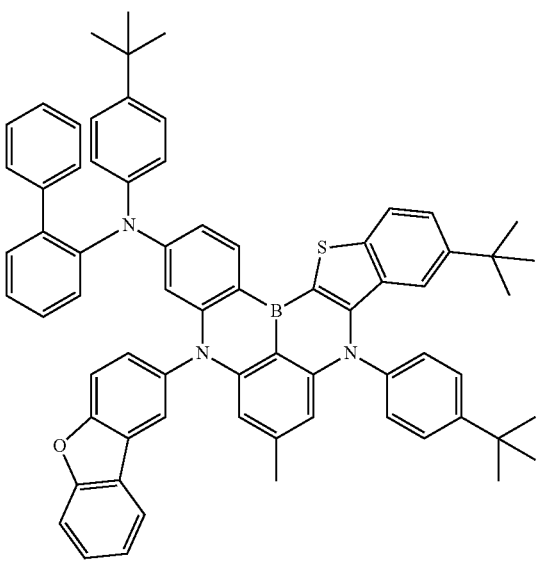

2-004
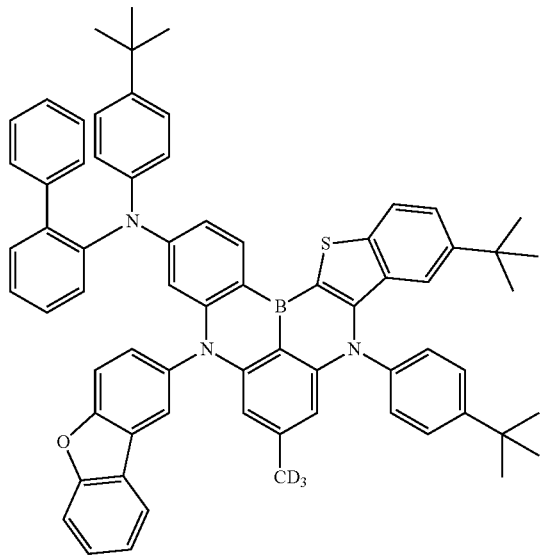
2-008
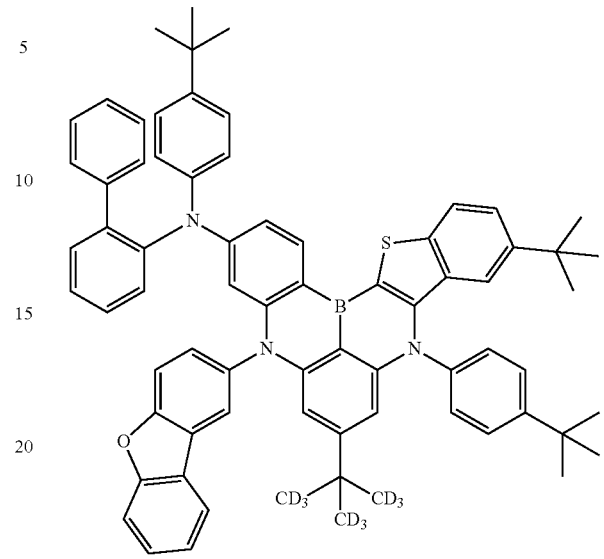
2-005
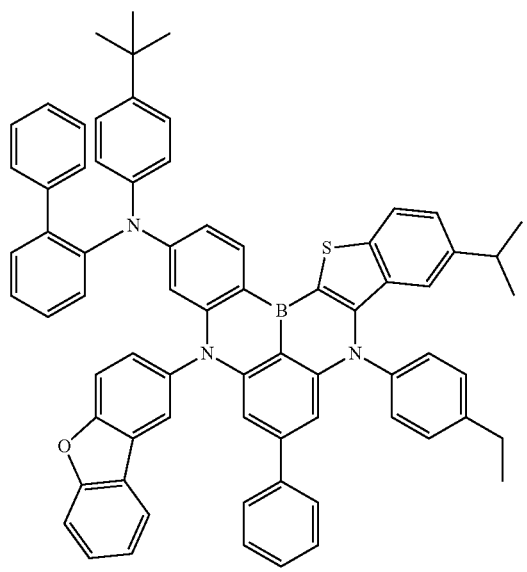
2-012
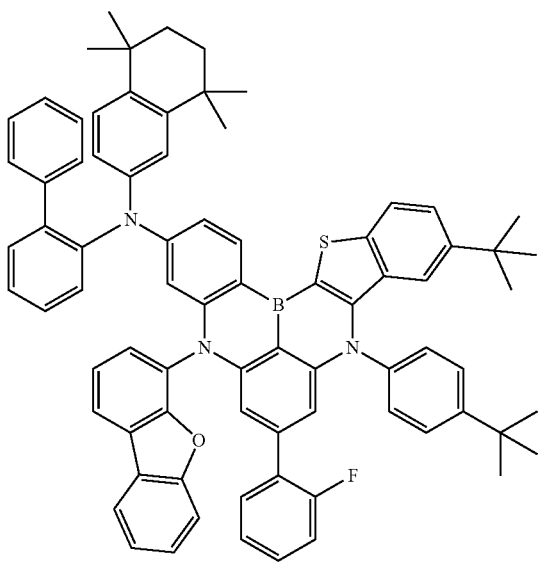

2-013
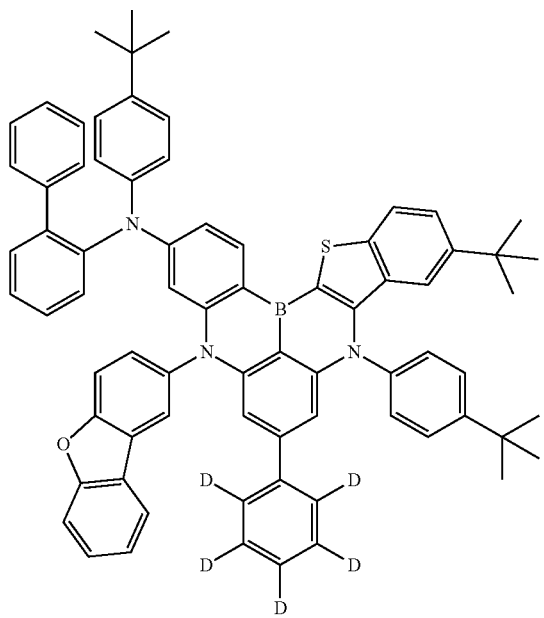
2-016
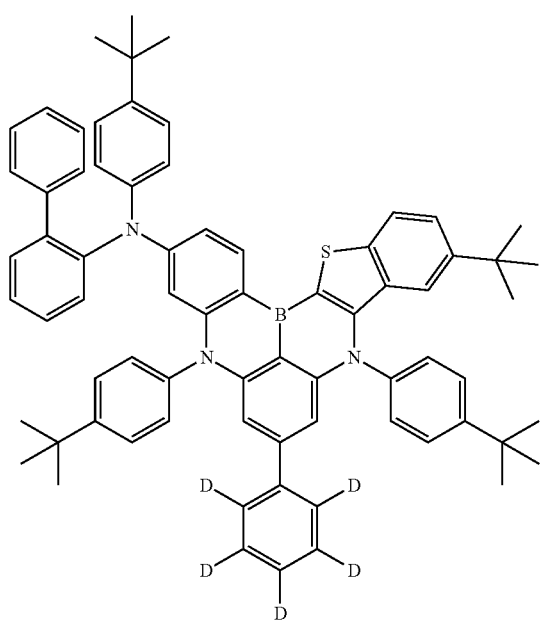
2-017
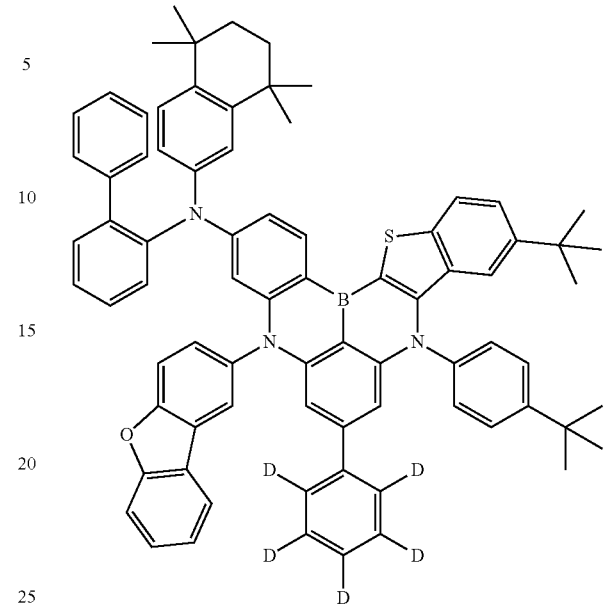
2-020
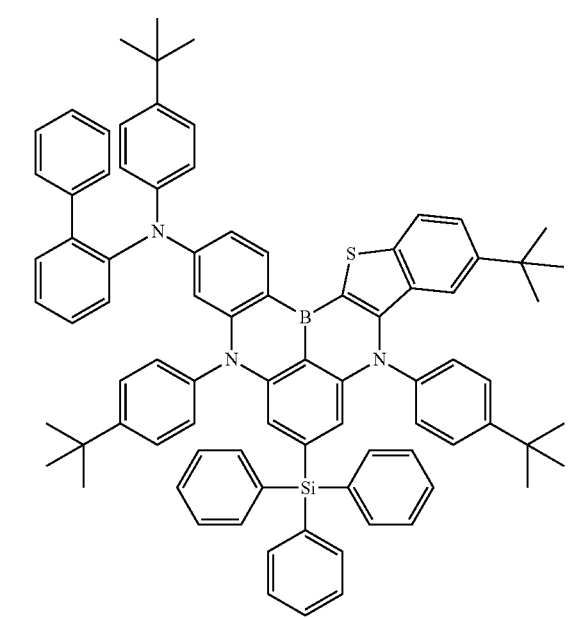

2-021
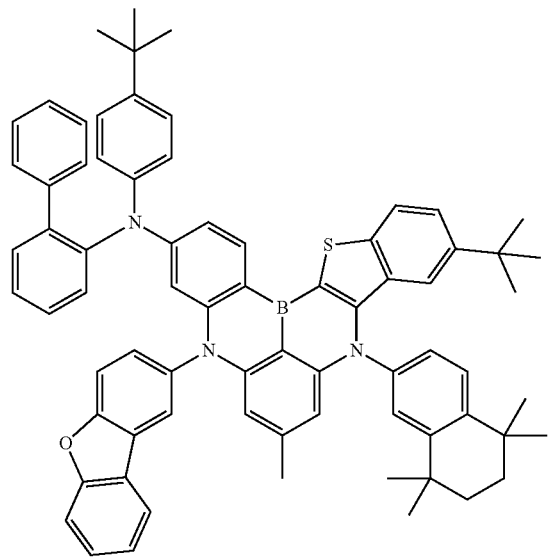
2-025
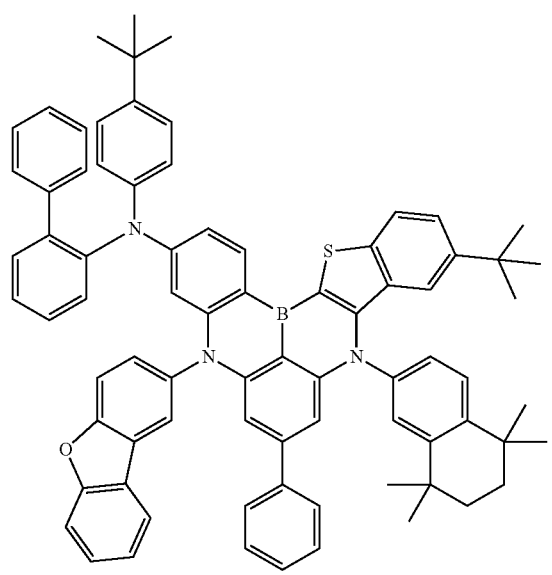
2-029
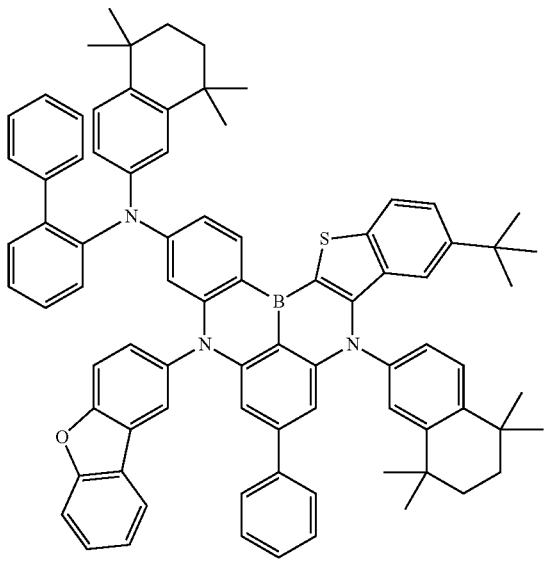
2-033
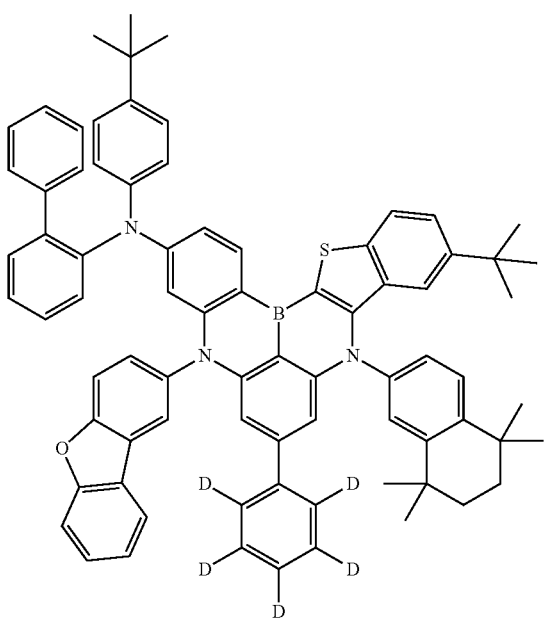

2-036
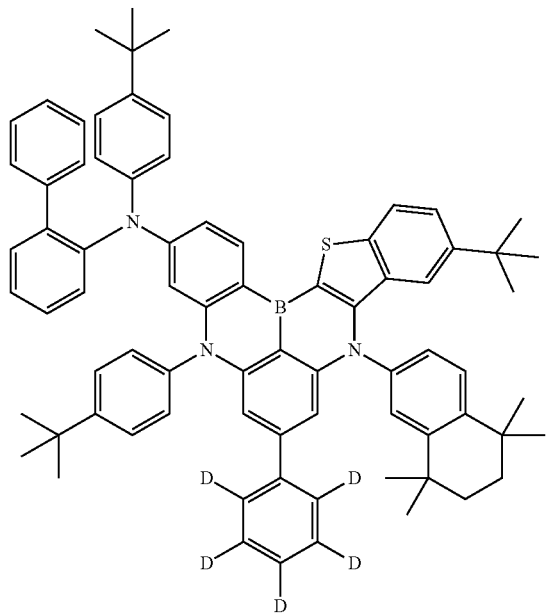
2-040
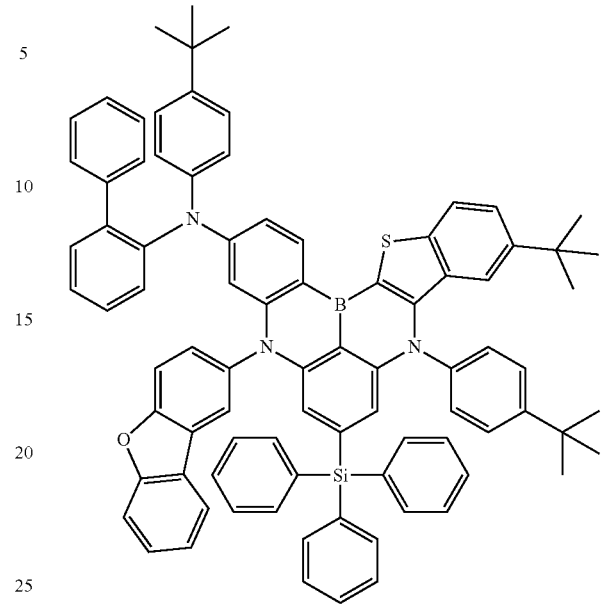
2-038
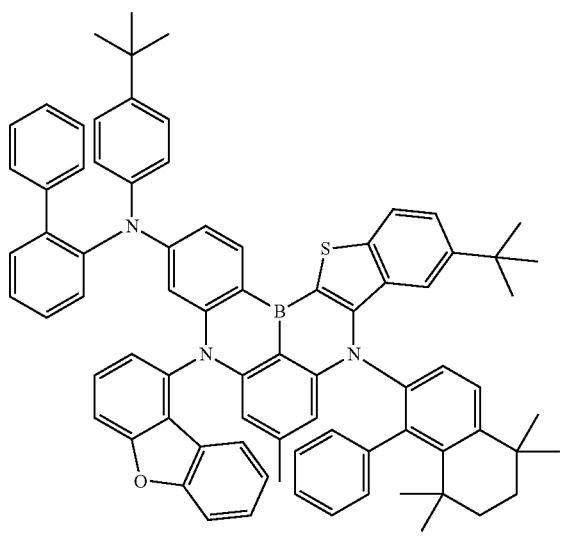
2-042
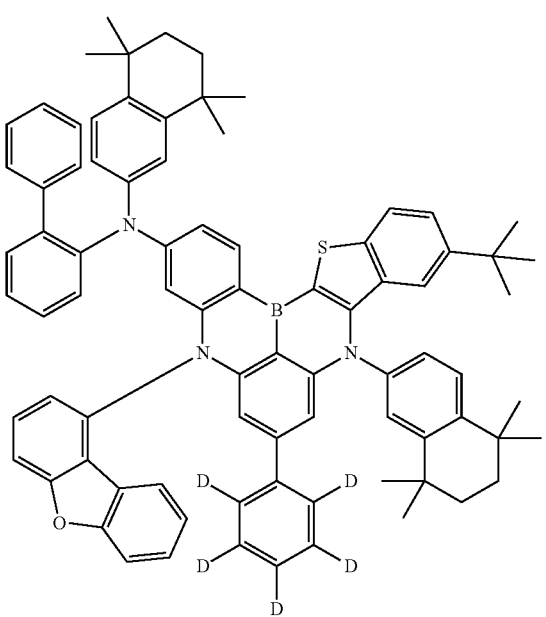

2-044
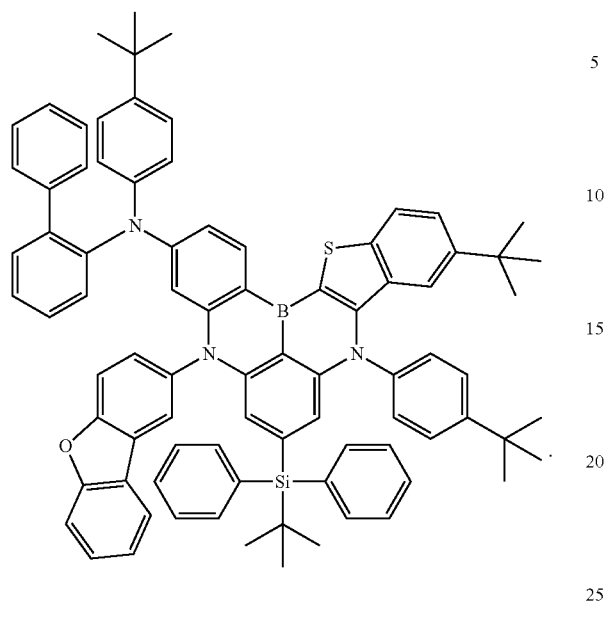
* * * * *